US010825864B2

(12) United States Patent
Sekar et al.

(10) Patent No.: US 10,825,864 B2
(45) Date of Patent: Nov. 3, 2020

(54) 3D SEMICONDUCTOR DEVICE AND STRUCTURE

(71) Applicant: Monolithic 3D Inc., San Jose, CA (US)

(72) Inventors: Deepak C. Sekar, Sunnyvale, CA (US); Zvi Or-Bach, San Jose, CA (US)

(73) Assignee: Monolithic 3D Inc., San Jose, CA (US)

( * ) Notice: Subject to any disclaimer, the term of this patent is extended or adjusted under 35 U.S.C. 154(b) by 0 days.

(21) Appl. No.: 16/409,813

(22) Filed: May 11, 2019

(65) Prior Publication Data

US 2019/0273121 A1 Sep. 5, 2019

Related U.S. Application Data

(63) Continuation-in-part of application No. 15/803,732, filed on Nov. 3, 2017, now Pat. No. 10,290,682,
(Continued)

(51) Int. Cl.
*H01L 21/00* (2006.01)
*H01L 27/24* (2006.01)
*H01L 27/22* (2006.01)
*H01L 27/108* (2006.01)
*H01L 21/268* (2006.01)
(Continued)

(52) U.S. Cl.
CPC ........ *H01L 27/2481* (2013.01); *H01L 21/268* (2013.01); *H01L 21/6835* (2013.01); *H01L 21/76254* (2013.01); *H01L 21/8221* (2013.01); *H01L 21/84* (2013.01); *H01L 21/845* (2013.01); *H01L 27/0688* (2013.01); *H01L 27/10802* (2013.01); *H01L 27/10897* (2013.01); *H01L 27/11* (2013.01); *H01L 27/11529* (2013.01); *H01L 27/11551* (2013.01); *H01L 27/11578* (2013.01); *H01L 27/1203* (2013.01); *H01L 27/1211* (2013.01); *H01L 27/228* (2013.01); *H01L 27/249* (2013.01); *H01L 27/2436* (2013.01); *H01L 29/42392* (2013.01); *H01L 29/785* (2013.01); *H01L 29/7841* (2013.01); *H01L 27/105* (2013.01); *H01L 27/10826* (2013.01); *H01L 27/10879* (2013.01); *H01L 27/11526* (2013.01); *H01L 27/11573* (2013.01); *H01L 45/04* (2013.01); *H01L 45/1226* (2013.01);
(Continued)

(58) Field of Classification Search
CPC ............... H01L 21/268; H01L 21/6835; H01L 21/76254; H01L 21/8221; H01L 21/84; H01L 21/845; H01L 27/0688; H01L 27/10802; H01L 27/10897; H01L 27/11; H01L 27/11529; H01L 27/11551; H01L 27/11578; H01L 27/1203; H01L 27/1211; H01L 27/228; H01L 27/2436; H01L 27/2481; H01L 27/249; H01L 29/42392; H01L 29/7841; H01L 29/785
USPC ......................... 438/158; 257/278, 355, 360
See application file for complete search history.

(56) References Cited

U.S. PATENT DOCUMENTS

2004/0262635 A1* 12/2004 Lee ..................... H01L 29/792
257/199
2007/0076509 A1* 4/2007 Zhang ............... H01L 27/11206
365/230.03

* cited by examiner

*Primary Examiner* — Brook Kebede
(74) *Attorney, Agent, or Firm* — Patent Law Office, P.C.

(57) ABSTRACT

A 3D semiconductor device, the device including: a first level including a first single crystal layer; first transistors overlaying the first single crystal layer; second transistors overlaying the first transistors; and a second level including a second single crystal layer, the second level overlays the second transistors, where the first transistors and the second transistors each includes a polysilicon channel.

20 Claims, 55 Drawing Sheets

Related U.S. Application Data which is a continuation-in-part of application No. 14/555,494, filed on Nov. 26, 2014, now Pat. No. 9,818,800, which is a continuation of application No. 13/246,157, filed on Sep. 27, 2011, now Pat. No. 8,956,959, which is a continuation of application No. 13/173,999, filed on Jun. 30, 2011, now Pat. No. 8,203,148, which is a continuation of application No. 12/901,890, filed on Oct. 11, 2010, now Pat. No. 8,026,521.

(51) Int. Cl.
*H01L 21/683* (2006.01)
*H01L 21/762* (2006.01)
*H01L 21/822* (2006.01)
*H01L 21/84* (2006.01)
*H01L 27/06* (2006.01)
*H01L 27/11* (2006.01)
*H01L 29/78* (2006.01)
*H01L 27/12* (2006.01)
*H01L 27/11578* (2017.01)
*H01L 27/11551* (2017.01)
*H01L 27/11529* (2017.01)
*H01L 29/423* (2006.01)
*H01L 27/11526* (2017.01)
*H01L 27/11573* (2017.01)
*H01L 27/105* (2006.01)
*H01L 45/00* (2006.01)

(52) U.S. Cl.
CPC .... *H01L 45/146* (2013.01); *H01L 2029/7857* (2013.01); *H01L 2221/6835* (2013.01)

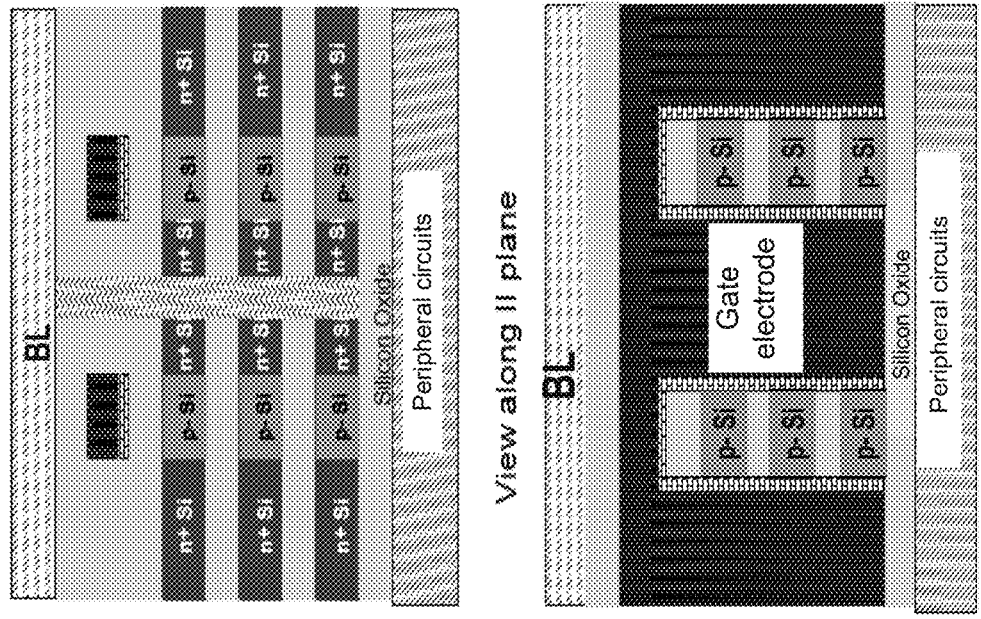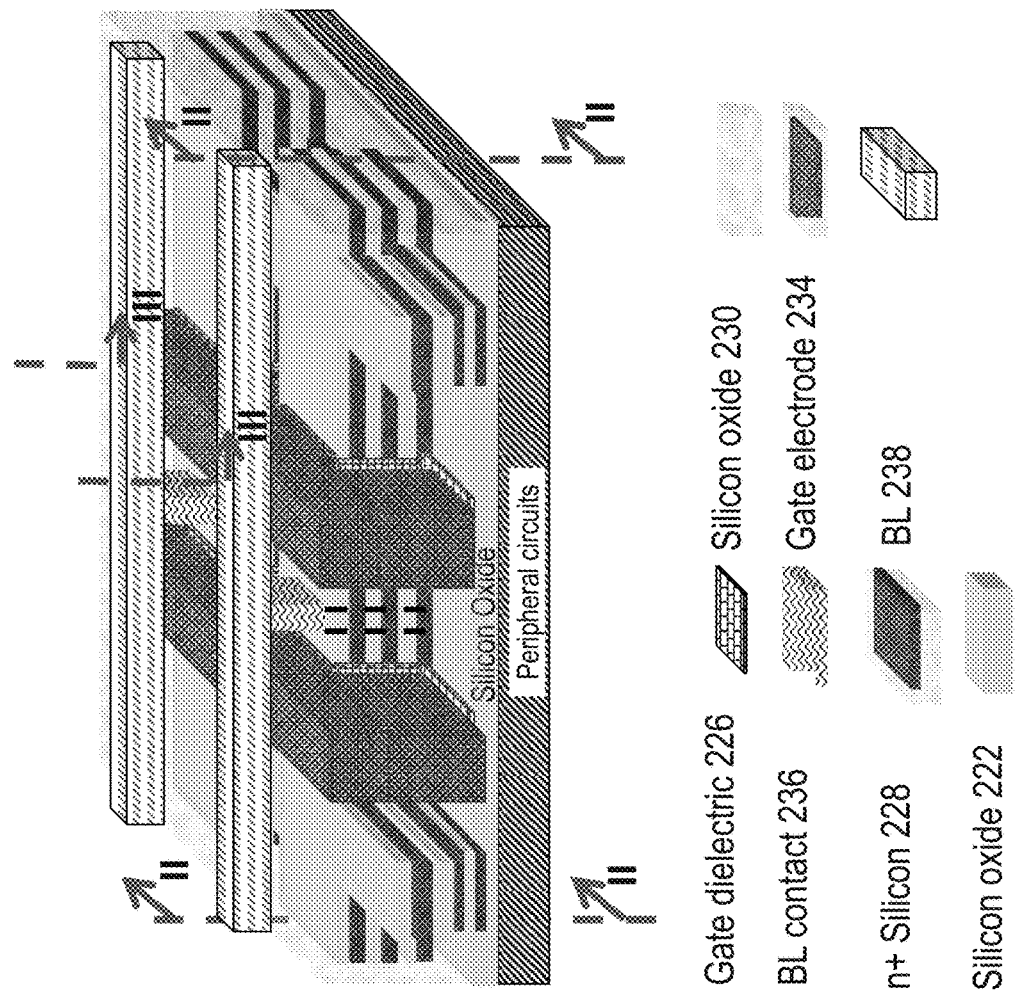
Fig. 2K

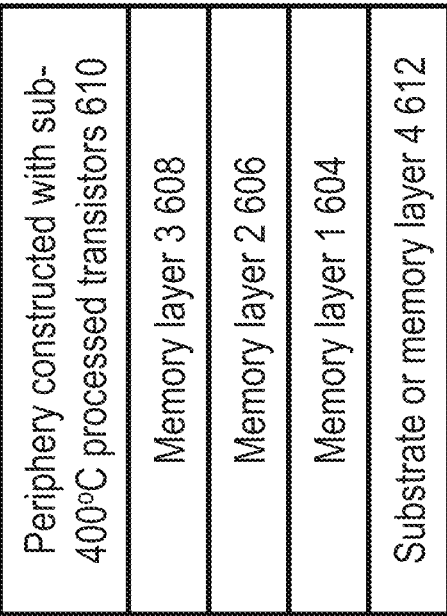
Fig. 6B: Periphery-on-top architecture
An alternative
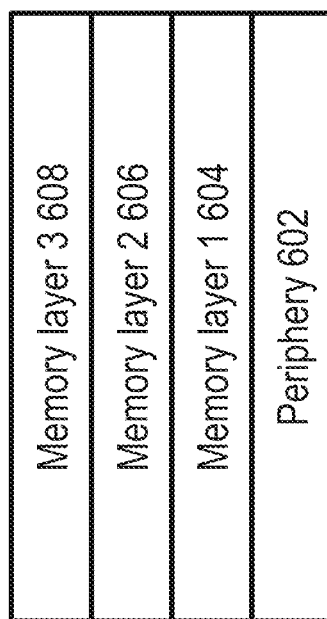
Fig. 6A: Periphery-on-bottom architecture

3D SEMICONDUCTOR DEVICE AND STRUCTURE

CROSS-REFERENCE OF RELATED APPLICATION

This application is a continuation in part of U.S. patent application Ser. No. 15/803,732, which was filed on Nov. 3, 2017, which is a continuation in part of U.S. patent application Ser. No. 14/555,494, which was filed on Nov. 26, 2014, and now is U.S. Pat. No. 9,818,800 issued on Nov. 14, 2017, which is a continuation of U.S. patent application Ser. No. 13/246,157, which was filed on Sep. 27, 2011 and now is U.S. Pat. No. 8,956,959 issued on Feb. 17, 2015, which is a continuation of U.S. patent application Ser. No. 13/173,999, which was filed on Jun. 30, 2011 and now is U.S. Pat. No. 8,203,148 issued on Jun. 19, 2012, which is a continuation of U.S. patent application Ser. No. 12/901,890, which was filed on Oct. 11, 2010, and now is U.S. Pat. No. 8,026,521 issued on Sep. 27, 2011, the entire contents of the foregoing are incorporated by reference herein.

BACKGROUND OF THE INVENTION

1. Field of the Invention

This invention describes applications of monolithic 3D integration to semiconductor chips performing logic and memory functions.

2. Discussion of Background Art

Over the past 40 years, one has seen a dramatic increase in functionality and performance of Integrated Circuits (ICs). This has largely been due to the phenomenon of "scaling" i.e. component sizes within ICs have been reduced ("scaled") with every successive generation of technology. There are two main classes of components in Complimentary Metal Oxide Semiconductor (CMOS) ICs, namely transistors and wires. With "scaling", transistor performance and density typically improve and this has contributed to the previously-mentioned increases in IC performance and functionality. However, wires (interconnects) that connect together transistors degrade in performance with "scaling". The situation today is that wires dominate performance, functionality and power consumption of ICs.

3D stacking of semiconductor chips is one avenue to tackle issues with wires. By arranging transistors in 3 dimensions instead of 2 dimensions (as was the case in the 1990s), one can place transistors in ICs closer to each other. This reduces wire lengths and keeps wiring delay low. However, there are many barriers to practical implementation of 3D stacked chips. These include:

Constructing transistors in ICs typically require high temperatures (higher than ~700° C.) while wiring levels are constructed at low temperatures (lower than ~400° C.). Copper or Aluminum wiring levels, in fact, can get damaged when exposed to temperatures higher than ~400° C. If one would like to arrange transistors in 3 dimensions along with wires, it has the challenge described below. For example, let us consider a 2 layer stack of transistors and wires i.e. Bottom Transistor Layer, above it Bottom Wiring Layer, above it Top Transistor Layer and above it Top Wiring Layer. When the Top Transistor Layer is constructed using Temperatures higher than 700° C., it can damage the Bottom Wiring Layer.

Due to the above mentioned problem with forming transistor layers above wiring layers at temperatures lower than 400° C., the semiconductor industry has largely explored alternative architectures for 3D stacking. In these alternative architectures, Bottom Transistor Layers, Bottom Wiring Layers and Contacts to the Top Layer are constructed on one silicon wafer. Top Transistor Layers, Top Wiring Layers and Contacts to the Bottom Layer are constructed on another silicon wafer. These two wafers are bonded to each other and contacts are aligned, bonded and connected to each other as well. Unfortunately, the size of Contacts to the other Layer is large and the number of these Contacts is small. In fact, prototypes of 3D stacked chips today utilize as few as 10,000 connections between two layers, compared to billions of connections within a layer. This low connectivity between layers is because of two reasons: (i) Landing pad size needs to be relatively large due to alignment issues during wafer bonding. These could be due to many reasons, including bowing of wafers to be bonded to each other, thermal expansion differences between the two wafers, and lithographic or placement misalignment. This misalignment between two wafers limits the minimum contact landing pad area for electrical connection between two layers; (ii) The contact size needs to be relatively large. Forming contacts to another stacked wafer typically involves having a Through-Silicon Via (TSV) on a chip. Etching deep holes in silicon with small lateral dimensions and filling them with metal to form TSVs is not easy. This places a restriction on lateral dimensions of TSVs, which in turn impacts TSV density and contact density to another stacked layer. Therefore, connectivity between two wafers is limited.

It is highly desirable to circumvent these issues and build 3D stacked semiconductor chips with a high-density of connections between layers. To achieve this goal, it is sufficient that one of three requirements must be met: (1) A technology to construct high-performance transistors with processing temperatures below ~400° C.; (2) A technology where standard transistors are fabricated in a pattern, which allows for high density connectivity despite the misalignment between the two bonded wafers; and (3) A chip architecture where process temperature increase beyond 400° C. for the transistors in the top layer does not degrade the characteristics or reliability of the bottom transistors and wiring appreciably. This patent application describes approaches to address options (1), (2) and (3) in the detailed description section. In the rest of this section, background art that has previously tried to address options (1), (2) and (3) will be described.

There are many techniques to construct 3D stacked integrated circuits or chips including:

Through-silicon via (TSV) technology: Multiple layers of transistors (with or without wiring levels) can be constructed separately. Following this, they can be bonded to each other and connected to each other with through-silicon vias (TSVs).

Monolithic 3D technology: With this approach, multiple layers of transistors and wires can be monolithically constructed. Some monolithic 3D and 3DIC approaches are described in U.S. Pat. Nos. 8,273,610, 8,298,875, 8,362,482, 8,378,715, 8,379,458, 8,450,804, 8,557,632, 8,574,929, 8,581,349, 8,642,416, 8,669,778, 8,674,470, 8,687,399, 8,742,476, 8,803,206, 8,836,073, 8,902,663, 8,994,404, 9,023,688, 9,029,173, 9,030,858, 9,117,749, 9,142,553, 9,219, 005, 9,385,058, 9,406,670, 9,460,978, 9,509,313, 9,640,531, 9,691,760, 9,711,407, 9,721,927, 9,799, 761, 9,871,034, 9,953,870, 9,953,994, 10,014,292, 10,014,318; and pending U.S. Patent Application Publications and applications, Ser. Nos. 14/642,724, 15/150,395, 15/173,686, 62/651,722; 62/681,249, 62/713,345, 62/770,751; and PCT Applications (and Publications): PCT/US2010/052093, PCT/US2011/042071 (WO2012/015550), PCT/US2016/52726 (WO2017053329), PCT/US2017/052359 (WO2018/071143), PCT/US2018/016759 (WO2018144957), and PCT/US2018/52332 (WO 2019/060798). The entire contents of the foregoing patents, publications, and applications are incorporated herein by reference.

Electro-Optics: There is also work done for integrated monolithic 3D including layers of different crystals, such as U.S. Pat. Nos. 8,283,215, 8,163,581, 8,753,913, 8,823,122, 9,197,804, 9,419,031 and 9,941,319. The entire contents of the foregoing patents, publications, and applications are incorporated herein by reference.

U.S. Pat. No. 7,052,941 from Sang-Yun Lee ("S-Y Lee") describes methods to construct vertical transistors above wiring layers at less than 400° C. In these single crystal Si transistors, current flow in the transistor's channel region is in the vertical direction. Unfortunately, however, almost all semiconductor devices in the market today (logic, DRAM, flash memory) utilize horizontal (or planar) transistors due to their many advantages, and it is difficult to convince the industry to move to vertical transistor technology.

A paper from IBM at the Intl. Electron Devices Meeting in 2005 describes a method to construct transistors for the top stacked layer of a 2 chip 3D stack on a separate wafer. This paper is "Enabling SOI-Based Assembly Technology for Three-Dimensional (3D) Integrated Circuits (ICs)," IEDM Tech. Digest, p. 363 (2005) by A. W. Topol, D. C. La Tulipe, L. Shi, et al. ("Topol"). A process flow is utilized to transfer this top transistor layer atop the bottom wiring and transistor layers at temperatures less than 400° C. Unfortunately, since transistors are fully formed prior to bonding, this scheme suffers from misalignment issues. While Topol describes techniques to reduce misalignment errors in the above paper, the techniques of Topol still suffer from misalignment errors that limit contact dimensions between two chips in the stack to >130 nm.

The textbook "Integrated Interconnect Technologies for 3D Nanoelectronic Systems" by Bakir and Meindl ("Bakir") describes a 3D stacked DRAM concept with horizontal (i.e. planar) transistors. Silicon for stacked transistors is produced using selective epitaxy technology or laser recrystallization. Unfortunately, however, these technologies have higher defect density compared to standard single crystal silicon. This higher defect density degrades transistor performance.

In the NAND flash memory industry, several organizations have attempted to construct 3D stacked memory. These attempts predominantly use transistors constructed with poly-Si or selective epi technology as well as charge-trap concepts. References that describe these attempts to 3D stacked memory include "Integrated Interconnect Technologies for 3D Nanoelectronic Systems", Artech House, 2009 by Bakir and Meindl ("Bakir"), "Bit Cost Scalable Technology with Punch and Plug Process for Ultra High Density Flash Memory", Symp. VLSI Technology Tech. Dig. pp. 14-15, 2007 by H. Tanaka, M. Kido, K. Yahashi, et al. ("Tanaka"), "A Highly Scalable 8-Layer 3D Vertical-Gate (VG) TFT NAND Flash Using Junction-Free Buried Channel BE-SONOS Device," Symposium on VLSI Technology, 2010 by W. Kim, S. Choi, et al. ("W. Kim"), "A Highly Scalable 8-Layer 3D Vertical-Gate (VG) TFT NAND Flash Using Junction-Free Buried Channel BE-SONOS Device," Symposium on VLSI Technology, 2010 by Hang-Ting Lue, et al. ("Lue") and "Sub-50 nm Dual-Gate Thin-Film Transistors for Monolithic 3-D Flash", IEEE Trans. Elect. Dev., vol. 56, pp. 2703-2710, November 2009 by A. J. Walker ("Walker"). An architecture and technology that utilizes single crystal Silicon using epi growth is described in "A Stacked SONOS Technology, Up to 4 Levels and 6 nm Crystalline Nanowires, with Gate-All-Around or Independent Gates (ΦFlash), Suitable for Full 3D Integration", International Electron Devices Meeting, 2009 by A. Hubert, et al ("Hubert"). However, the approach described by Hubert has some challenges including use of difficult-to-manufacture nanowire transistors, higher defect densities due to formation of Si and SiGe layers atop each other, high temperature processing for long times, difficult manufacturing, etc.

It is clear based on the background art mentioned above that invention of novel technologies for 3D stacked chips will be useful.

SUMMARY

The invention may be directed to multilayer or Three Dimensional Integrated Circuit (3D IC) devices and fabrication methods.

In one aspect, a 3D semiconductor device, the device comprising: a first level comprising a first single crystal layer; first transistors overlaying said first single crystal layer; second transistors overlaying said first transistors; and a second level comprising a second single crystal layer, said second level overlays said second transistors, wherein said first transistors and said second transistors each comprises a polysilicon channel.

In another aspect, a 3D semiconductor device, the device comprising: a first level comprising a first single crystal layer; first transistors overlaying said first single crystal layer; second transistors overlaying said first transistors; and a second level comprising a second single crystal layer, said second level overlaying said second transistors, wherein said first transistors and said second transistors are junction-less transistors.

In another aspect, a 3D semiconductor device, the device comprising: a first level comprising a first single crystal layer; first transistors overlaying said first single crystal layer; second transistors overlaying said first transistors; third transistors overlaying said second transistors; fourth transistors overlaying said third transistors; a second level comprising a second single crystal layer, said second single crystal layer overlaying said fourth transistor, wherein said second transistors, said third transistors, and said fourth transistors are self-aligned, being processed following the same lithography step; and a memory peripheral circuit, wherein said memory peripheral circuit comprises at least one of said first transistors, and wherein said memory peripheral circuit controls at least one of said second transistors, at least one of said third transistors, and at least one of said fourth transistors.

BRIEF DESCRIPTION OF THE DRAWINGS

Various embodiments of the invention will be understood and appreciated more fully from the following detailed description, taken in conjunction with the drawings in which:

FIGS. 2A-2K show a zero-mask per layer 3D floating body DRAM;

FIGS. 4A-4K show an alternative zero-mask per layer 3D resistive memory;

FIGS. 6A-6B show periphery on top of memory layers;

DETAILED DESCRIPTION

Embodiments of the present invention are now described with reference to FIGS. 1-8, it being appreciated that the figures illustrate the subject matter not to scale or to measure. Many figures describe process flows for building devices. These process flows, which are essentially a sequence of steps for building a device, have many structures, numerals and labels that are common between two or more adjacent steps. In such cases, some labels, numerals and structures used for a certain step's figure may have been described in previous steps' figures.

Figure 1A:
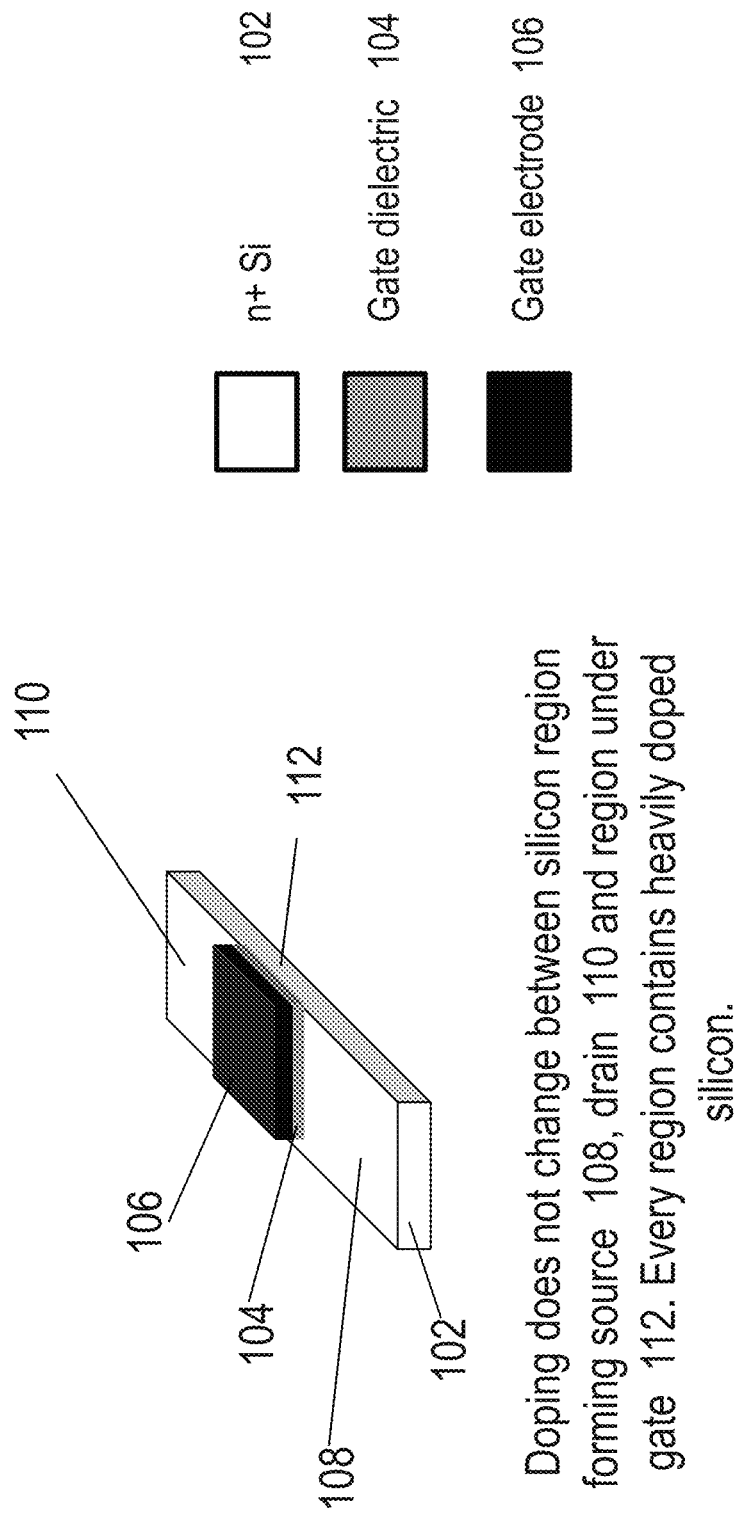
FIGS. 1A-1D show different types of junction-less transistors (JLT) that could be utilized for 3D stacking.
Figure 1B:
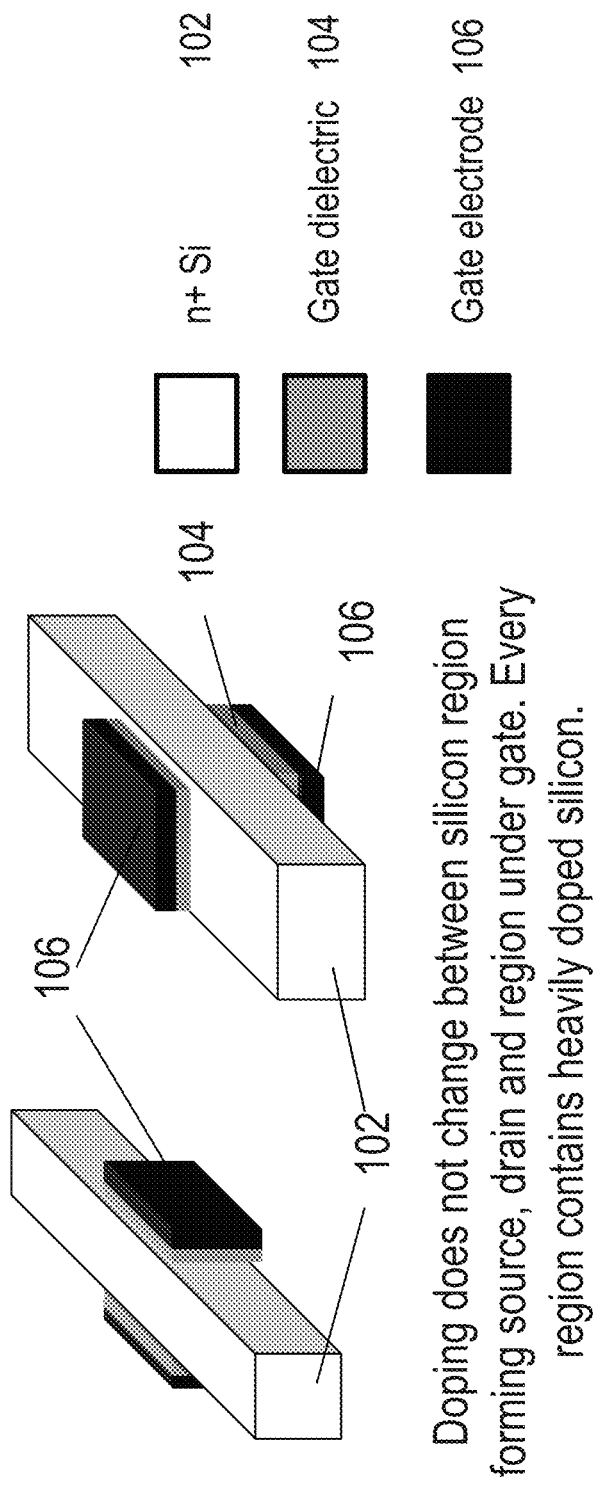
Figure 1C:
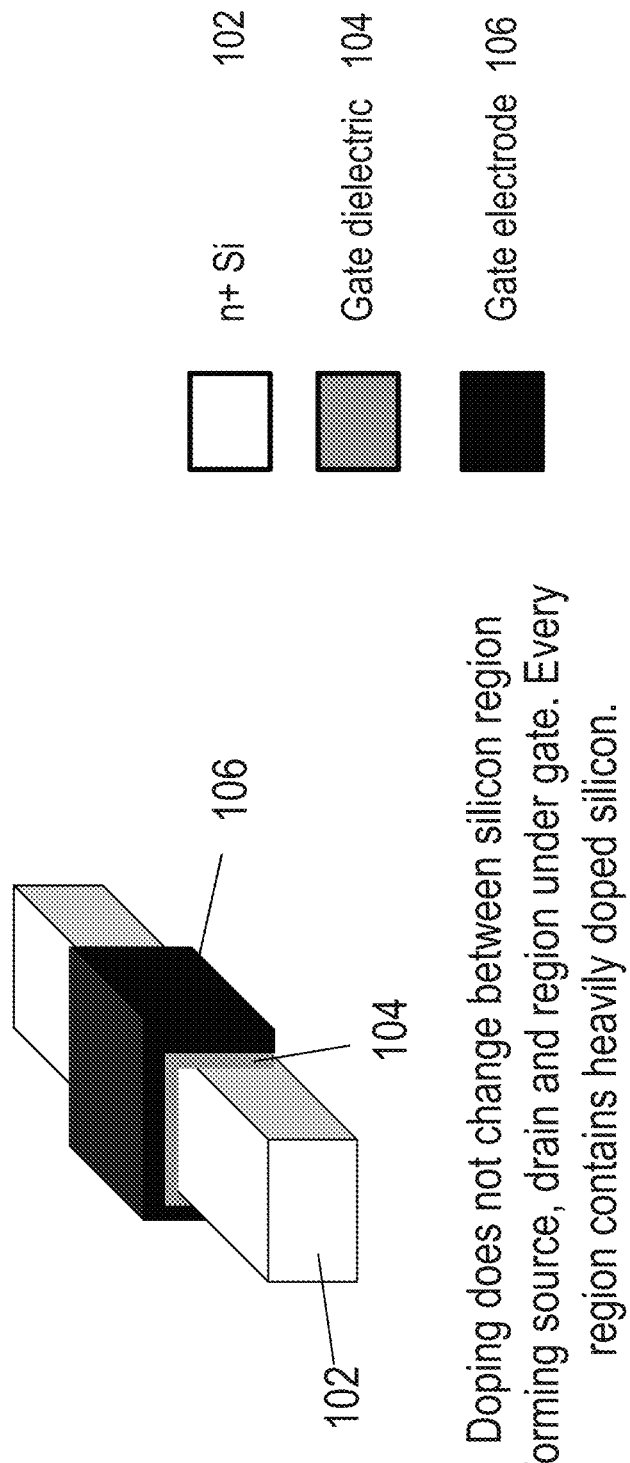
Figure 1D:
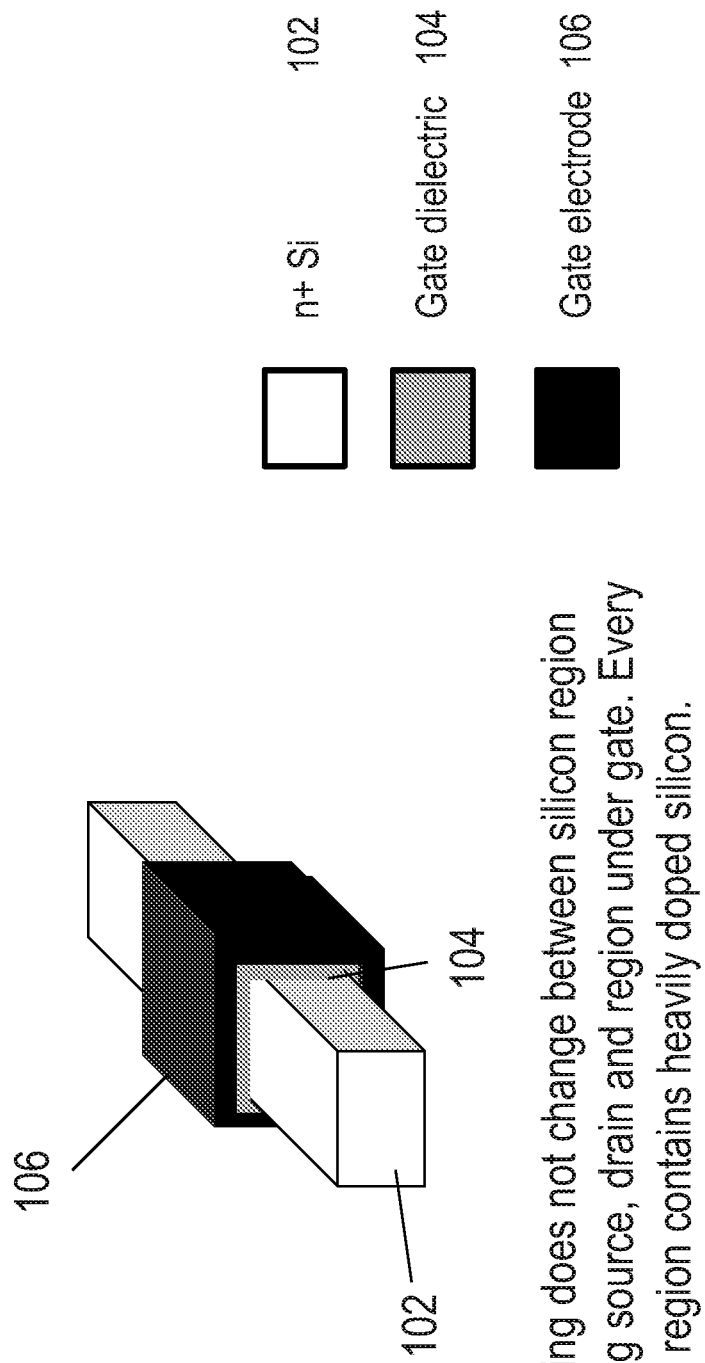

FIG. 1A-1D shows that JLTs that can be 3D stacked fall into four categories based on the number of gates they use: One-side gated JLTs as shown in FIG. 1A, two-side gated JLTs as shown in FIG. 1B, three-side gated JLTs as shown in FIG. 1C, and gate-all-around JLTs as shown in FIG. 1D. The JLTS shown may include n+Si 102, gate dielectric 104, gate electrode 106, n+ source region 108, n+ drain region 110, and n+ region under gate 112. As the number of JLT gates increases, the gate gets more control of the channel, thereby reducing leakage of the JLT at 0V. Furthermore, the enhanced gate control can be traded-off for higher doping (which improves contact resistance to source-drain regions) or bigger JLT cross-sectional areas (which is easier from a process integration standpoint). However, adding more gates typically increases process complexity.

Some embodiments of this invention may involve floating body DRAM. Background information on floating body DRAM and its operation is given in "Floating Body RAM Technology and its Scalability to 32 nm Node and Beyond," *Electron Devices Meeting,* 2006. IEDM '06. International, vol., no., pp. 1-4, 11-13 Dec. 2006 by T. Shino, N. Kusunoki, T. Higashi, et al., Overview and future challenges of floating body RAM (FBRAM) technology for 32 nm technology node and beyond, Solid-State Electronics, Volume 53, Issue 7, Papers Selected from the 38th European Solid-State Device Research Conference—ESSDERC'08, July 2009, Pages 676-683, ISSN 0038-1101, DOI: 10.1016/j.sse.2009.03.010 by Takeshi Hamamoto, Takashi Ohsawa, et al., "New Generation of Z-RAM," *Electron Devices Meeting,* 2007. IEDM 2007. IEEE International, vol., no., pp. 925-928, 10-12 Dec. 2007 by Okhonin, S.; Nagoga, M.; Carman, E, et al. The above publications are incorporated herein by reference.

FIG. 2A-K describe a process flow to construct a horizontally-oriented monolithic 3D DRAM. This monolithic 3D DRAM utilizes the floating body effect and double-gate transistors. No mask is utilized on a "per-memory-layer" basis for the monolithic 3D DRAM concept shown in FIG. 2A-K, and all other masks are shared between different layers. The process flow may include several steps in the following sequence.

Figure 2A:
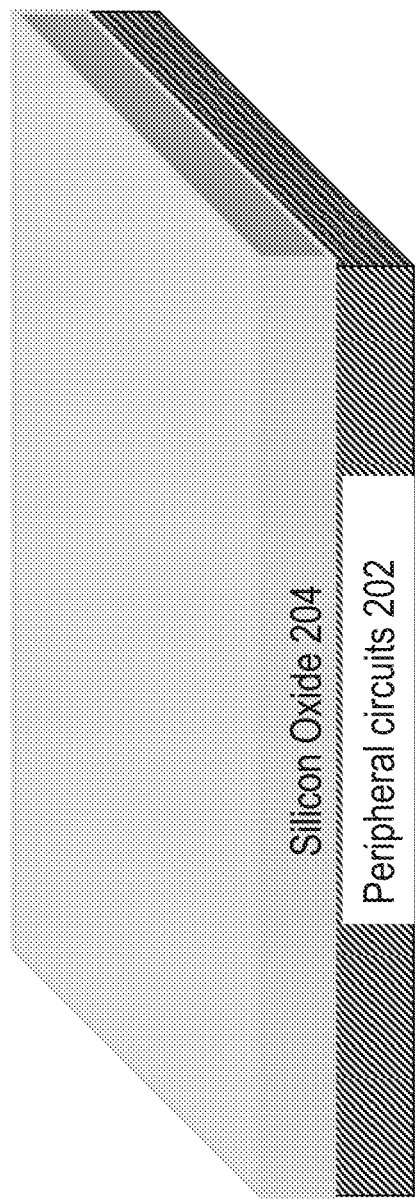

Step (A): Peripheral circuits with tungsten wiring 202 are first constructed and above this a layer of silicon dioxide 204 is deposited. FIG. 2A shows a drawing illustration after Step (A).

Figure 2B:
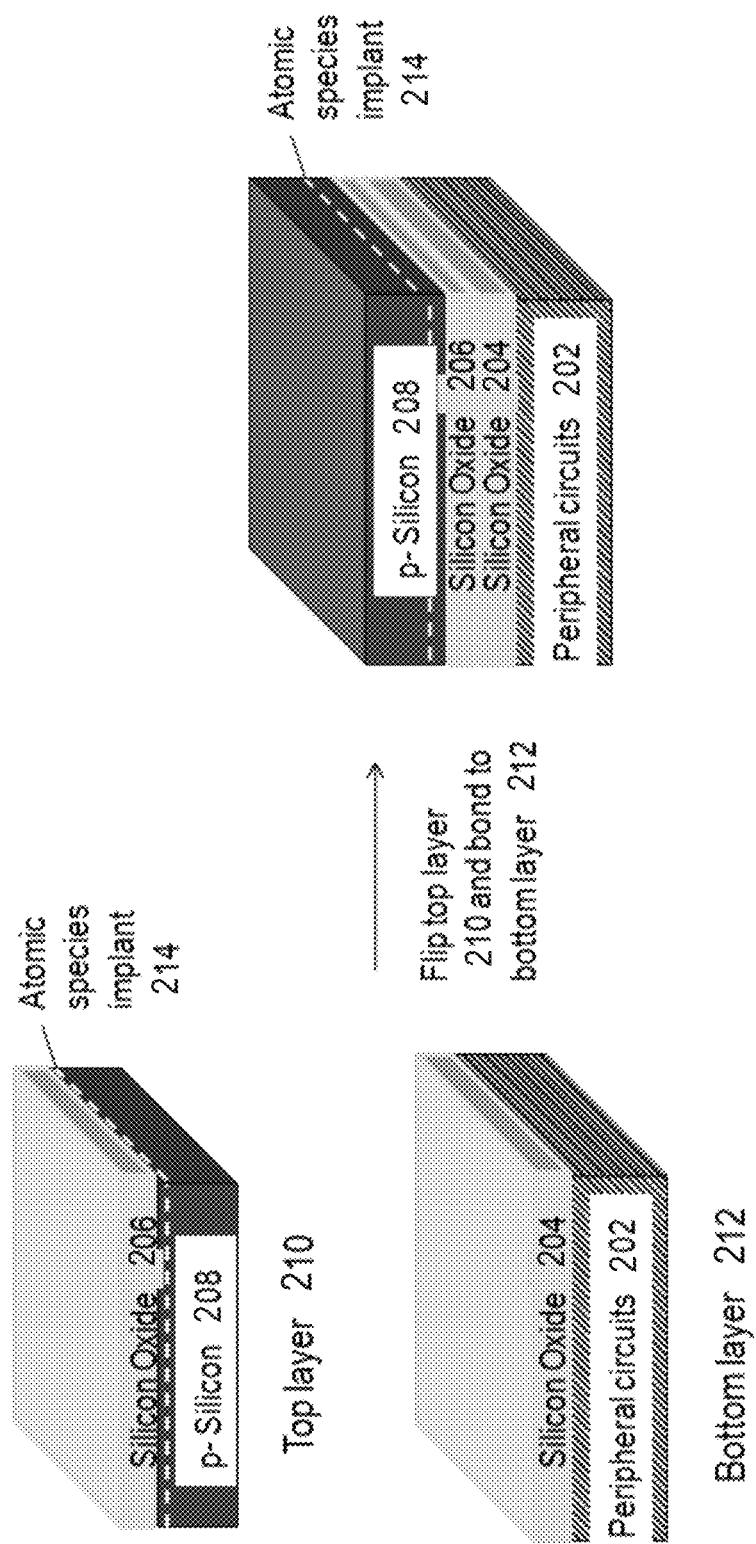

Step (B): FIG. 2B illustrates the structure after Step (B). A wafer of p– Silicon 208 has an oxide layer 206 grown or deposited above it. Following this, hydrogen is implanted into the p– Silicon wafer at a certain depth indicated by 214. Alternatively, some other atomic species such as Helium could be (co-)implanted. This hydrogen implanted p– Silicon wafer 208 forms the top layer 210. The bottom layer 212 may include the peripheral circuits 202 with oxide layer 204. The top layer 210 is flipped and bonded to the bottom layer 212 using oxide-to-oxide bonding.

Figure 2C:
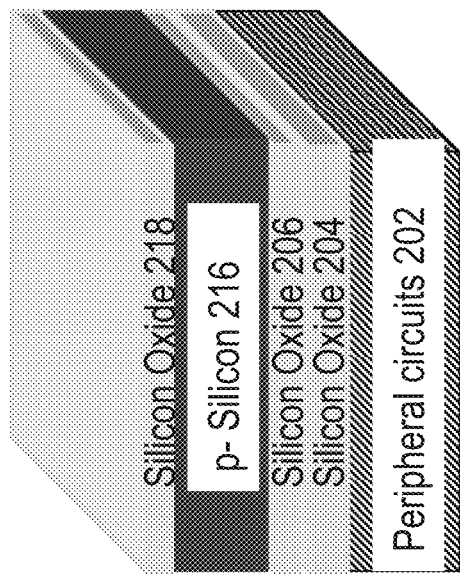

Step (C): FIG. 2C illustrates the structure after Step (C). The stack of top and bottom wafers after Step (B) is cleaved at the hydrogen plane 3014 using either a anneal or a sideways mechanical force or other means. A CMP process is then conducted. A layer of silicon oxide 218 is then deposited atop the p– Silicon layer 216. At the end of this step, a single-crystal p– Si layer 216 exists atop the peripheral circuits, and this has been achieved using layer-transfer techniques.

Figure 2D:
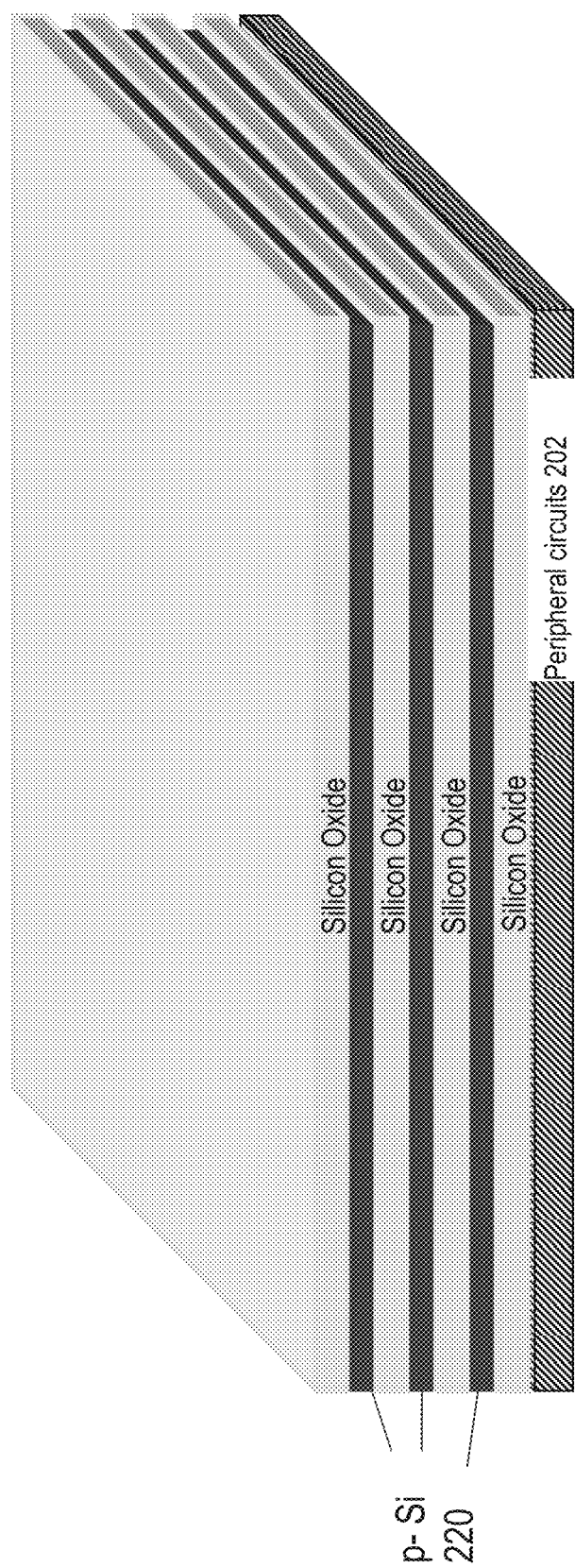

Step (D): FIG. 2D illustrates the structure after Step (D). Using methods similar to Step (B) and (C), multiple p– silicon layers 220 are formed with silicon oxide layers in between.

Figure 2E:
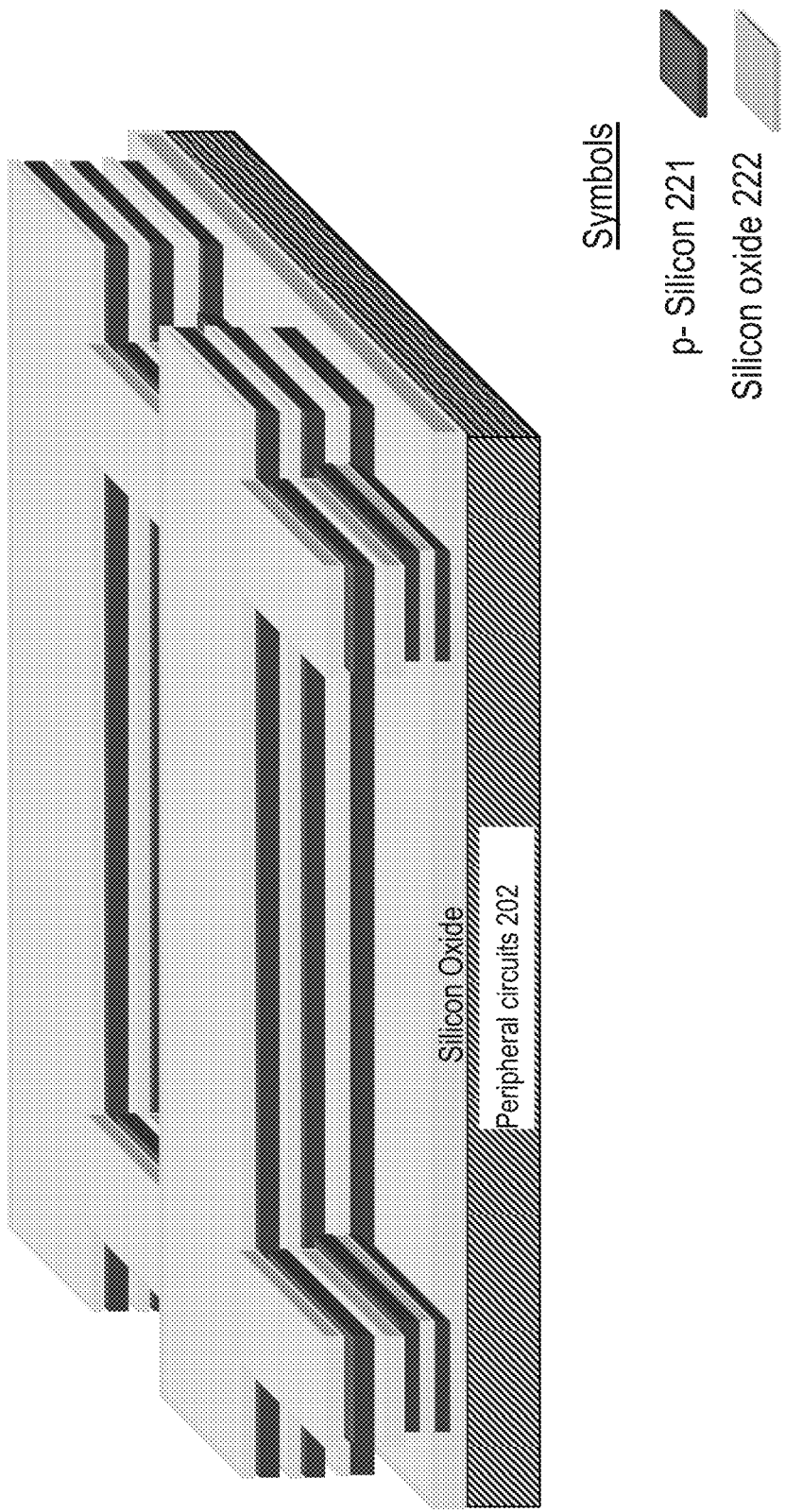

Step (E): FIG. 2E illustrates the structure after Step (E). Lithography and etch processes are then utilized to make a structure as shown in the figure, including layer regions of p– silicon 221 and associated isolation/bonding oxides 222.

Figure 2F:
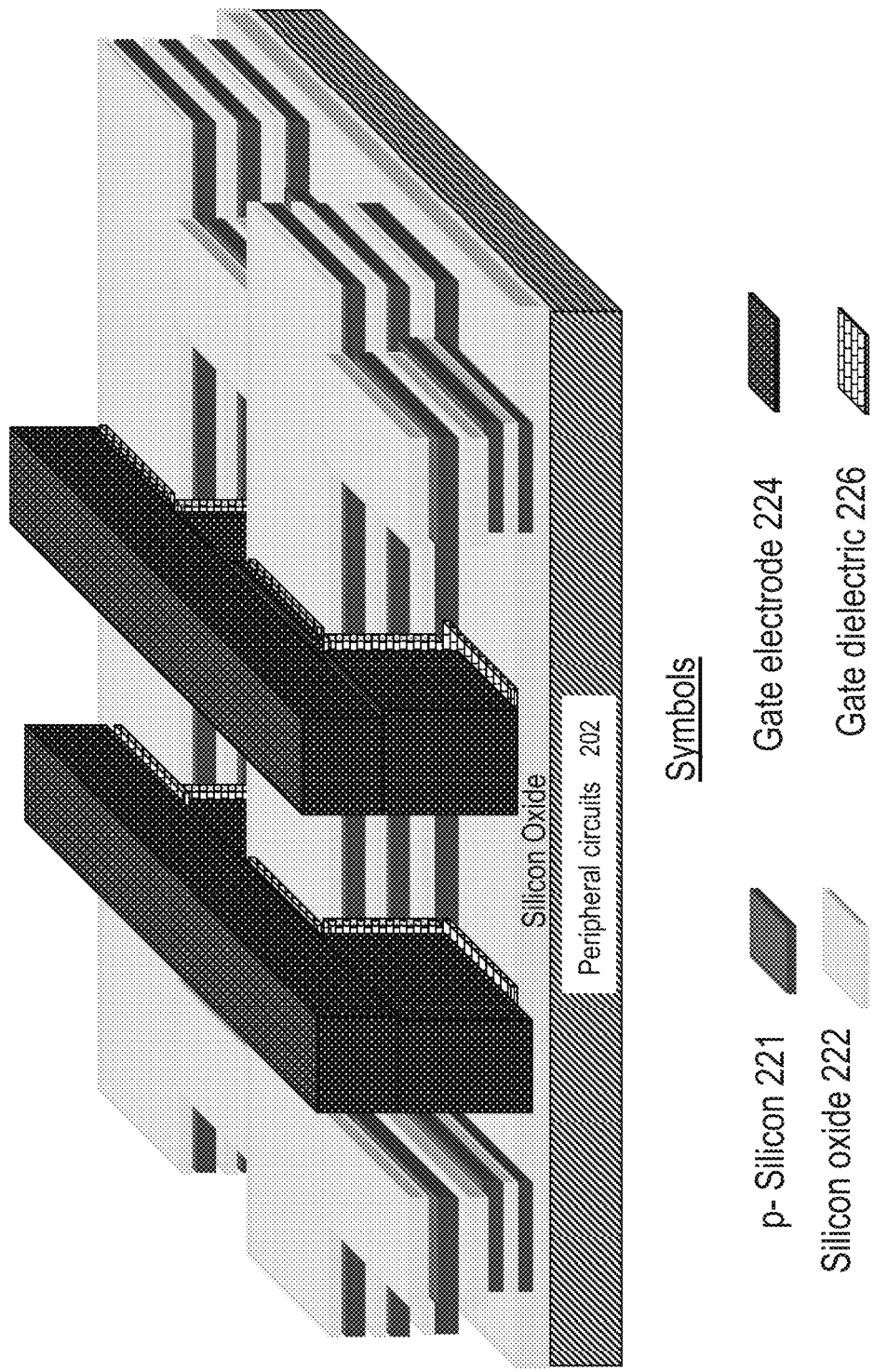

Step (F): FIG. 2F illustrates the structure after Step (F). Gate dielectric 226 and gate electrode 224 are then deposited following which a CMP is done to planarize the gate electrode 224 regions. Lithography and etch are utilized to define gate regions.

Figure 2G:
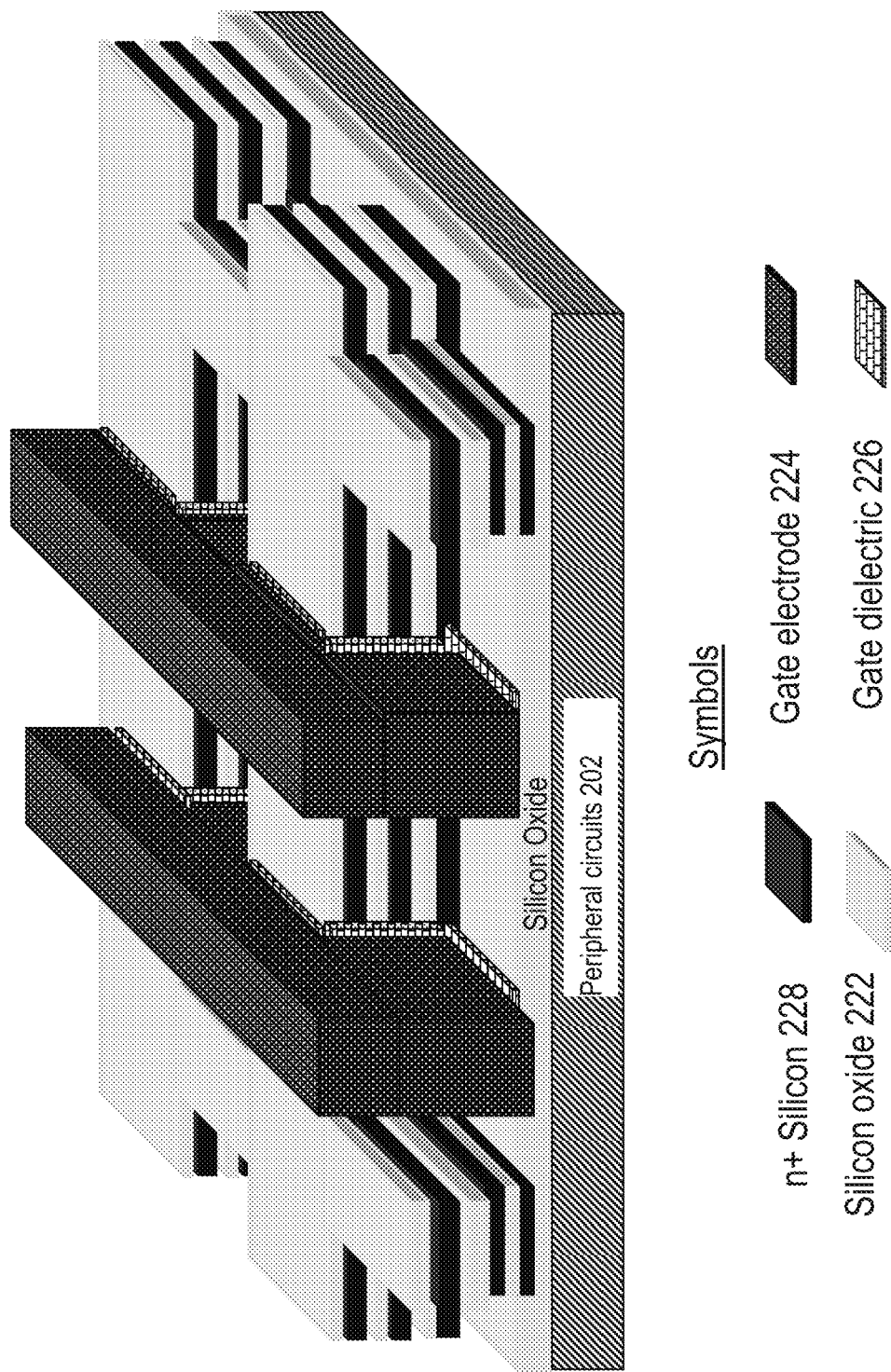

Step (G): FIG. 2G illustrates the structure after Step (G). Using the hard mask defined in Step (F), p– regions not covered by the gate are implanted to form n+ silicon regions 228. Spacers are utilized during this multi-step implantation process and layers of silicon present in different layers of the stack have different spacer widths to account for lateral straggle of buried layer implants. Bottom layers could have larger spacer widths than top layers. A thermal annealing step, such as a RTA or spike anneal or laser anneal or flash anneal, is then conducted to activate n+ doped regions.

Figure 2H:
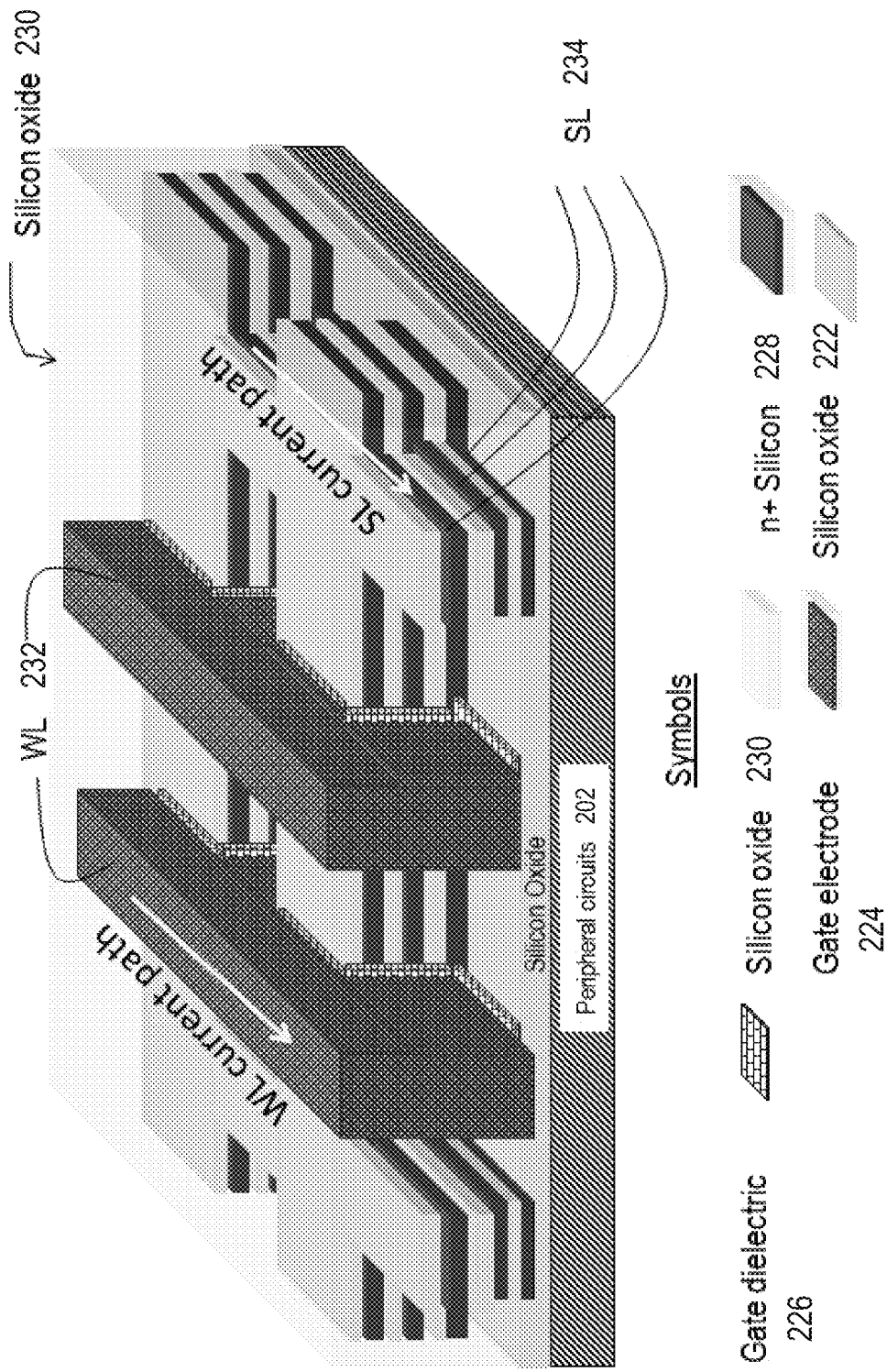
Figure 21:
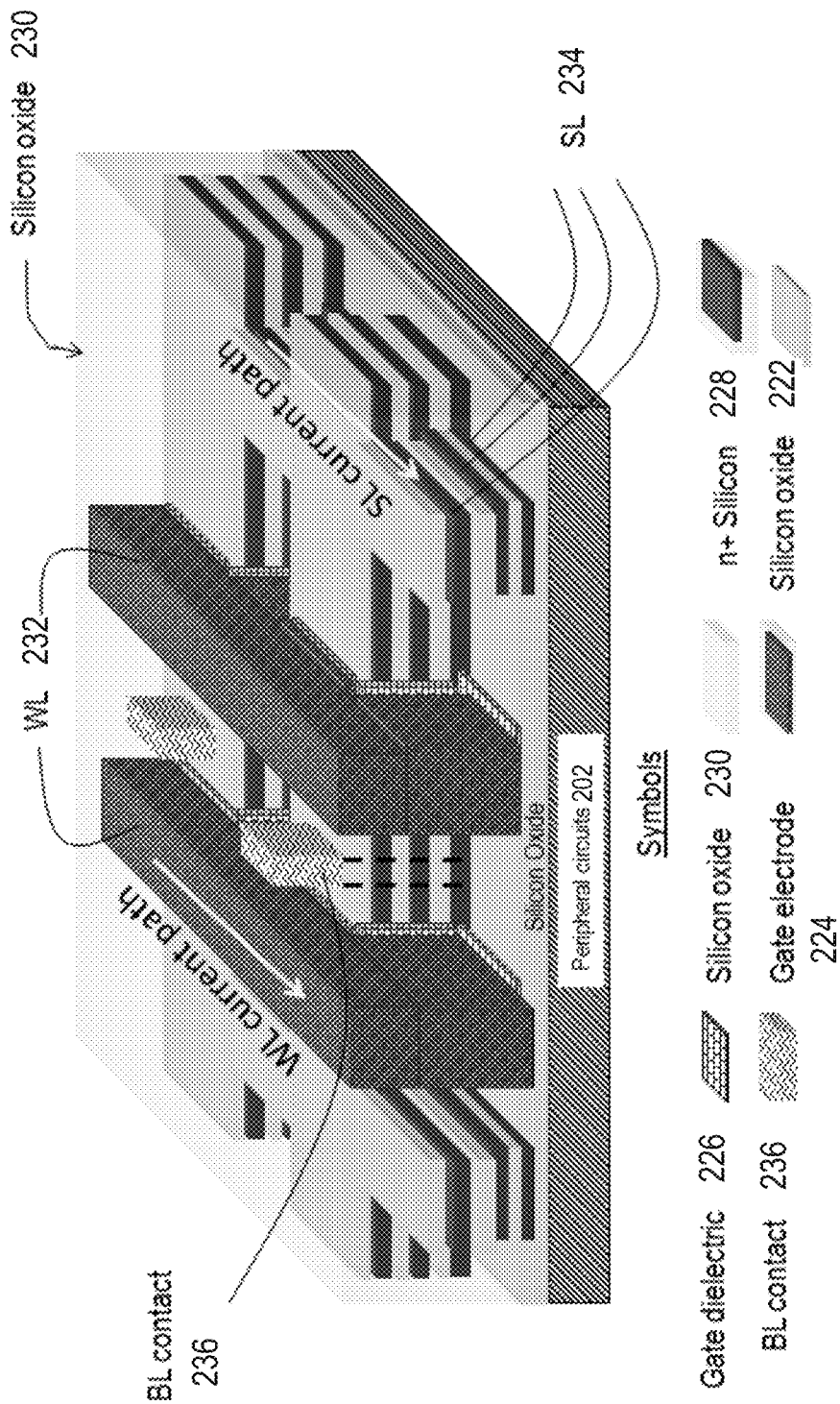

Step (H): FIG. 2H illustrates the structure after Step (H). A silicon oxide layer 230 is then deposited and planarized. For clarity, the silicon oxide layer is shown transparent, along with word-line (WL) 232 and source-line (SL) 234 regions.

Step (I): FIG. 2I illustrates the structure after Step (I). Bit-line (BL) contacts 236 are formed by etching and deposition. These BL contacts are shared among all layers of memory.

Figure 2J:
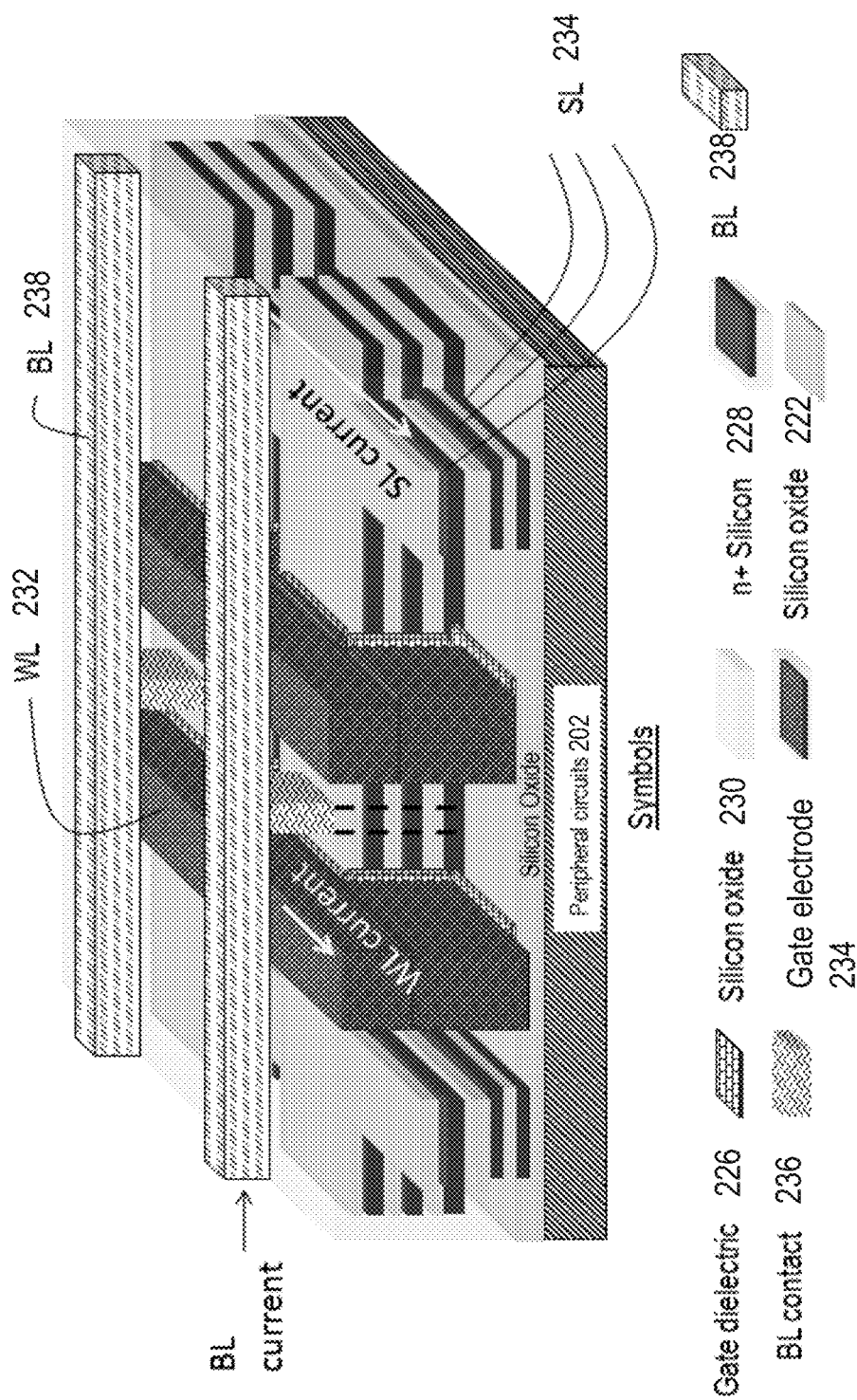

Step (J): FIG. 2J illustrates the structure after Step (J). BLs 238 are then constructed. Contacts are made to BLs, WLs and SLs of the memory array at its edges. SL contacts can be made into stair-like structures using techniques described in "Bit Cost Scalable Technology with Punch and Plug Process for Ultra High Density Flash Memory," *VLSI Technology,* 2007 IEEE Symposium on, vol., no., pp. 14-15, 12-14 Jun. 2007 by Tanaka, H.; Kido, M.; Yahashi, K.; Oomura, M.; et al., following which contacts can be constructed to them. Formation of stair-like structures for SLs could be done in steps prior to Step (J) as well.

FIG. 2K shows cross-sectional views of the array for clarity. Double-gated transistors may be utilized along with the floating body effect for storing information.

A floating-body DRAM has thus been constructed, with (1) horizontally-oriented transistors—i.e. current flowing in substantially the horizontal direction in transistor channels (2) some of the memory cell control lines, e.g., source-lines SL, constructed of heavily doped silicon and embedded in the memory cell layer, (3) side gates simultaneously deposited over multiple memory layers, and (4) monocrystalline (or single-crystal) silicon layers obtained by layer transfer techniques such as ion-cut.

With the explanations for the formation of monolithic 3D DRAM with ion-cut in this section, it is clear to one skilled in the art that alternative implementations are possible. BL and SL nomenclature has been used for two terminals of the 3D DRAM array, and this nomenclature can be interchanged. Each gate of the double gate 3D DRAM can be independently controlled for better control of the memory cell. To implement these changes, the process steps in FIG. 2 may be modified. Moreover, selective epi technology or laser recrystallization technology could be utilized for implementing structures shown in FIG. 2A-K. Various other types of layer transfer schemes that have been described in Section 1.3.4 of the parent application (Ser. No. 12/901,890, U.S. Pat. No. 8,026,521) can be utilized for construction of various 3D DRAM structures. Furthermore, buried wiring, i.e. where wiring for memory arrays is below the memory layers but above the periphery, may also be used. In addition, other variations of the monolithic 3D DRAM concepts are possible.

While many of today's memory technologies rely on charge storage, several companies are developing non-volatile memory technologies based on resistance of a material changing. Examples of these resistance-based memories include phase change memory, Metal Oxide memory, resistive RAM (RRAM), memristors, solid-electrolyte memory, ferroelectric RAM, MRAM, etc. Background information on these resistive-memory types is given in "Overview of candidate device technologies for storage-class memory," *IBM Journal of Research and Development*, vol. 52, no. 4.5, pp. 449-464, July 2008 by Burr, G. W.; Kurdi, B. N.; Scott, J. C.; Lam, C. H.; Gopalakrishnan, K.; Shenoy, R. S.

FIGS. 3A-J describe a novel memory architecture for resistance-based memories, and a procedure for its construction. The memory architecture utilizes junction-less transistors and has a resistance-based memory element in series with a transistor selector. No mask is utilized on a "per-memory-layer" basis for the monolithic 3D resistance change memory (or resistive memory) concept shown in FIG. 3A-J, and all other masks are shared between different layers. The process flow may include several steps that occur in the following sequence.

Figure 3A:
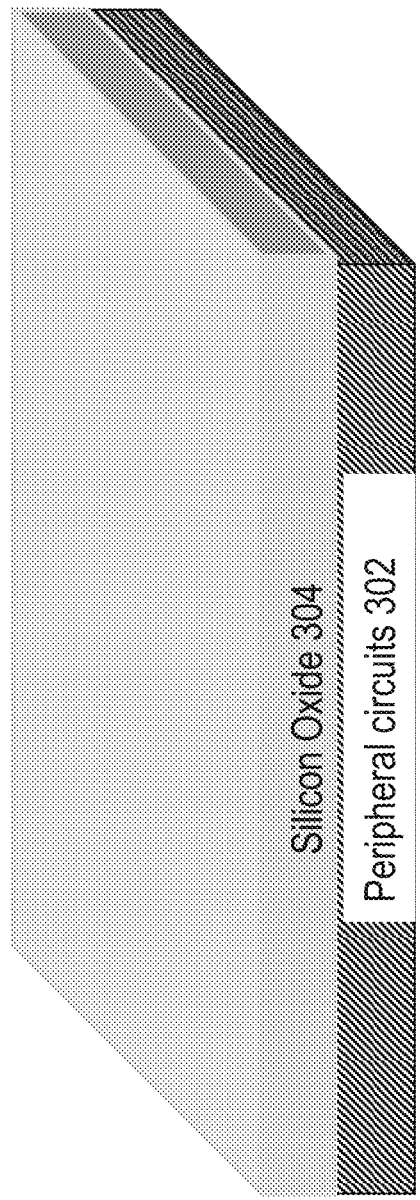
FIGS. 3A-3J show a zero-mask per layer 3D resistive memory with a junction-less transistor.

Step (A): Peripheral circuits 302 are first constructed and above this a layer of silicon dioxide 304 is deposited. FIG. 3A shows a drawing illustration after Step (A).

Figure 3B:
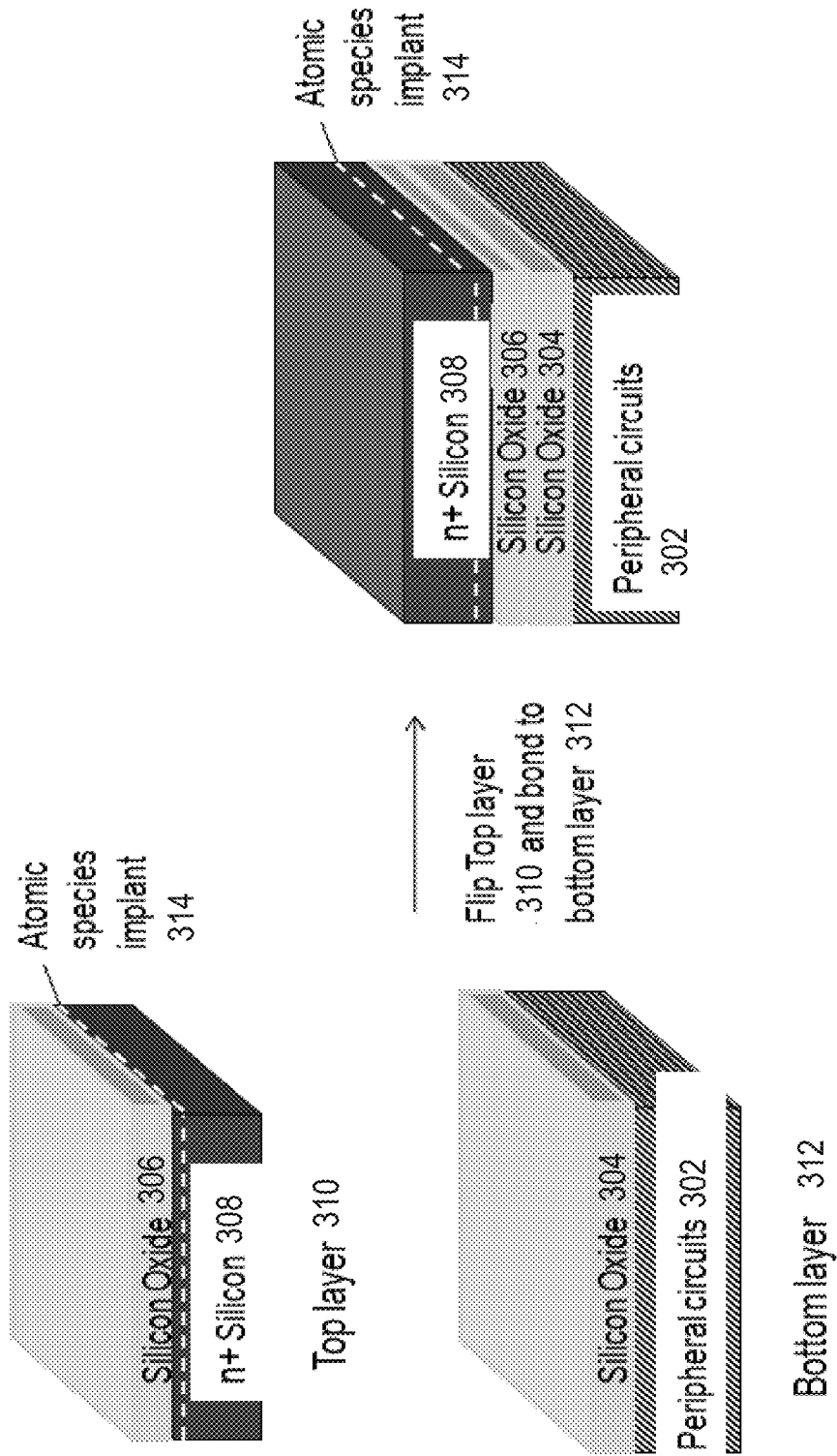

Step (B): FIG. 3B illustrates the structure after Step (B). A wafer of n+ Silicon 308 has an oxide layer 306 grown or deposited above it. Following this, hydrogen is implanted into the n+ Silicon wafer at a certain depth indicated by 314. Alternatively, some other atomic species such as Helium could be (co-)implanted. This hydrogen implanted n+ Silicon wafer 308 forms the top layer 310. The bottom layer 312 may include the peripheral circuits 302 with oxide layer 304.

The top layer 310 is flipped and bonded to the bottom layer 312 using oxide-to-oxide bonding.

Figure 3C:
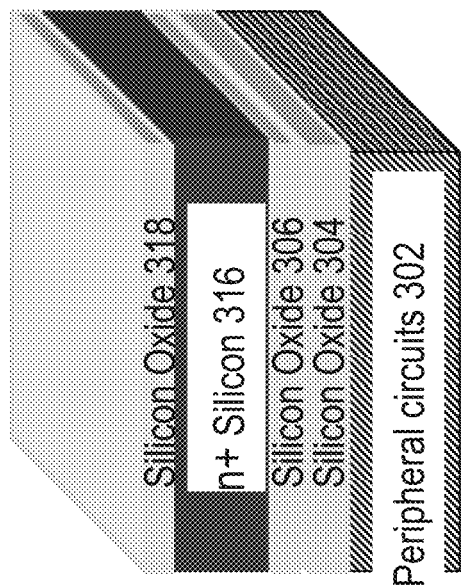

Step (C): FIG. 3C illustrates the structure after Step (C). The stack of top and bottom wafers after Step (B) is cleaved at the hydrogen plane 314 using either an anneal or a sideways mechanical force or other means. A CMP process is then conducted. A layer of silicon oxide 318 is then deposited atop the n+ Silicon layer 316. At the end of this step, a single-crystal n+ Si layer 316 exists atop the peripheral circuits, and this has been achieved using layer-transfer techniques.

Figure 3D:
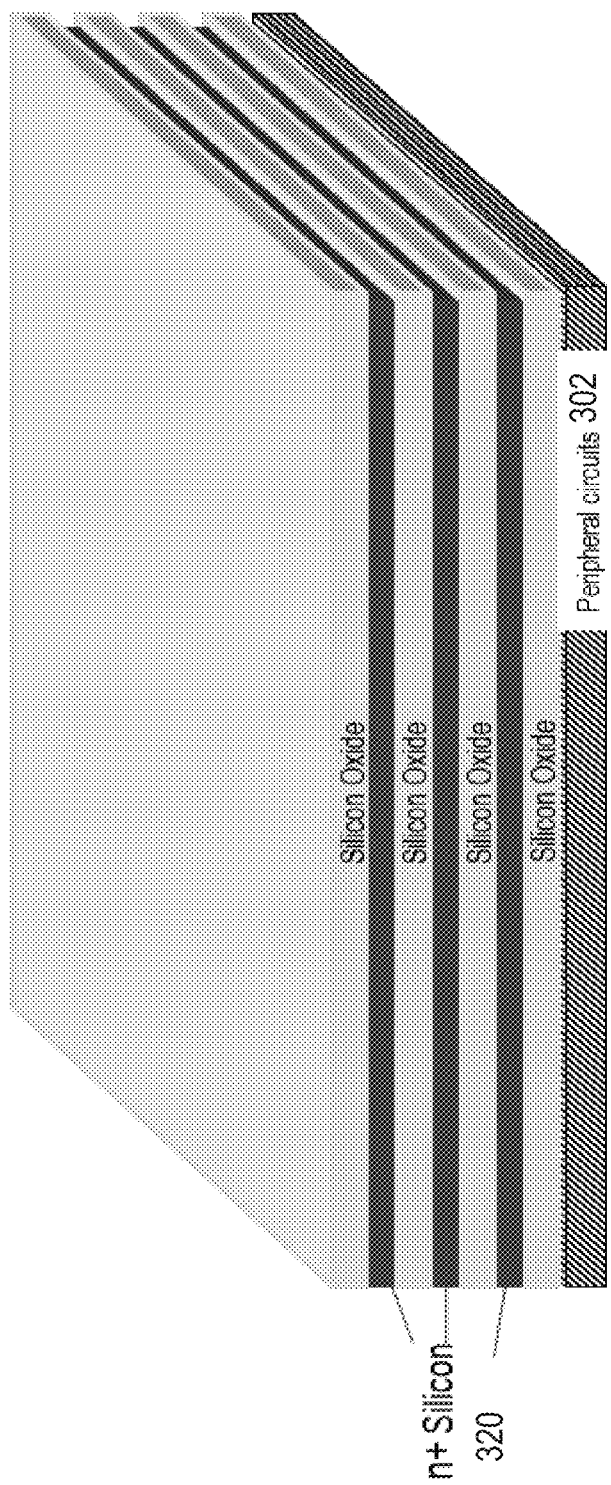

Step (D): FIG. 3D illustrates the structure after Step (D). Using methods similar to Step (B) and (C), multiple n+ silicon layers 320 are formed with silicon oxide layers in between.

Figure 3E:
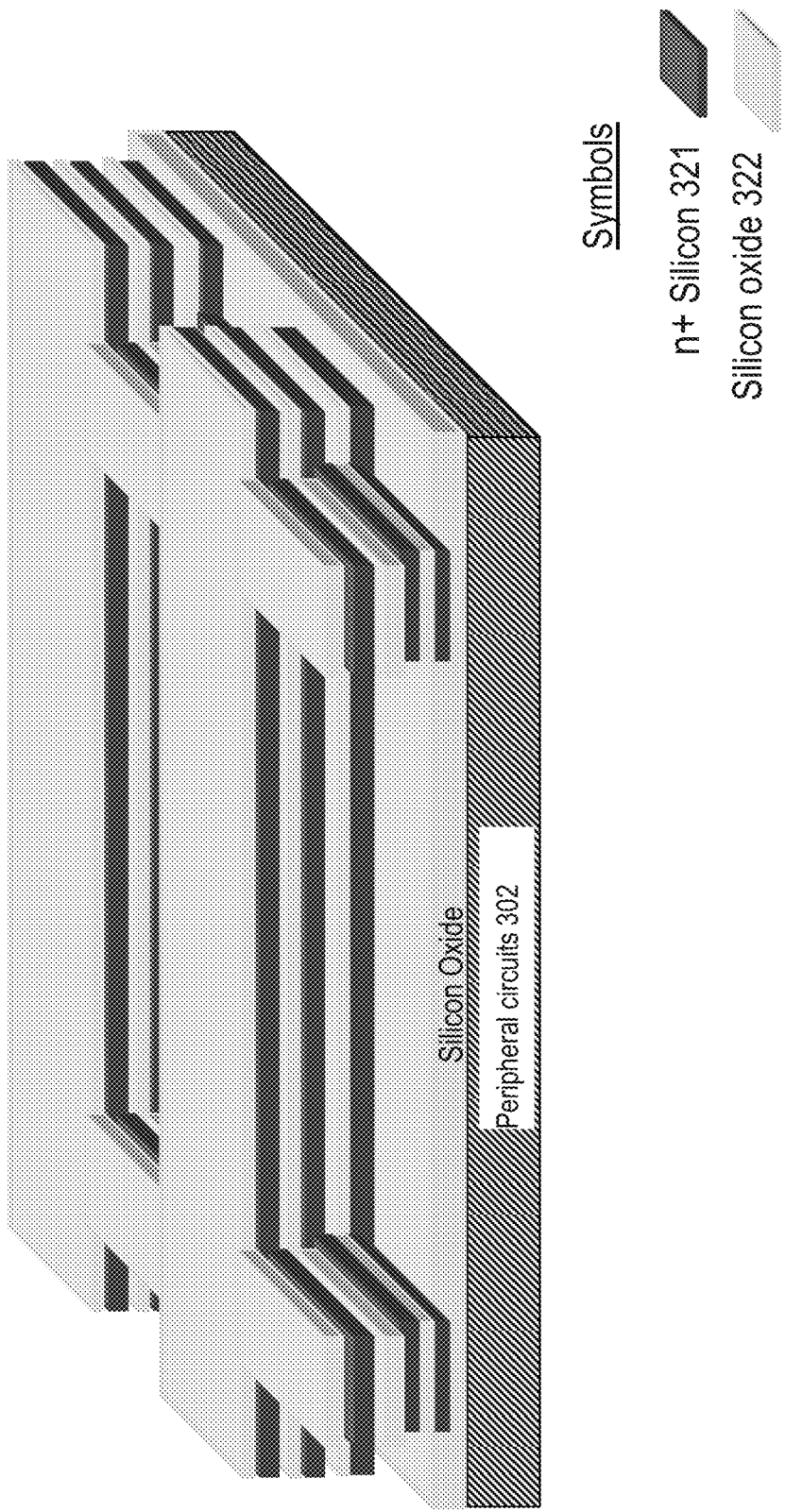

Step (E): FIG. 3E illustrates the structure after Step (E). Lithography and etch processes are then utilized to make a structure as shown in the figure, including layer regions of n+ silicon 321 and associated bonding/isolation oxides 322.

Figure 3F:
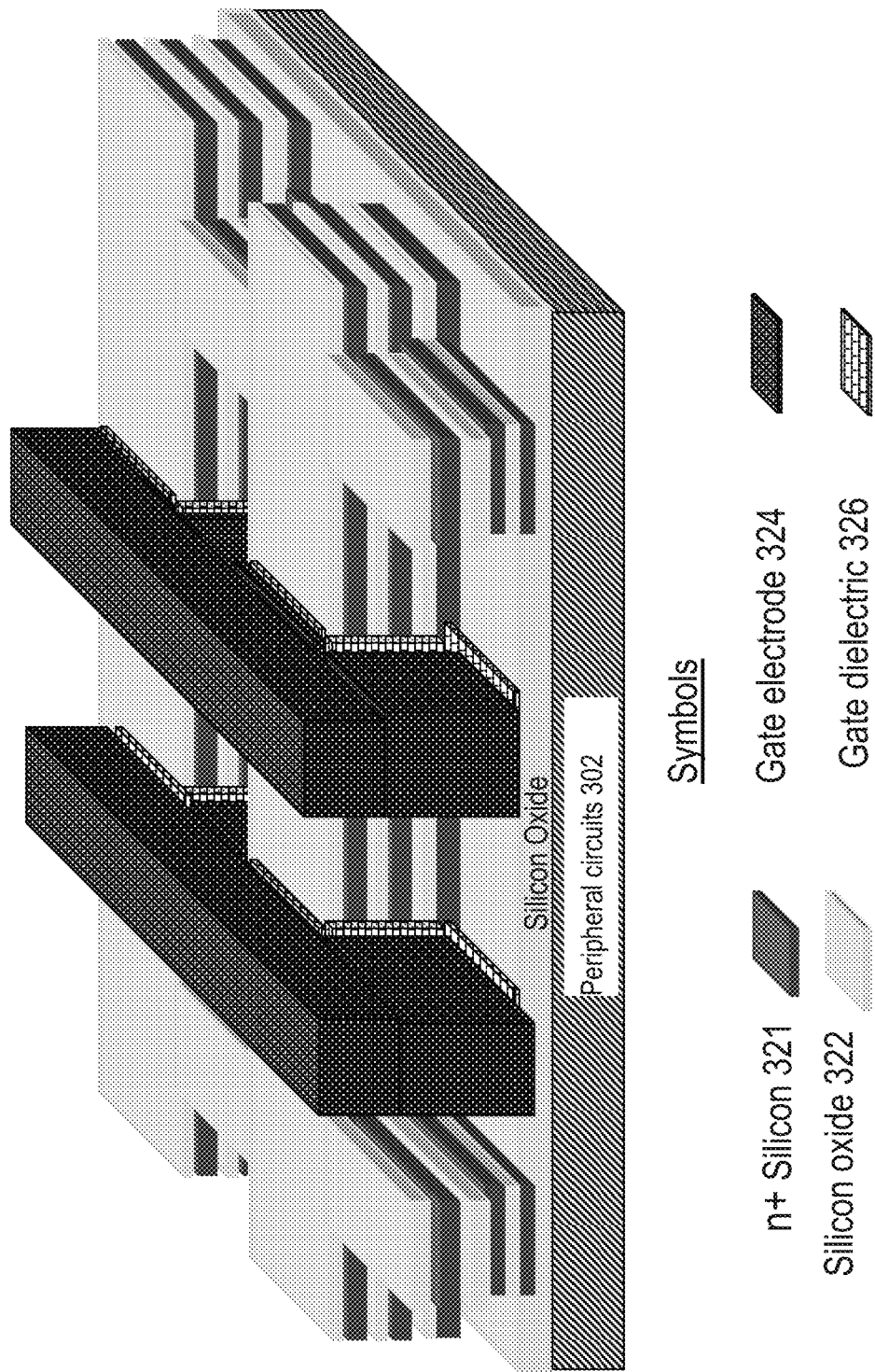

Step (F): FIG. 3F illustrates the structure after Step (F). Gate dielectric 326 and gate electrode 324 are then deposited following which a CMP is performed to planarize the gate electrode 324 regions. Lithography and etch are utilized to define gate regions.

Figure 3G:
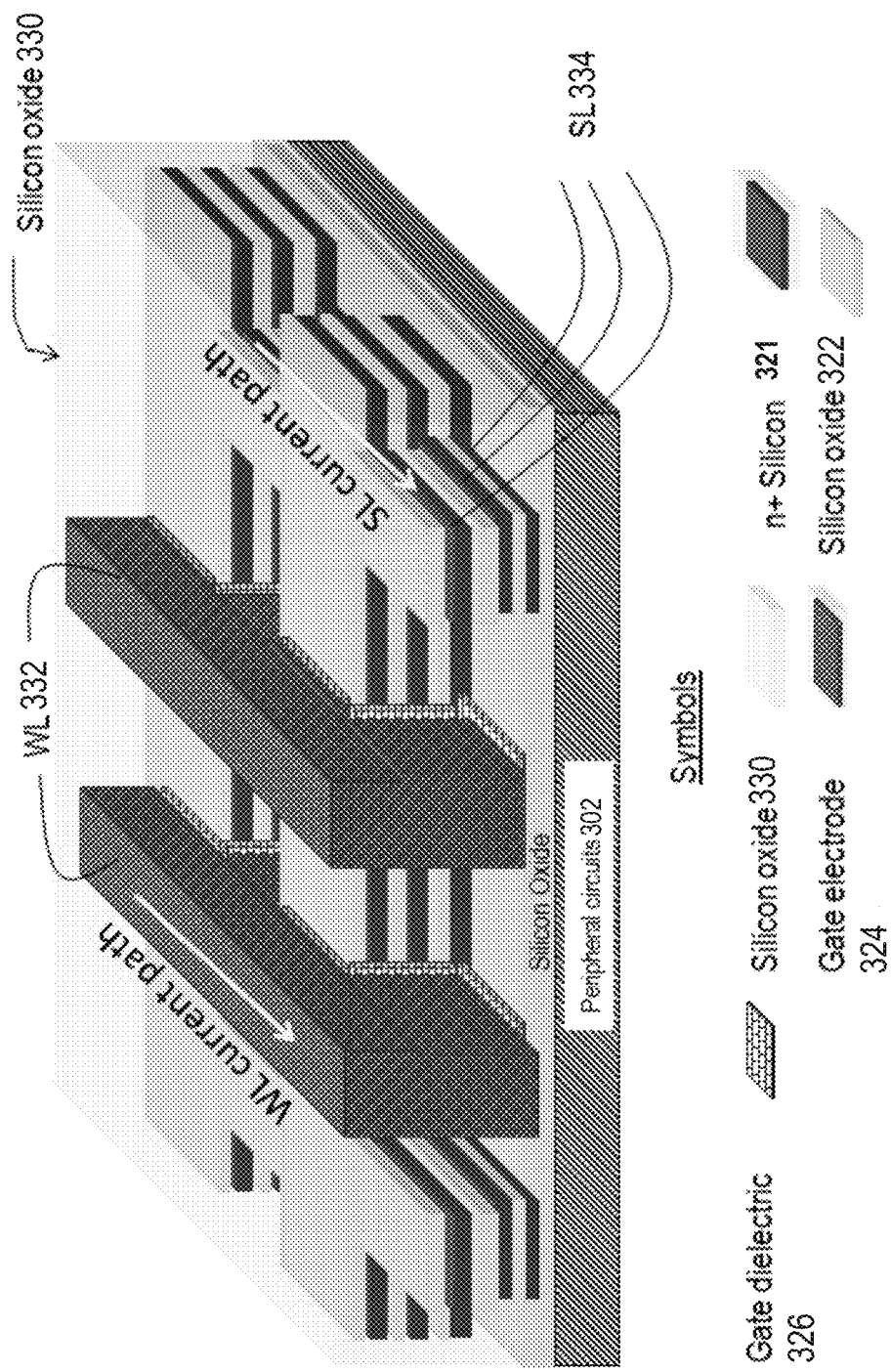

Step (G): FIG. 3G illustrates the structure after Step (G). A silicon oxide layer 330 is then deposited and planarized. The silicon oxide layer is shown transparent in the figure for clarity, along with word-line (WL) 332 and source-line (SL) 334 regions.

Figure 3H:
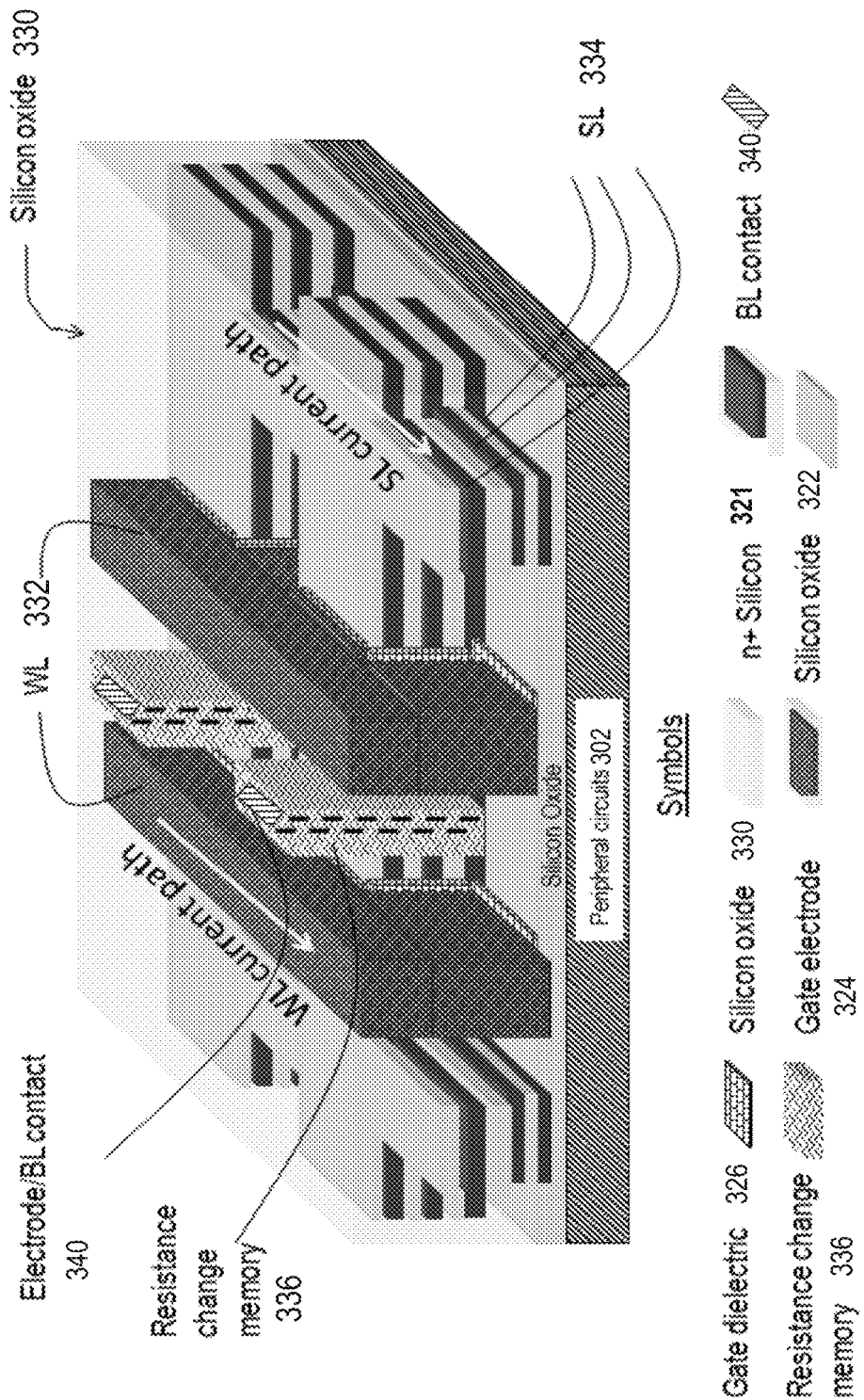

Step (H): FIG. 3H illustrates the structure after Step (H). Vias are etched through multiple layers of silicon and silicon dioxide as shown in the figure. A resistance change memory material 336 is then deposited (preferably with atomic layer deposition (ALD)). Examples of such a material include hafnium oxide, well known to change resistance by applying voltage. An electrode for the resistance change memory element is then deposited (preferably using ALD) and is shown as electrode/BL contact 340. A CMP process is then conducted to planarize the surface. It can be observed that multiple resistance change memory elements in series with junctionless transistors are created after this step.

Figure 3I:
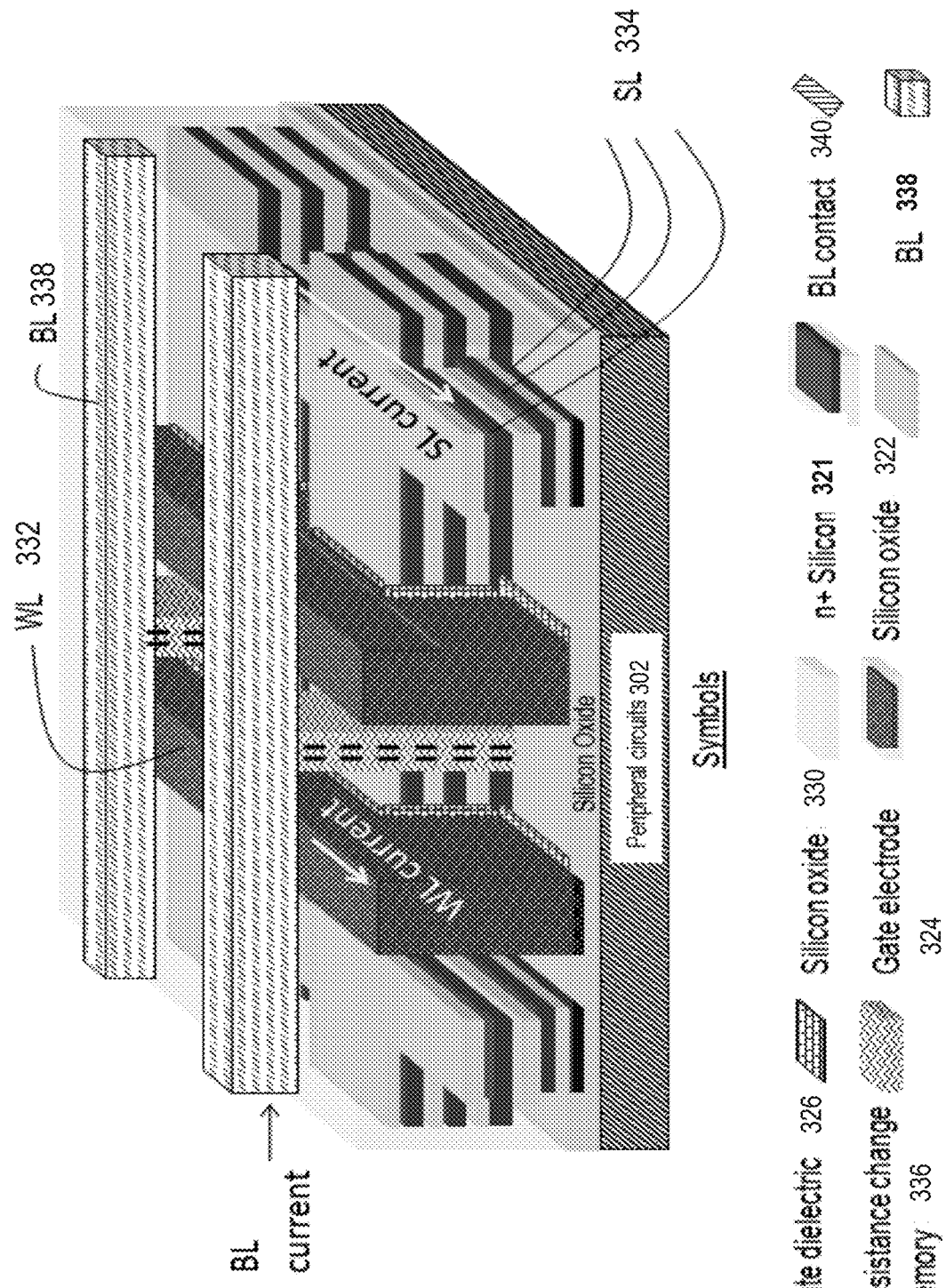

Step (I): FIG. 3I illustrates the structure after Step (I). BLs 338 are then constructed. Contacts are made to BLs, WLs and SLs of the memory array at its edges. SL contacts can be made into stair-like structures using techniques described in in "Bit Cost Scalable Technology with Punch and Plug Process for Ultra High Density Flash Memory," *VLSI Technology*, 2007 *IEEE Symposium on*, vol., no., pp. 14-15, 12-14 Jun. 2007 by Tanaka, H.; Kido, M.; Yahashi, K.; Oomura, M.; et al., following which contacts can be constructed to them. Formation of stair-like structures for SLs could be achieved in steps prior to Step (I) as well.

Figure 3J:
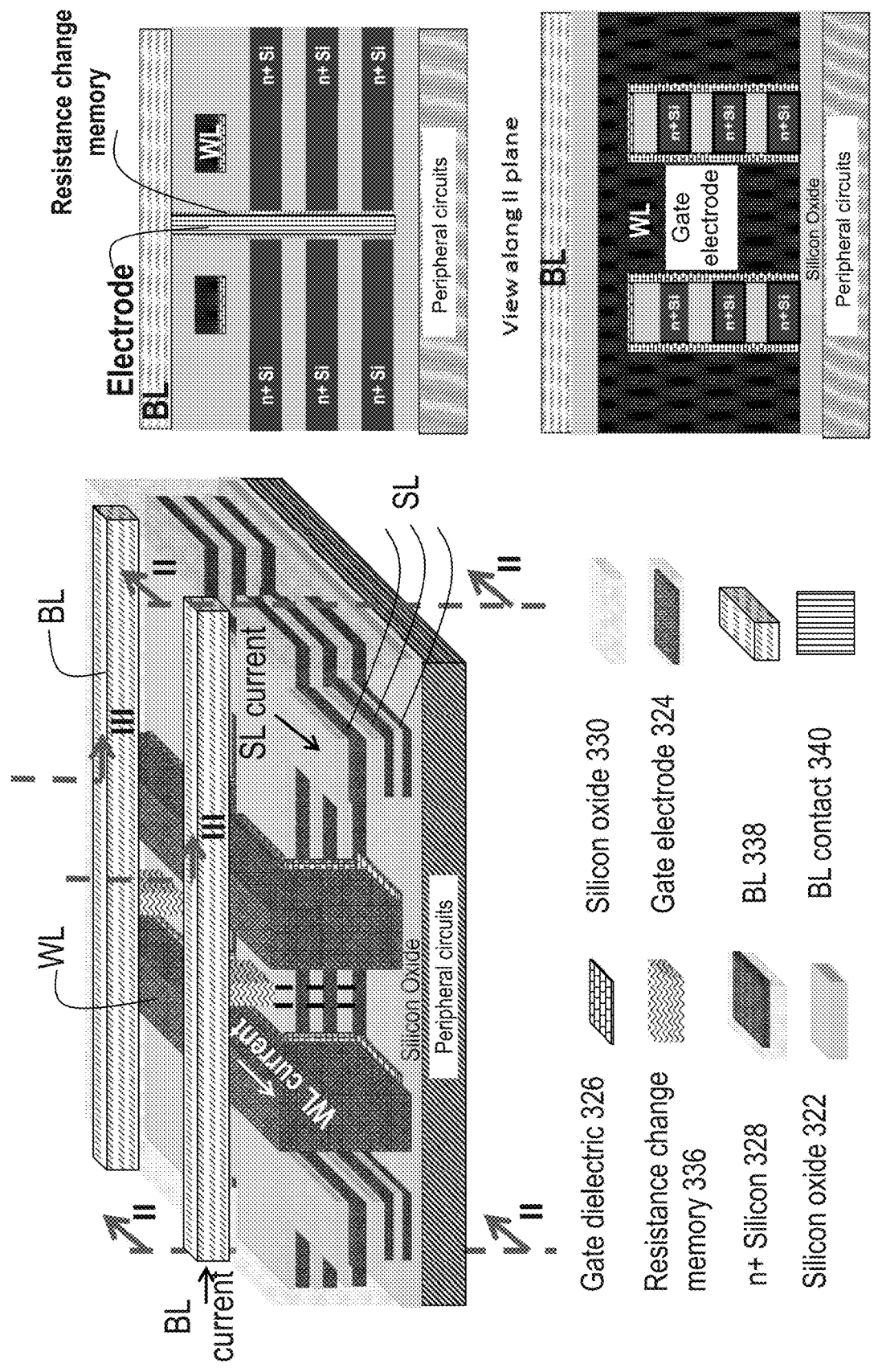

FIG. 3J shows cross-sectional views of the array for clarity. A 3D resistance change memory has thus been constructed, with (1) horizontally-oriented transistors—i.e. current flowing in substantially the horizontal direction in transistor channels, (2) some of the memory cell control lines, e.g., source-lines SL, constructed of heavily doped silicon and embedded in the memory cell layer, (3) side gates that are simultaneously deposited over multiple memory layers for transistors, and (4) monocrystalline (or single-crystal) silicon layers obtained by layer transfer techniques such as ion-cut.

FIGS. 4A-4K describe an alternative process flow to construct a horizontally-oriented monolithic 3D resistive memory array. This embodiment has a resistance-based memory element in series with a transistor selector. No mask is utilized on a "per-memory-layer" basis for the monolithic 3D resistance change memory (or resistive memory) concept shown in FIGS. 4A-4K, and all other masks are shared between different layers. The process flow may include several steps as described in the following sequence.

Figure 4A:
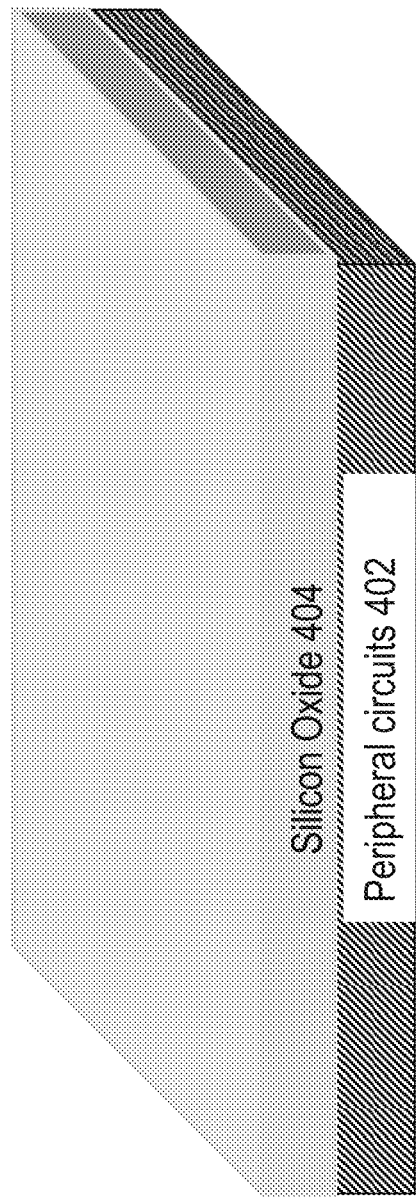

Step (A): Peripheral circuits with tungsten wiring 402 are first constructed and above this a layer of silicon dioxide 404 is deposited. FIG. 4A shows a drawing illustration after Step (A).

Figure 4B:
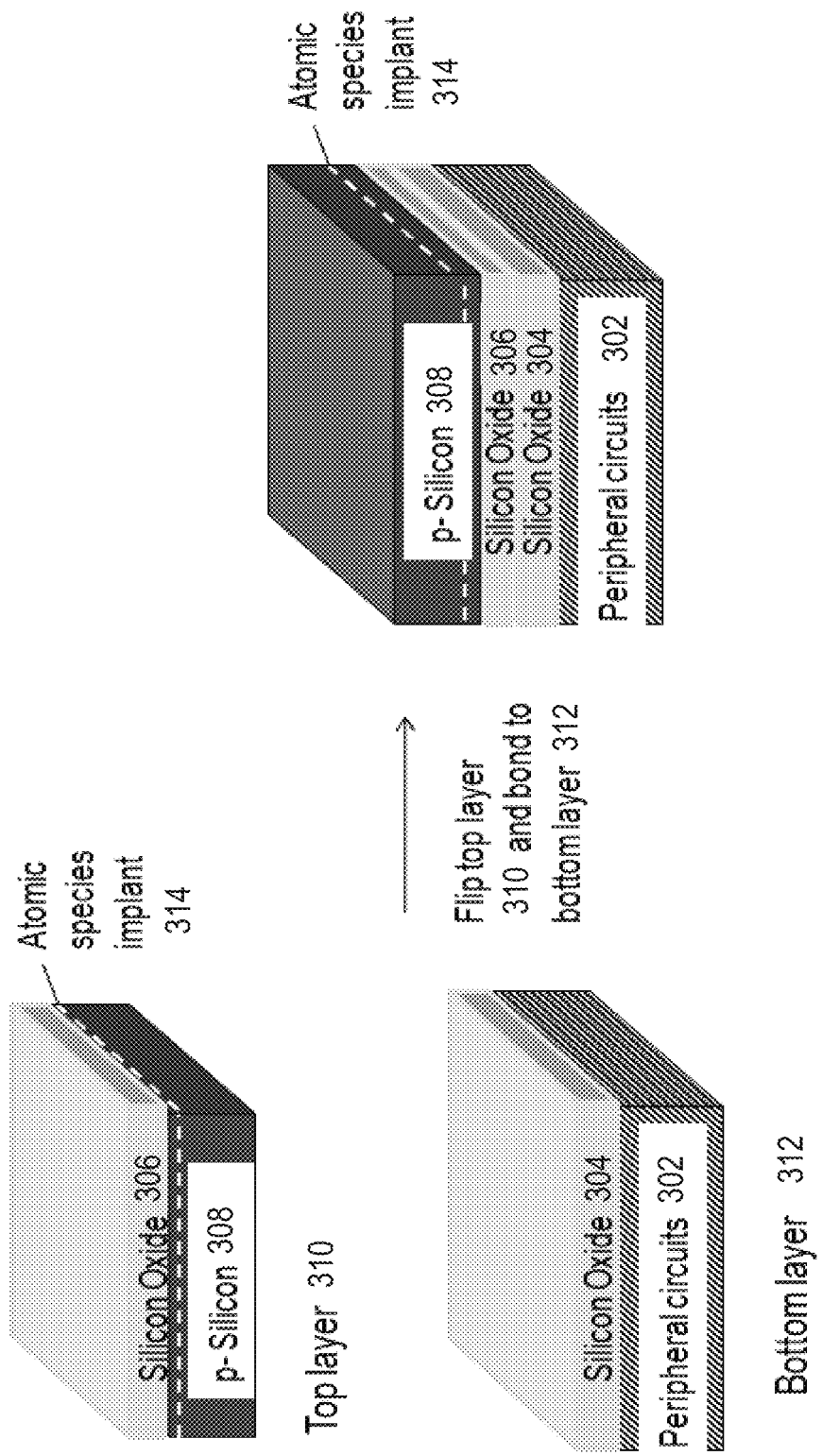

Step (B): FIG. 4B illustrates the structure after Step (B). A wafer of p– Silicon 408 has an oxide layer 406 grown or deposited above it. Following this, hydrogen is implanted into the p– Silicon wafer at a certain depth indicated by 414. Alternatively, some other atomic species such as Helium could be (co-)implanted. This hydrogen implanted p– Silicon wafer 408 forms the top layer 410. The bottom layer 412 may include the peripheral circuits 402 with oxide layer 404. The top layer 410 is flipped and bonded to the bottom layer 412 using oxide-to-oxide bonding.

Figure 4C:
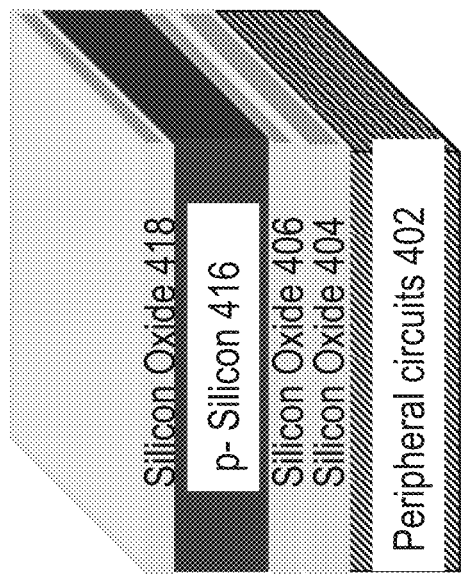

Step (C): FIG. 4C illustrates the structure after Step (C). The stack of top and bottom wafers after Step (B) is cleaved at the hydrogen plane 414 using either a anneal or a sideways mechanical force or other means. A CMP process is then conducted. A layer of silicon oxide 418 is then deposited atop the p– Silicon layer 416. At the end of this step, a single-crystal p– Si layer 416 exists atop the peripheral circuits, and this has been achieved using layer-transfer techniques.

Figure 4D:
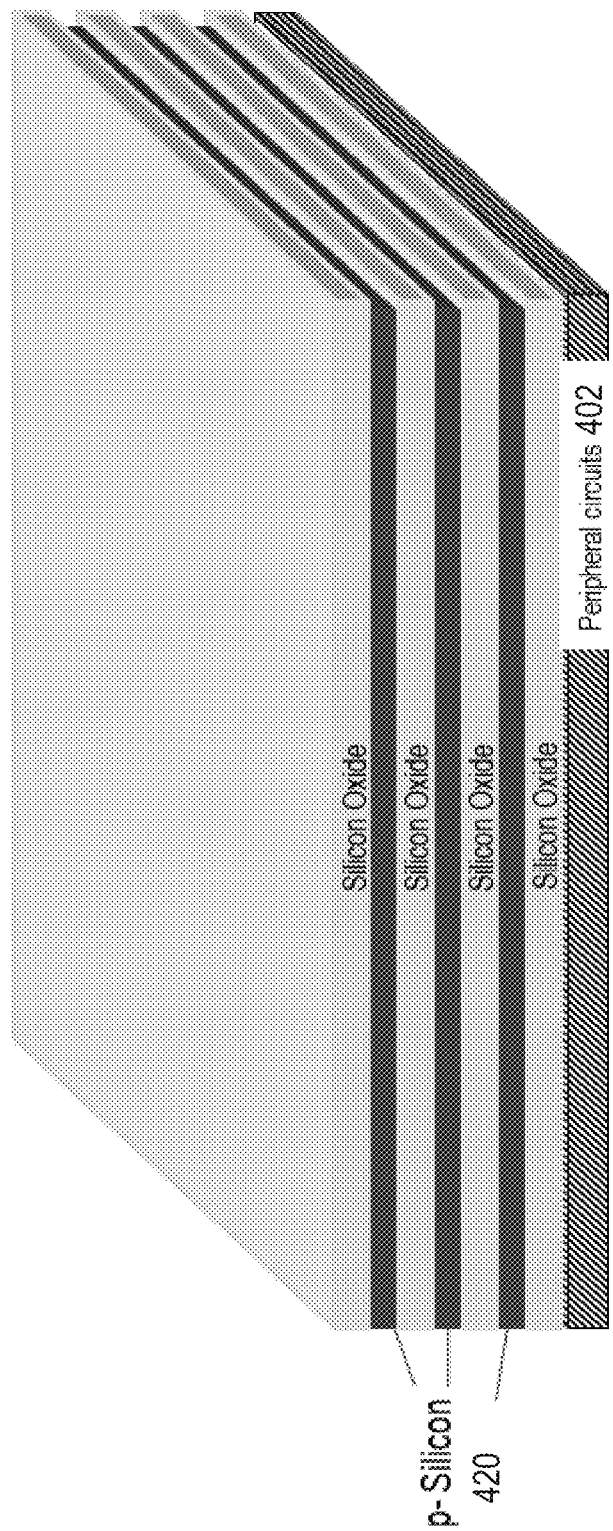

Step (D): FIG. 4D illustrates the structure after Step (D). Using methods similar to Step (B) and (C), multiple p– silicon layers 420 are formed with silicon oxide layers in between.

Figure 4E:
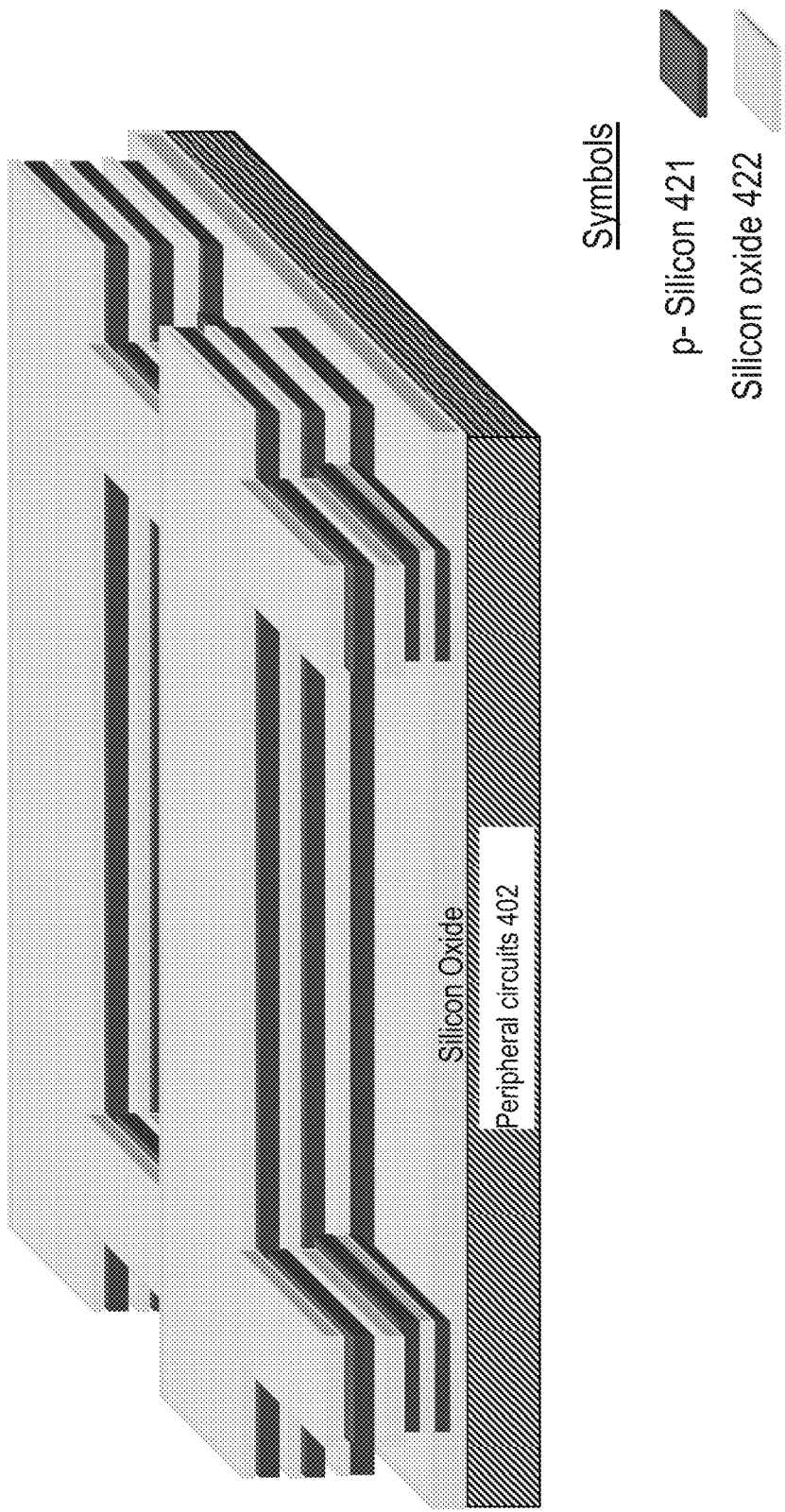

Step (E): FIG. 4E illustrates the structure after Step (E). Lithography and etch processes are then utilized to make a structure as shown in the figure, including layer regions of p– silicon 421 and associated bonding/isolation oxide 422.

Figure 4F:
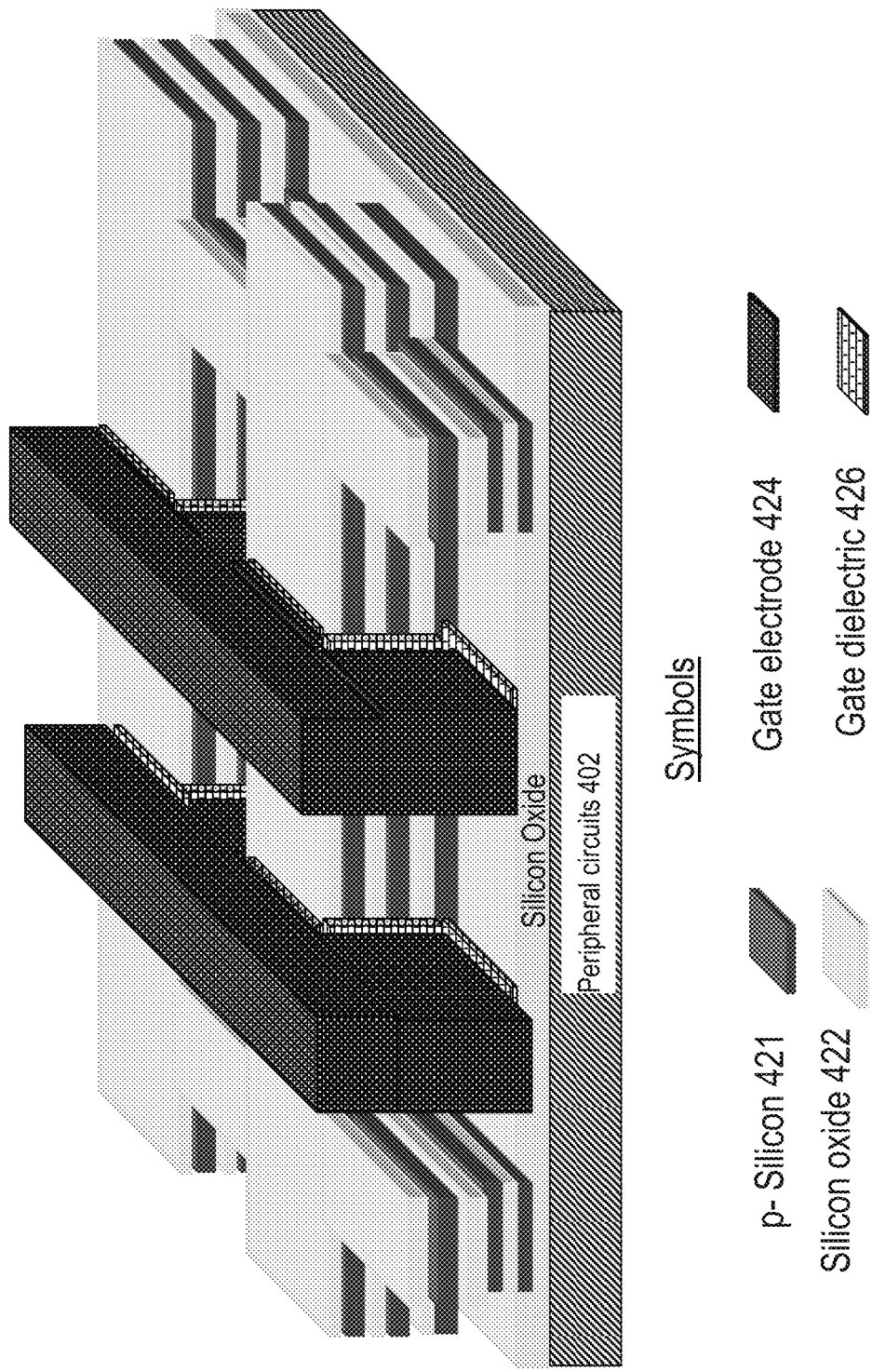

Step (F): FIG. 4F illustrates the structure on after Step (F). Gate dielectric 426 and gate electrode 424 are then deposited following which a CMP is done to planarize the gate electrode 424 regions. Lithography and etch are utilized to define gate regions.

Figure 4G:
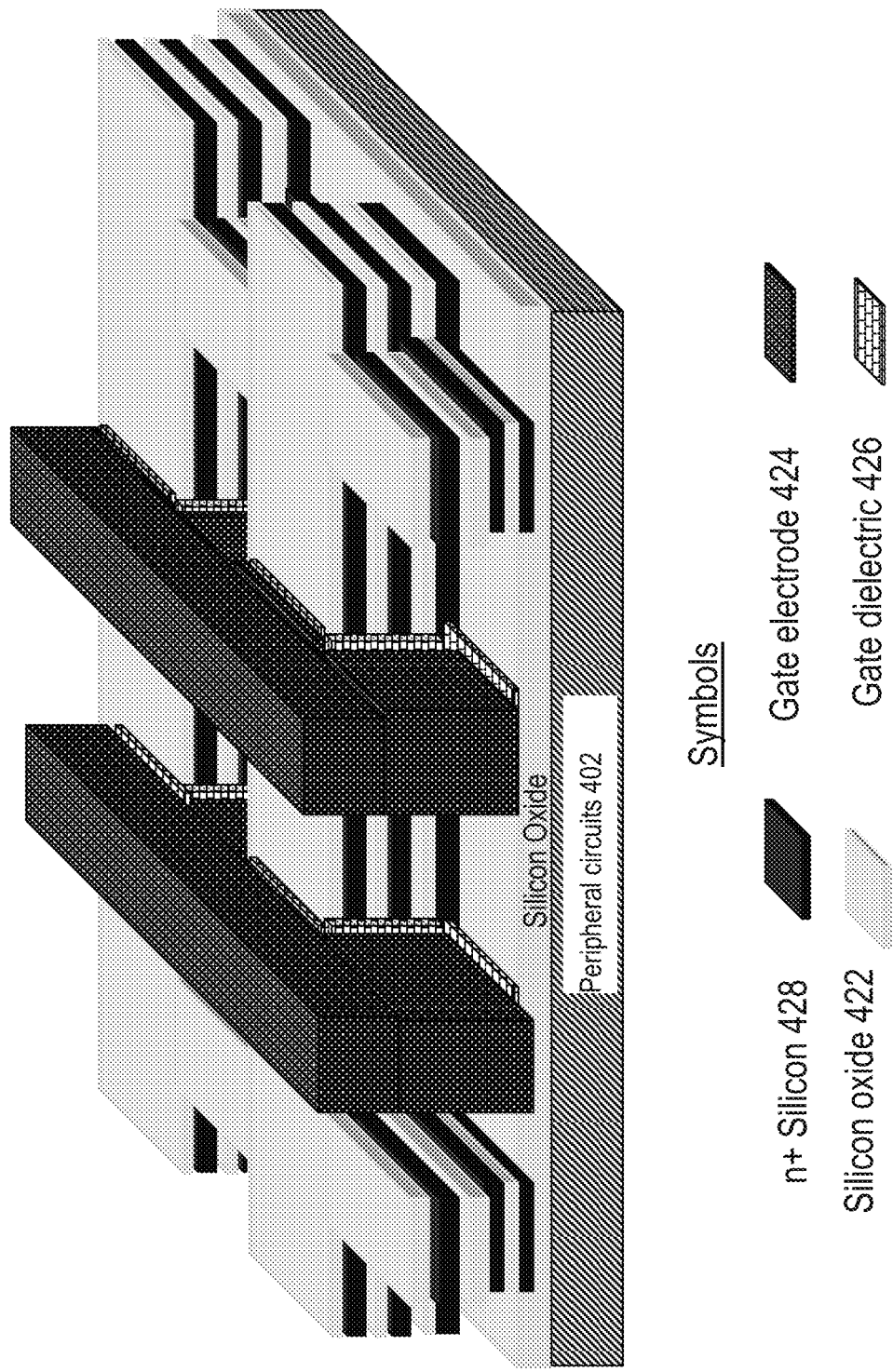

Step (G): FIG. 4G illustrates the structure after Step (G). Using the hard mask defined in Step (F), p– regions not covered by the gate are implanted to form n+ silicon regions 428. Spacers are utilized during this multi-step implantation process and layers of silicon present in different layers of the stack have different spacer widths to account for lateral straggle of buried layer implants. Bottom layers could have larger spacer widths than top layers. A thermal annealing step, such as a RTA or spike anneal or laser anneal or flash anneal, is then conducted to activate n+ doped regions.

Figure 4H:
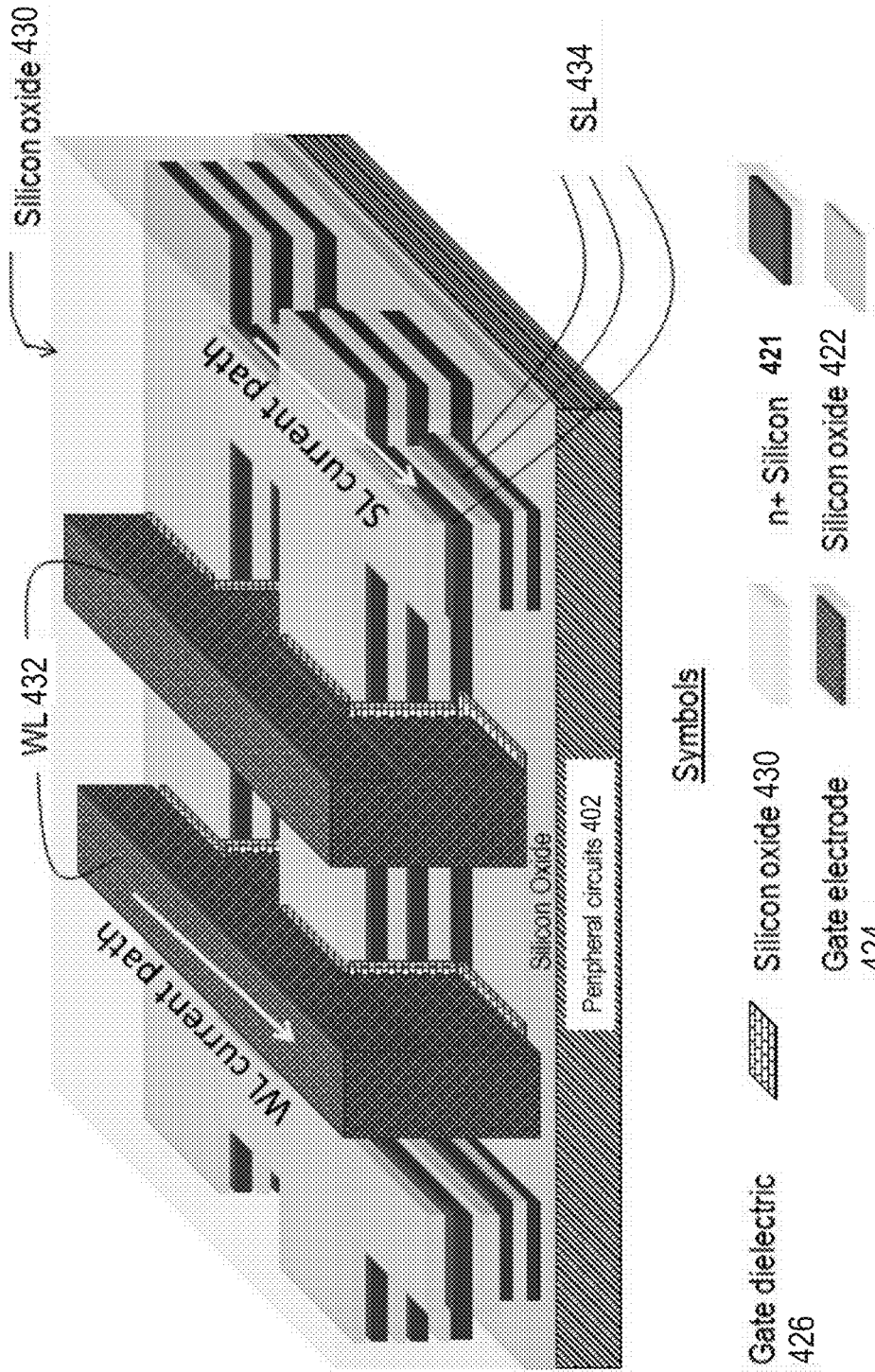
Figure 41:
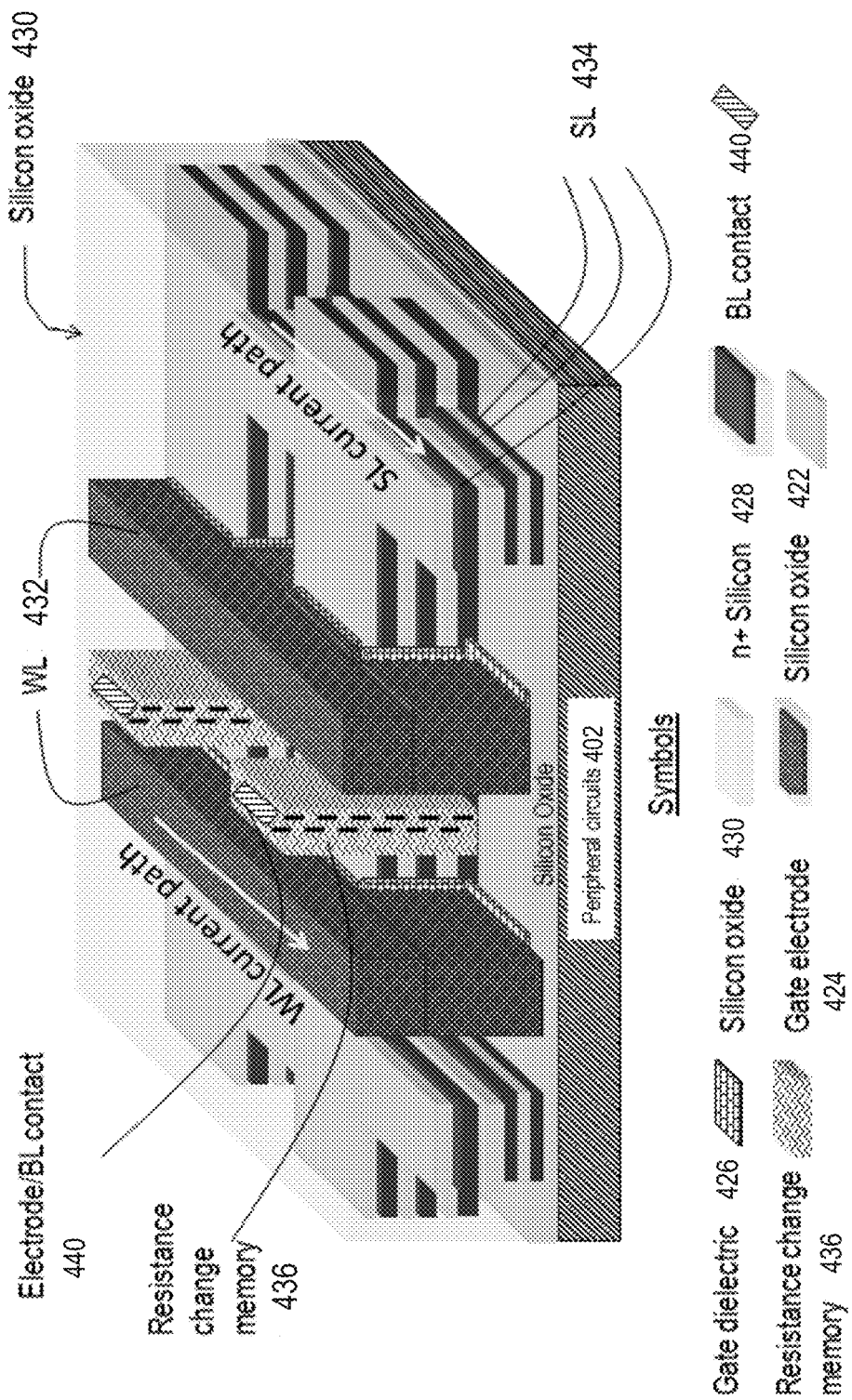

Step (H): FIG. 4H illustrates the structure after Step (H). A silicon oxide layer 430 is then deposited and planarized. The silicon oxide layer is shown transparent in the figure for clarity, along with word-line (WL) 432 and source-line (SL) 434 regions.

Step (I): FIG. 4I illustrates the structure after Step (I). Vias are etched through multiple layers of silicon and silicon dioxide as shown in the figure. A resistance change memory material 436 is then deposited (preferably with atomic layer deposition (ALD)). Examples of such a material include hafnium oxide, which is well known to change resistance by applying voltage. An electrode for the resistance change memory element is then deposited (preferably using ALD) and is shown as electrode/BL contact 440. A CMP process is then conducted to planarize the surface. It can be observed that multiple resistance change memory elements in series with transistors are created after this step.

Figure 4J:
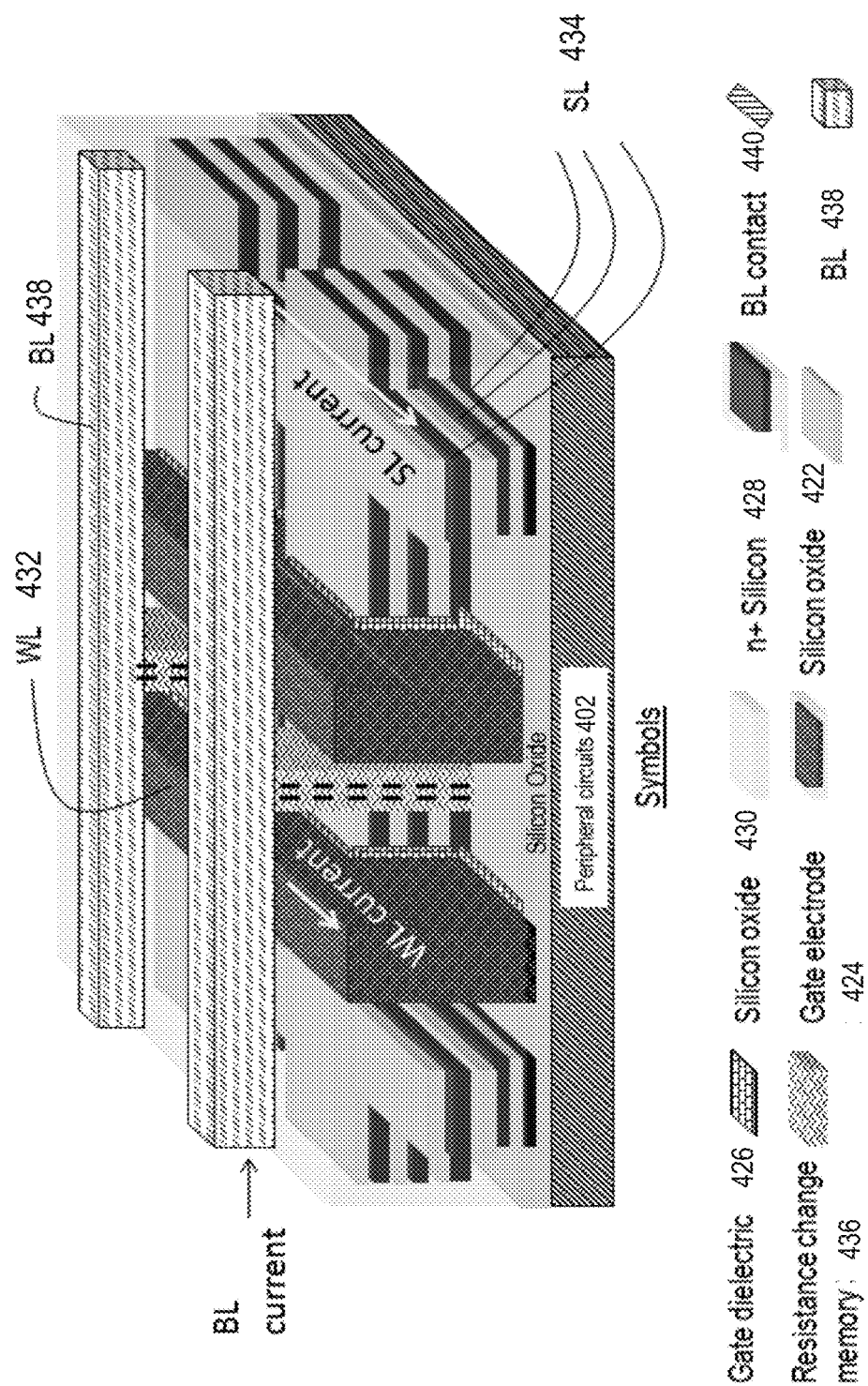

Step (J): FIG. 4J illustrates the structure after Step (J). BLs 438 are then constructed. Contacts are made to BLs, WLs and SLs of the memory array at its edges. SL contacts can be made into stair-like structures using techniques described in "Bit Cost Scalable Technology with Punch and Plug Process for Ultra High Density Flash Memory," *VLSI Technology, 2007 IEEE Symposium on*, vol., no., pp. 14-15, 12-14 Jun. 2007 by Tanaka, H.; Kido, M.; Yahashi, K.; Oomura, M.; et al., following which contacts can be constructed to them. Formation of stair-like structures for SLs could be done in steps prior to Step (I) as well.

Figure 4K:
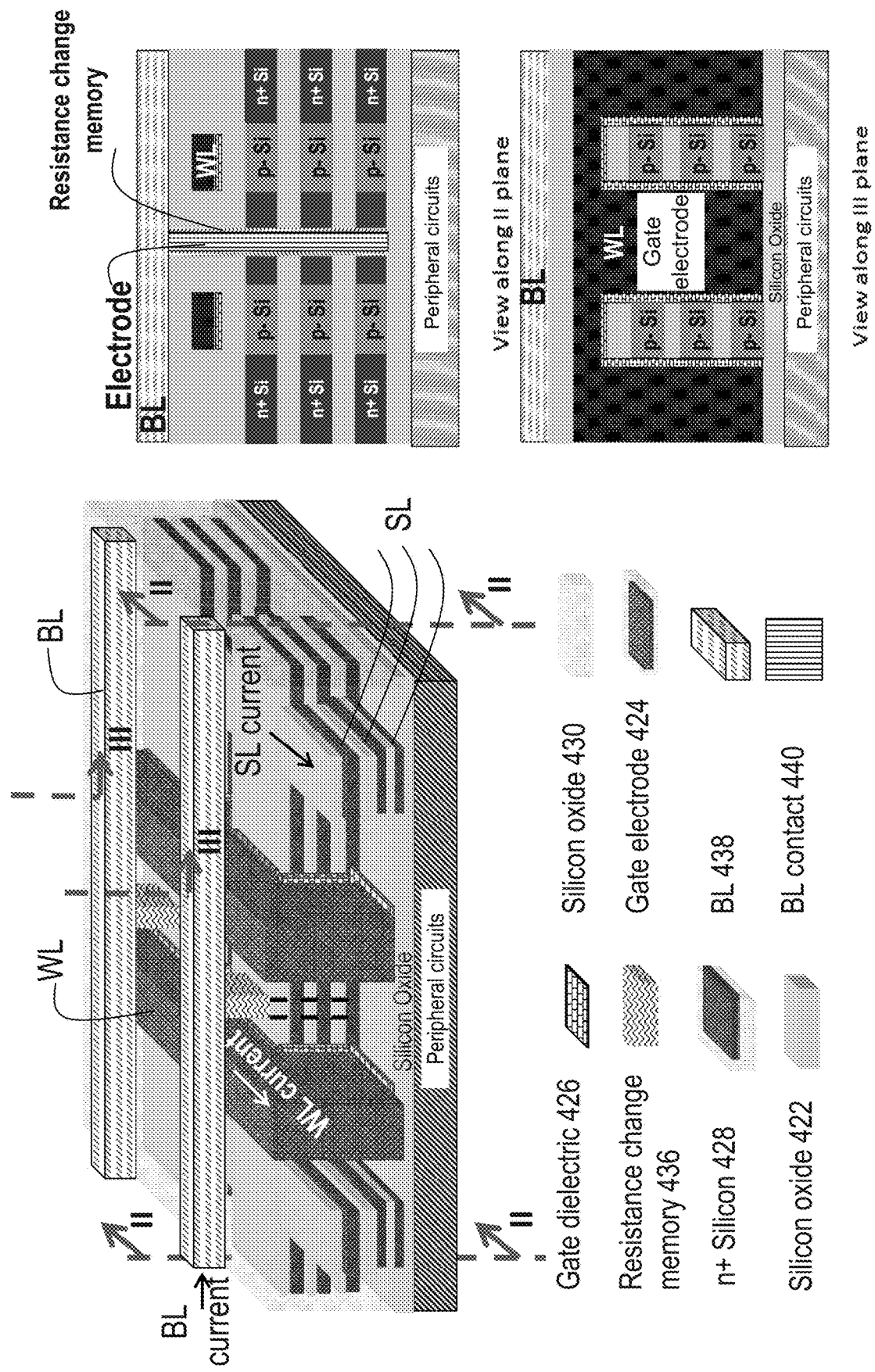

FIG. 4K shows cross-sectional views of the array for clarity. A 3D resistance change memory has thus been constructed, with (1) horizontally-oriented transistors—i.e. current flowing in substantially the horizontal direction in transistor channels, (2) some of the memory cell control lines—e.g., source-lines SL, constructed of heavily doped silicon and embedded in the memory cell layer, (3) side gates simultaneously deposited over multiple memory layers for transistors, and (4) monocrystalline (or single-crystal) silicon layers obtained by layer transfer techniques such as ion-cut.

While explanations have been given for formation of monolithic 3D resistive memories with ion-cut in this section, it is clear to one skilled in the art that alternative implementations are possible. BL and SL nomenclature has been used for two terminals of the 3D resistive memory array, and this nomenclature can be interchanged. Moreover, selective epi technology or laser recrystallization technology could be utilized for implementing structures shown in FIG. 3A-3J and FIG. 4A-4K. Various other types of layer transfer schemes that have been described in Section 1.3.4 of the parent application can be utilized for construction of various 3D resistive memory structures. One could also use buried wiring, i.e. where wiring for memory arrays is below the memory layers but above the periphery. Other variations of the monolithic 3D resistive memory concepts are possible.

While resistive memories described previously form a class of non-volatile memory, others classes of non-volatile memory exist. NAND flash memory forms one of the most common non-volatile memory types. It can be constructed of two main types of devices: floating-gate devices where charge is stored in a floating gate and charge-trap devices where charge is stored in a charge-trap layer such as Silicon Nitride. Background information on charge-trap memory can be found in "*Integrated Interconnect Technologies for 3D Nanoelectronic Systems*", Artech House, 2009 by Bakir and Meindl ("Bakir") and "A Highly Scalable 8-Layer 3D Vertical-Gate (VG) TFT NAND Flash Using Junction-Free Buried Channel BE-SONOS Device," Symposium on VLSI Technology, 2010 by Hang-Ting Lue, et al. The architectures shown in FIG. 5A-5G are relevant for any type of charge-trap memory.

FIGS. 5A-5G describes a memory architecture for single-crystal 3D charge-trap memories, and a procedure for its construction. It utilizes junction-less transistors. No mask is utilized on a "per-memory-layer" basis for the monolithic 3D charge-trap memory concept shown in FIG. 5A-5G, and all other masks are shared between different layers. The process flow may include several steps as described in the following sequence.

Figure 5A:
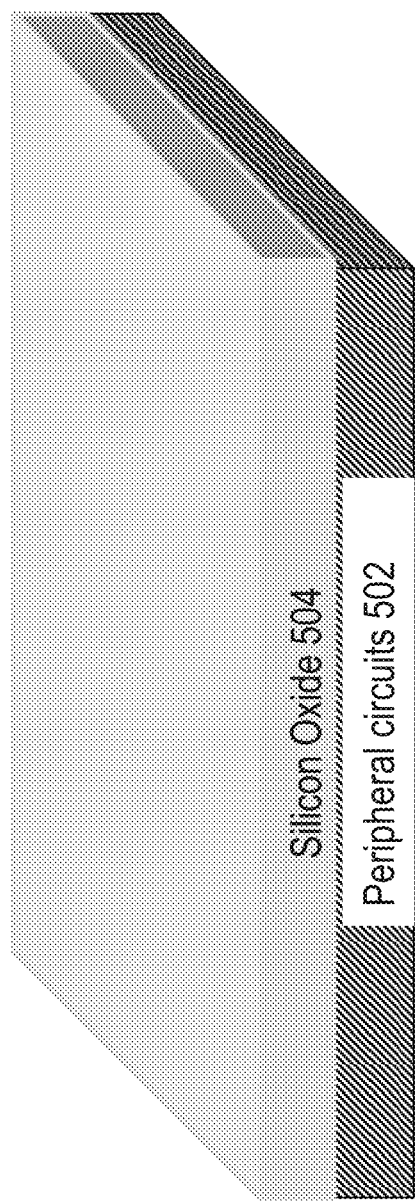
FIGS. 5A-5G show a zero-mask per layer 3D charge-trap memory.

Step (A): Peripheral circuits 502 are first constructed and above this a layer of silicon dioxide 504 is deposited. FIG. 5A shows a drawing illustration after Step (A).

Figure 5B:
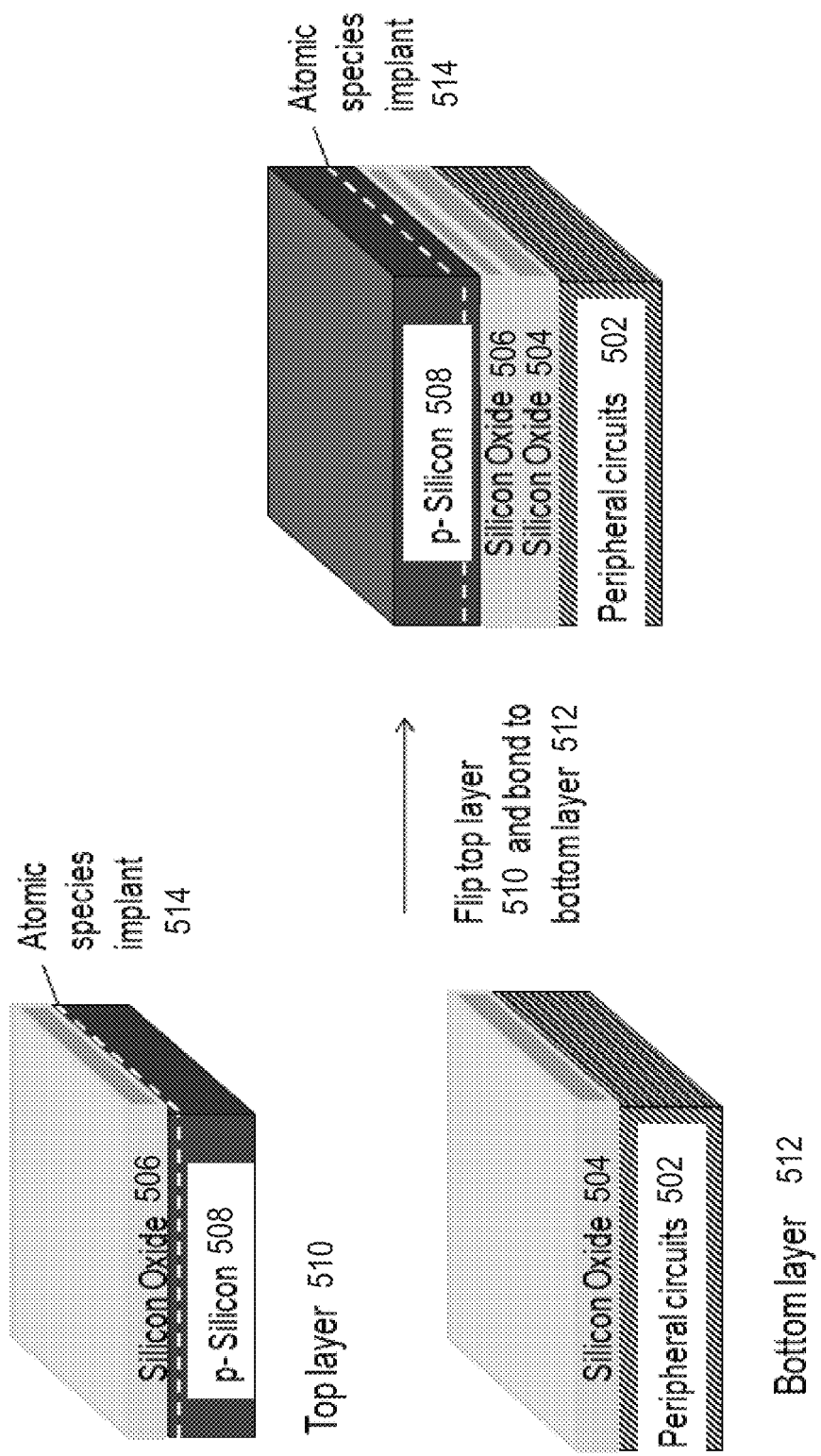

Step (B): FIG. 5B illustrates the structure after Step (B). A wafer of n+ Silicon 508 has an oxide layer 506 grown or deposited above it. Following this, hydrogen is implanted into the n+ Silicon wafer at a certain depth indicated by 514. Alternatively, some other atomic species such as Helium could be implanted. This hydrogen implanted n+ Silicon wafer 508 forms the top layer 510. The bottom layer 512 may include the peripheral circuits 502 with oxide layer 504. The top layer 510 is flipped and bonded to the bottom layer 512 using oxide-to-oxide bonding.

Figure 5C:
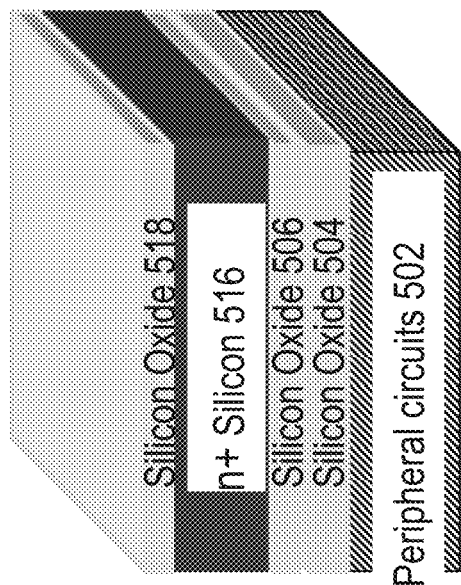

Step (C): FIG. 5C illustrates the structure after Step (C). The stack of top and bottom wafers after Step (B) is cleaved at the hydrogen plane 514 using either a anneal or a sideways mechanical force or other means. A CMP process is then conducted. A layer of silicon oxide 518 is then deposited atop the n+ Silicon layer 516. At the end of this step, a single-crystal n+ Si layer 516 exists atop the peripheral circuits, and this has been achieved using layer-transfer techniques.

Figure 5D:
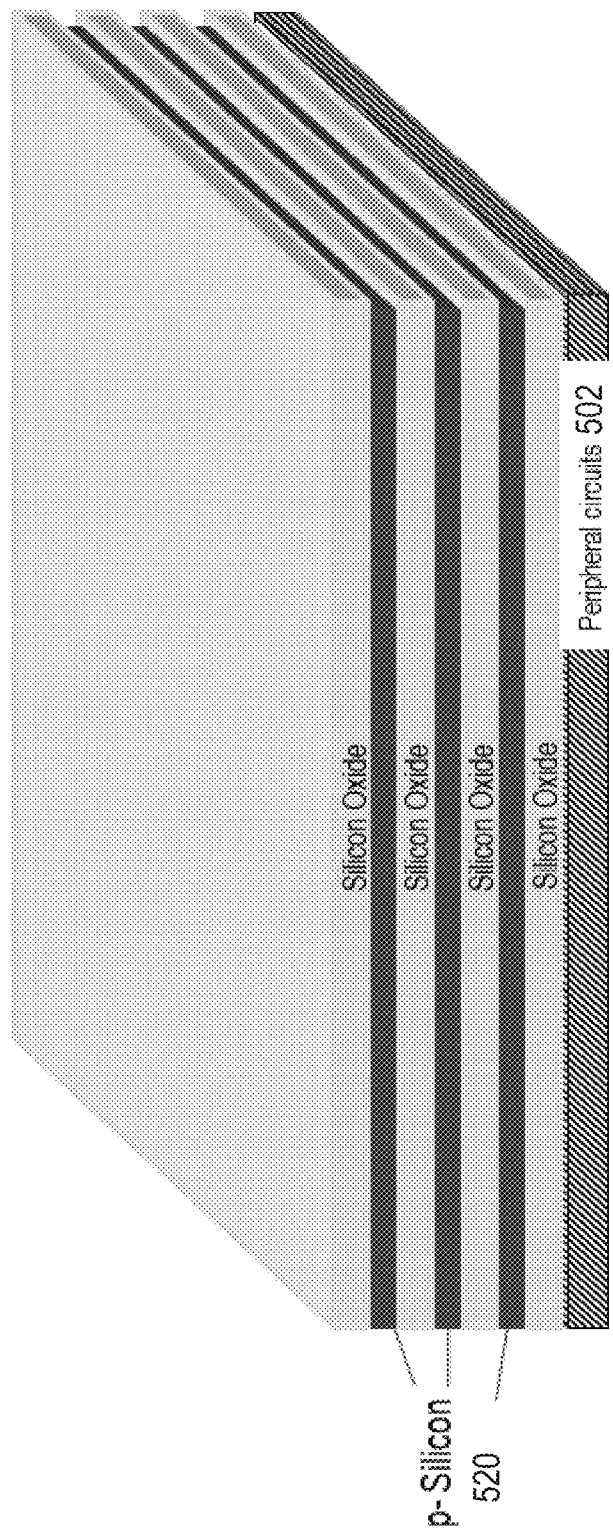

Step (D): FIG. 5D illustrates the structure after Step (D). Using methods similar to Step (B) and (C), multiple n+ silicon layers 520 are formed with silicon oxide layers in between.

Figure 5E:
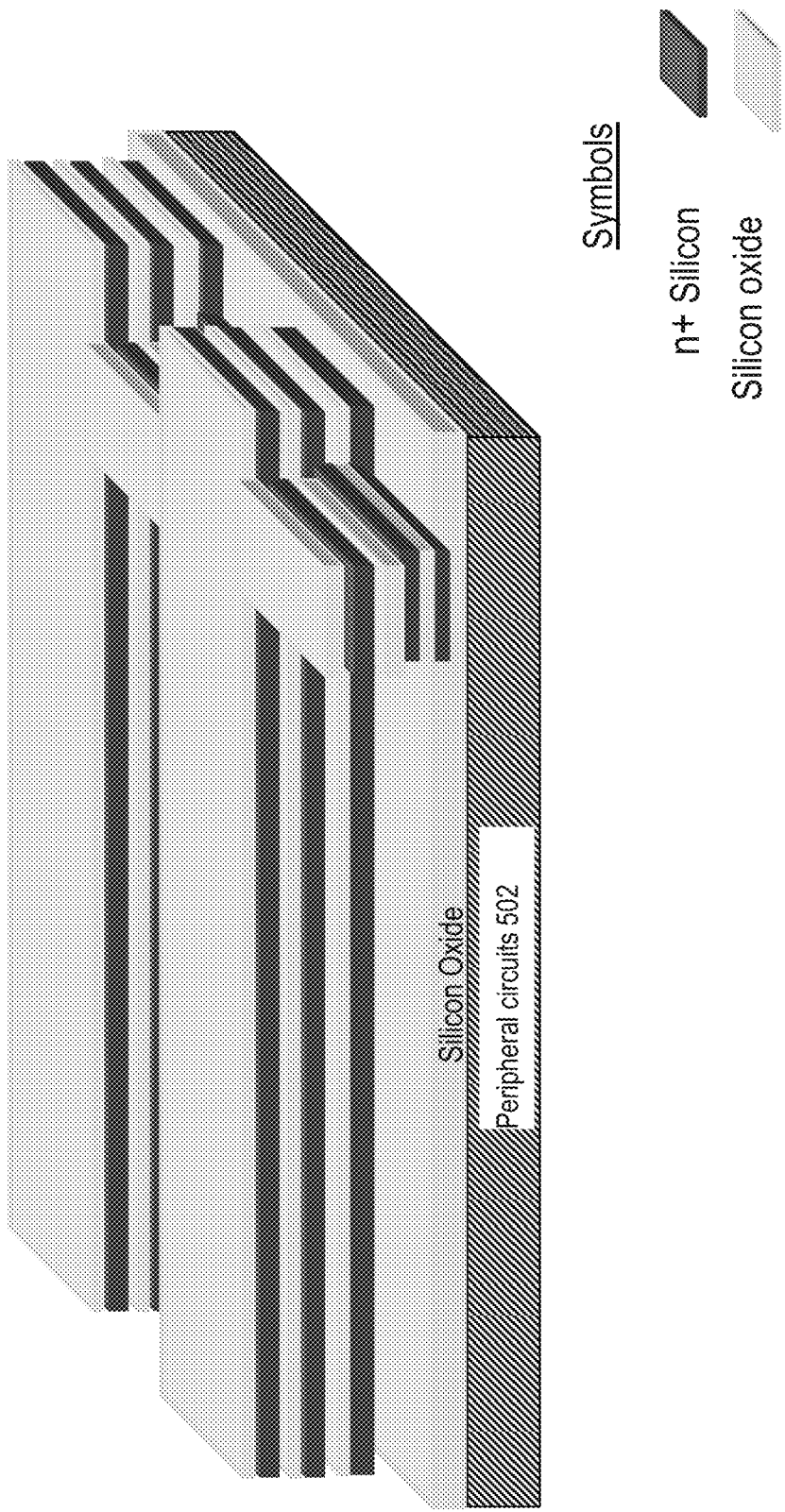

Step (E): FIG. 5E illustrates the structure after Step (E). Lithography and etch processes are then utilized to make a structure as shown in the figure.

Figure 5F:
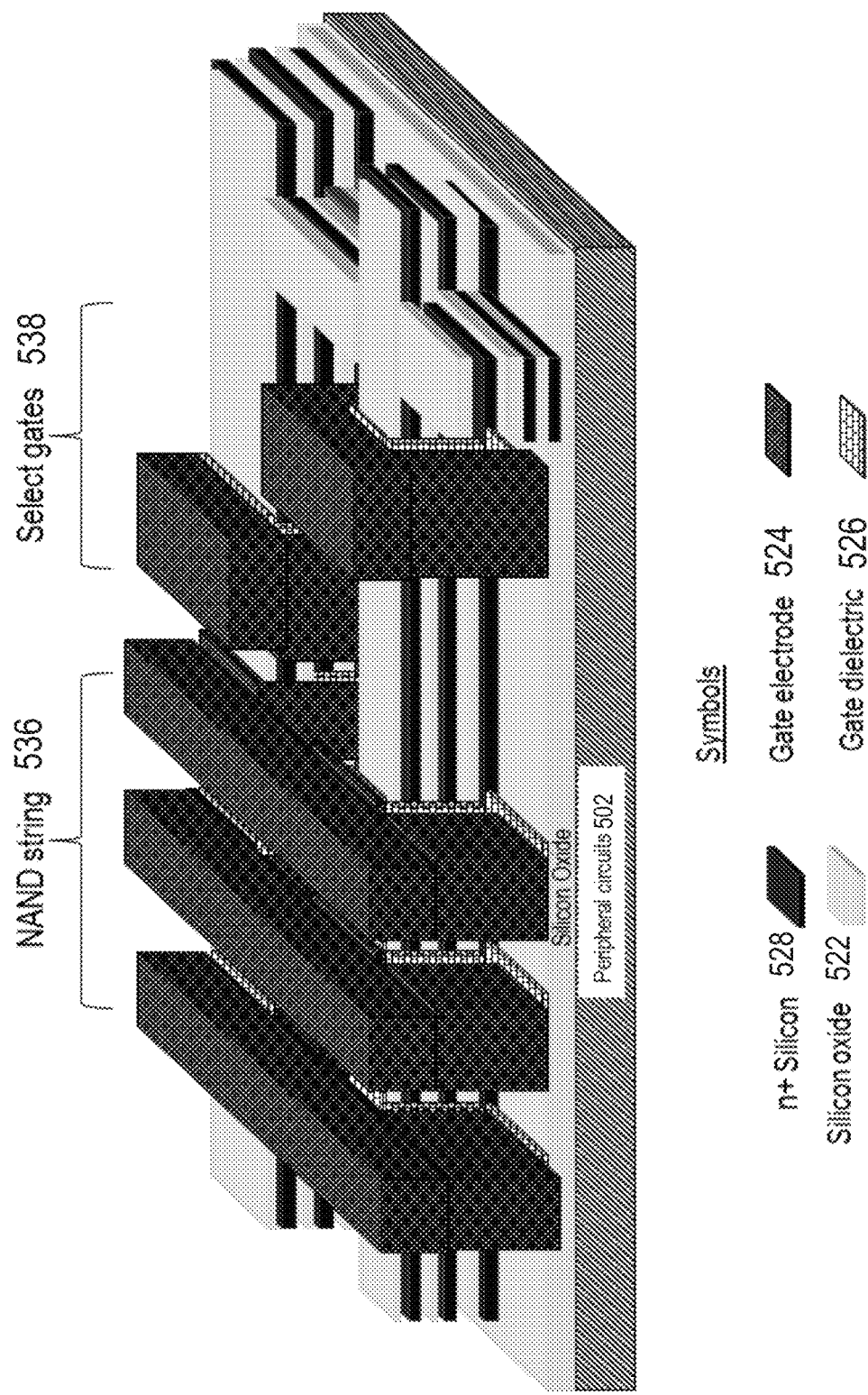

Step (F): FIG. 5F illustrates the structure after Step (F). Gate dielectric 526 and gate electrode 524 are then deposited following which a CMP is done to planarize the gate electrode 524 regions. Lithography and etch are utilized to define gate regions. Gates of the NAND string 536 as well gates of select gates of the NAND string 538 are defined.

Figure 5G:
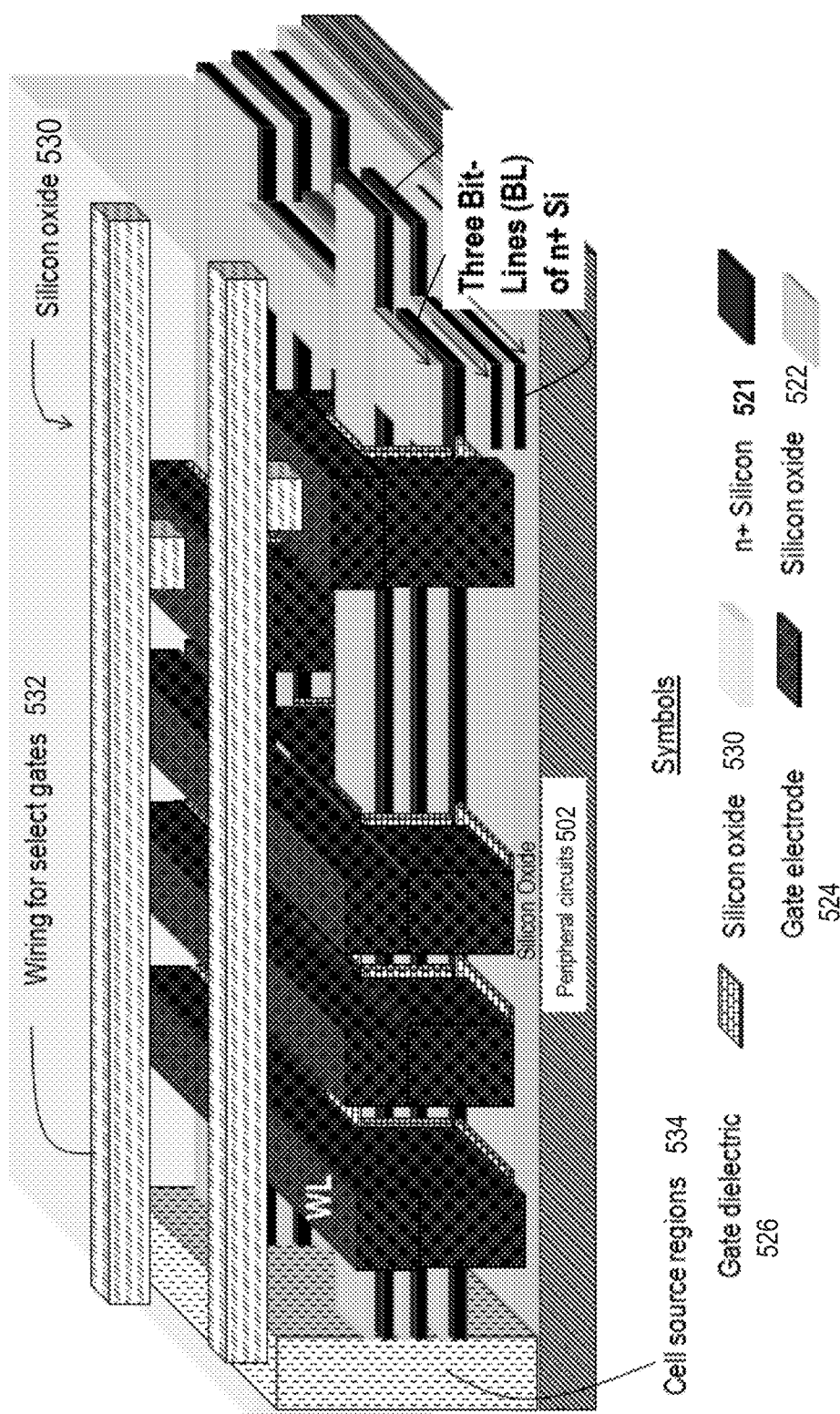

Step (G): FIG. 5G illustrates the structure after Step (G). A silicon oxide layer 530 is then deposited and planarized. It is shown transparent in the figure for clarity. Word-lines, bit-lines and source-lines are defined as shown in the figure. Contacts are formed to various regions/wires at the edges of the array as well. SL contacts can be made into stair-like structures using techniques described in "Bit Cost Scalable Technology with Punch and Plug Process for Ultra High Density Flash Memory," *VLSI Technology*, 2007 *IEEE Symposium on*, vol., no., pp. 14-15, 12-14 Jun. 2007 by Tanaka, H.; Kido, M.; Yahashi, K.; Oomura, M.; et al., following which contacts can be constructed to them. Formation of stair-like structures for SLs could be performed in steps prior to Step (G) as well.

A 3D charge-trap memory has thus been constructed, with (1) horizontally-oriented transistors—i.e. current flowing in substantially the horizontal direction in transistor channels, (2) some of the memory cell control lines—e.g., bit lines BL, constructed of heavily doped silicon and embedded in the memory cell layer, (3) side gates simultaneously deposited over multiple memory layers for transistors, and (4) monocrystalline (or single-crystal) silicon layers obtained by layer transfer techniques such as ion-cut. This use of single-crystal silicon obtained with ion-cut is a key differentiator from past work on 3D charge-trap memories such as "A Highly Scalable 8-Layer 3D Vertical-Gate (VG) TFT NAND Flash Using Junction-Free Buried Channel BE-SONOS Device," Symposium on VLSI Technology, 2010 by Hang-Ting Lue, et al. that used polysilicon.

While FIGS. 5A-5G give two examples of how single-crystal silicon layers with ion-cut can be used to produce 3D charge-trap memories, the ion-cut technique for 3D charge-trap memory is fairly general. It could be utilized to produce any horizontally-oriented 3D monocrystalline-silicon charge-trap memory.

While the 3D DRAM and 3D resistive memory implementations in Section 3 and Section 4 have been described with single crystal silicon constructed with ion-cut technology, other options exist. One could construct them with selective epi technology. Procedures for doing these will be clear to those skilled in the art.

FIGS. 6A-6B show it is not the only option for the architecture to have the peripheral transistors, such as periphery 602, below the memory layers, including, for example, memory layer 604, memory layer 606, and/or memory layer 608. Peripheral transistors, such as periphery 610, could also be constructed above the memory layers, including, for example, memory layer 604, memory layer 606, and/or memory layer 608, and substrate or memory layer 612, as shown in FIG. 6B. This periphery layer would utilize technologies described in this application; parent application and incorporated references, and could utilize transistors, for example, junction-less transistors or recessed channel transistors.

The monolithic 3D integration concepts described in this patent application can lead to novel embodiments of polysilicon-based memory architectures as well. Poly silicon based architectures could potentially be cheaper than single crystal silicon based architectures when a large number of memory layers need to be constructed. While the below concepts are explained by using resistive memory architectures as an example, it will be clear to one skilled in the art that similar concepts can be applied to NAND flash memory and DRAM architectures described previously in this patent application.

Figure 7A:
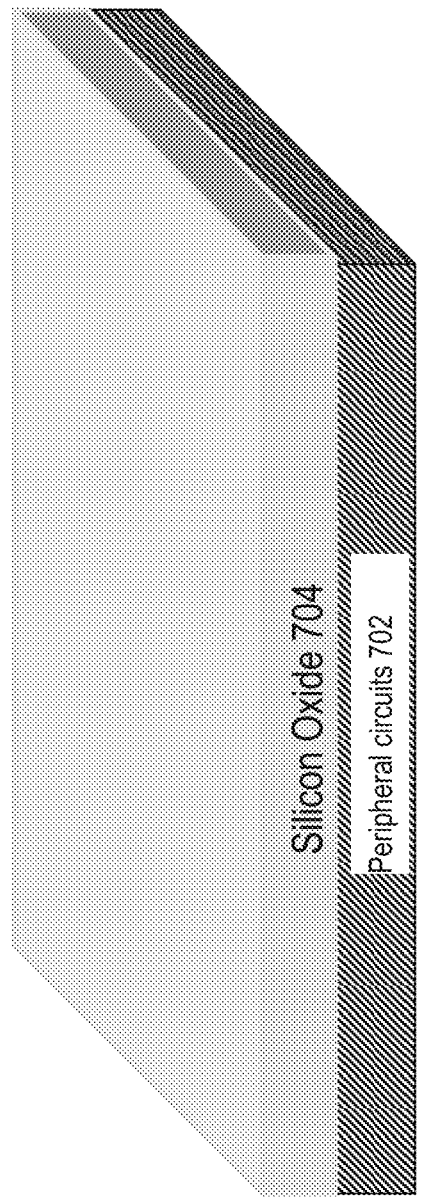
FIGS. 7A-7E show polysilicon select devices for 3D memory and peripheral circuits at the bottom according to some embodiments of the current invention.

FIGS. 7A-7E show one embodiment of the current invention, where polysilicon junction-less transistors are used to form a 3D resistance-based memory. The utilized junction-less transistors can have either positive or negative threshold voltages. The process may include the following steps as described in the following sequence:

Step (A): As illustrated in FIG. 7A, peripheral circuits 702 are constructed above which a layer of silicon dioxide 704 is made.

Figure 7B:
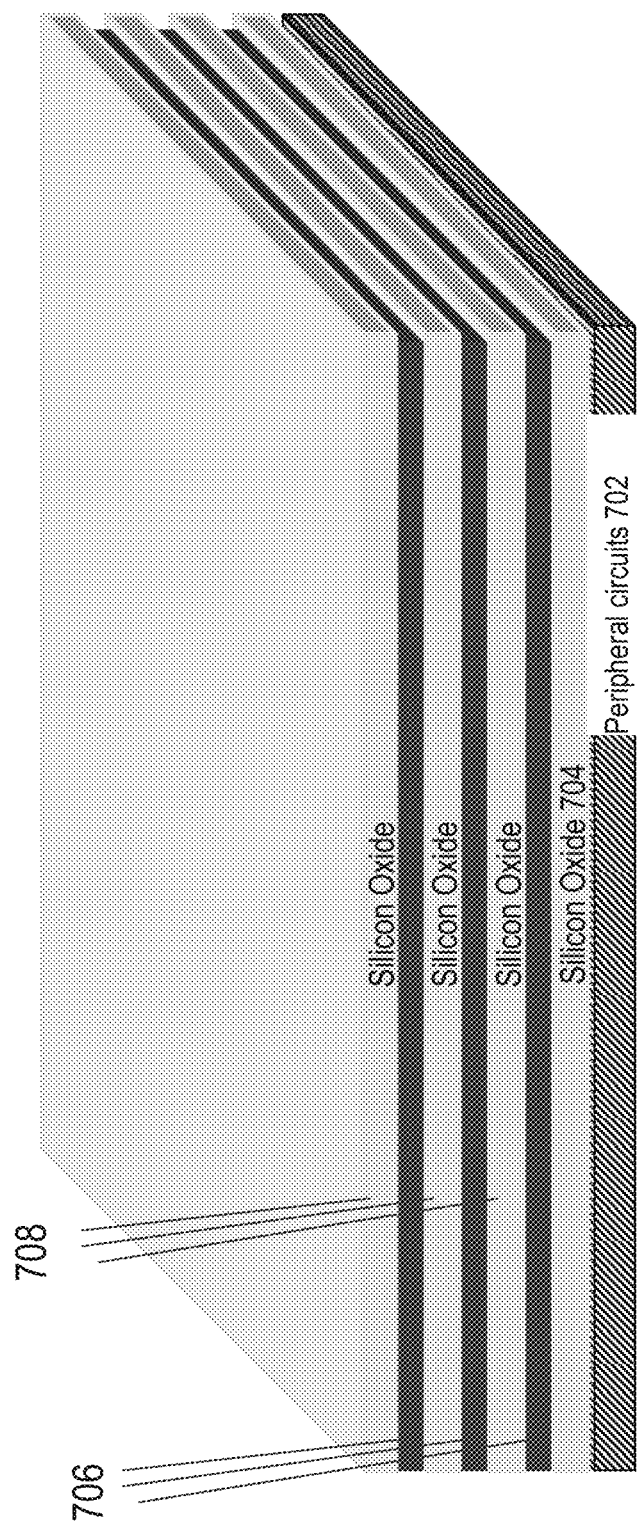

Step (B): As illustrated in FIG. 7B, multiple layers of n+ doped amorphous silicon or polysilicon 706 are deposited with layers of silicon dioxide 708 in between. The amorphous silicon or polysilicon layers 706 could be deposited using a chemical vapor deposition process, such as LPCVD or PECVD.

Figure 7C:
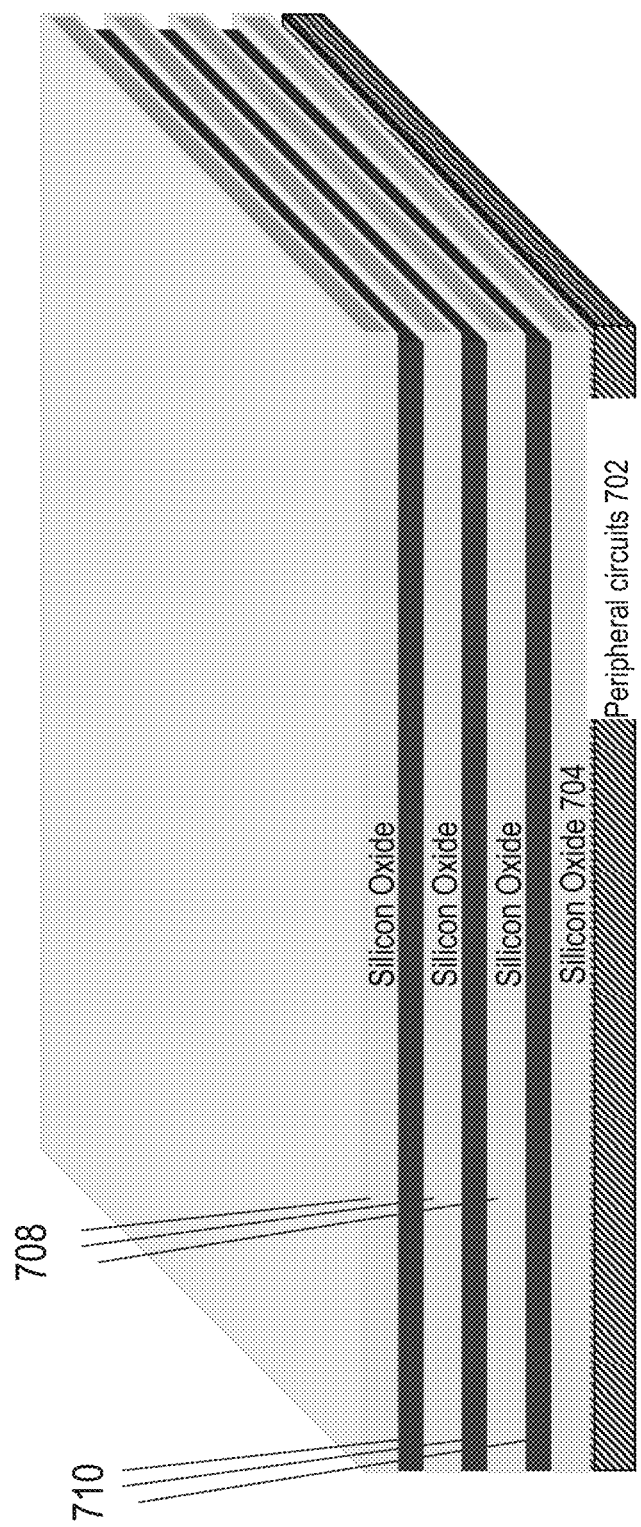

Step (C): As illustrated in FIG. 7C, a Rapid Thermal Anneal (RTA) is conducted to crystallize the layers of polysilicon or amorphous silicon deposited in Step (B). Temperatures during this RTA could be as high as 700° C. or more, and could even be as high as 800° C. The polysilicon region obtained after Step (C) is indicated as 710. Alternatively, a laser anneal could be conducted, either for all layers 706 at the same time or layer by layer. The thickness of the oxide 704 would need to be optimized if that process were conducted.

Figure 7D:
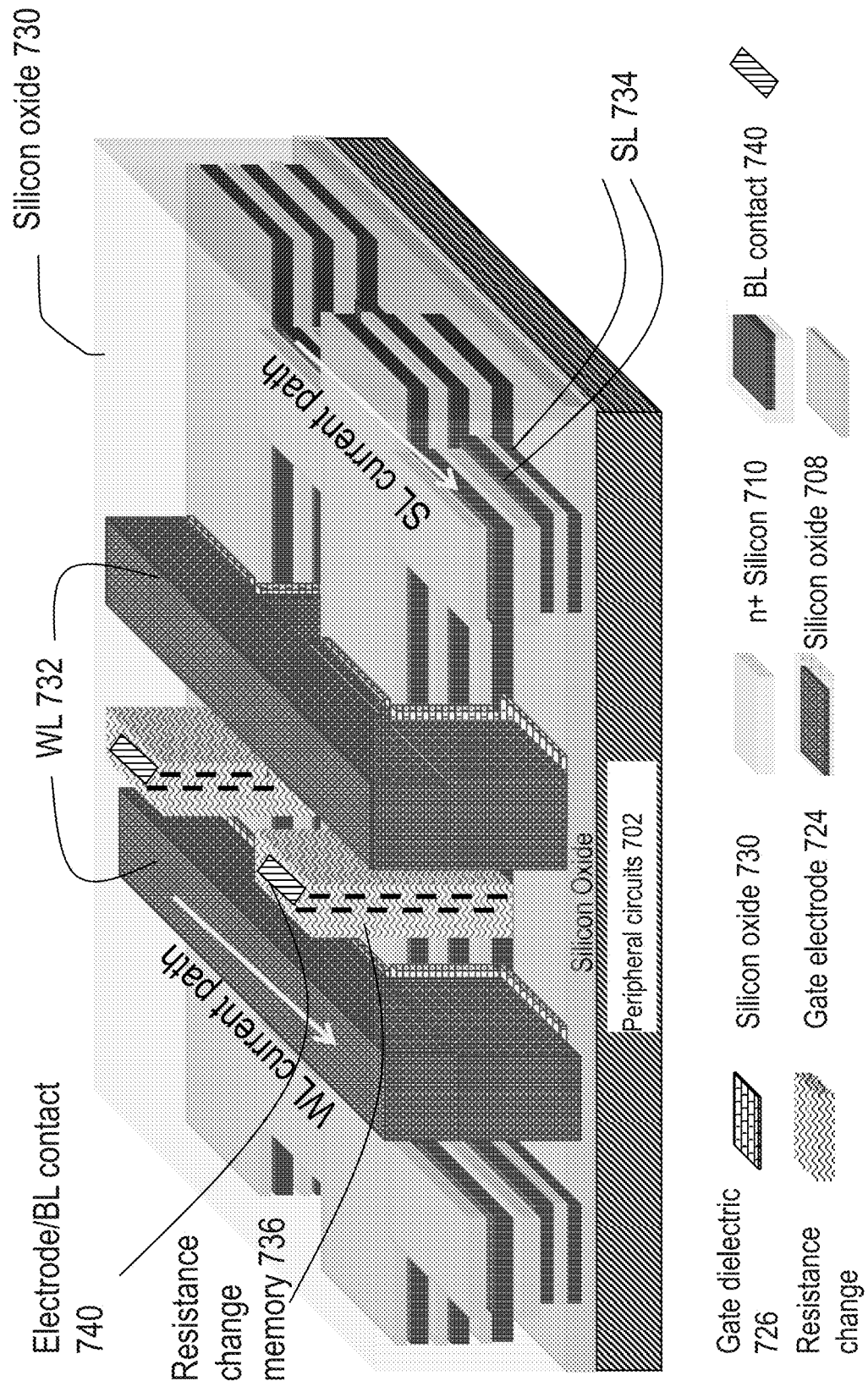

Step (D): As illustrated in FIG. 7D, procedures similar to those described in FIGS. 3E-3H are utilized to construct the structure shown. The structure in FIG. 7D has multiple levels of junction-less transistor selectors for resistive memory devices. The resistance change memory is indicated as 736 while its electrode and contact to the BL is indicated as 740. The WL is indicated as 732, while the SL is indicated as 734. Gate dielectric of the junction-less transistor is indicated as 726 while the gate electrode of the junction-less transistor is indicated as 724, this gate electrode also serves as part of the WL 732. Silicon oxide is indicated as 730.

Figure 7E:
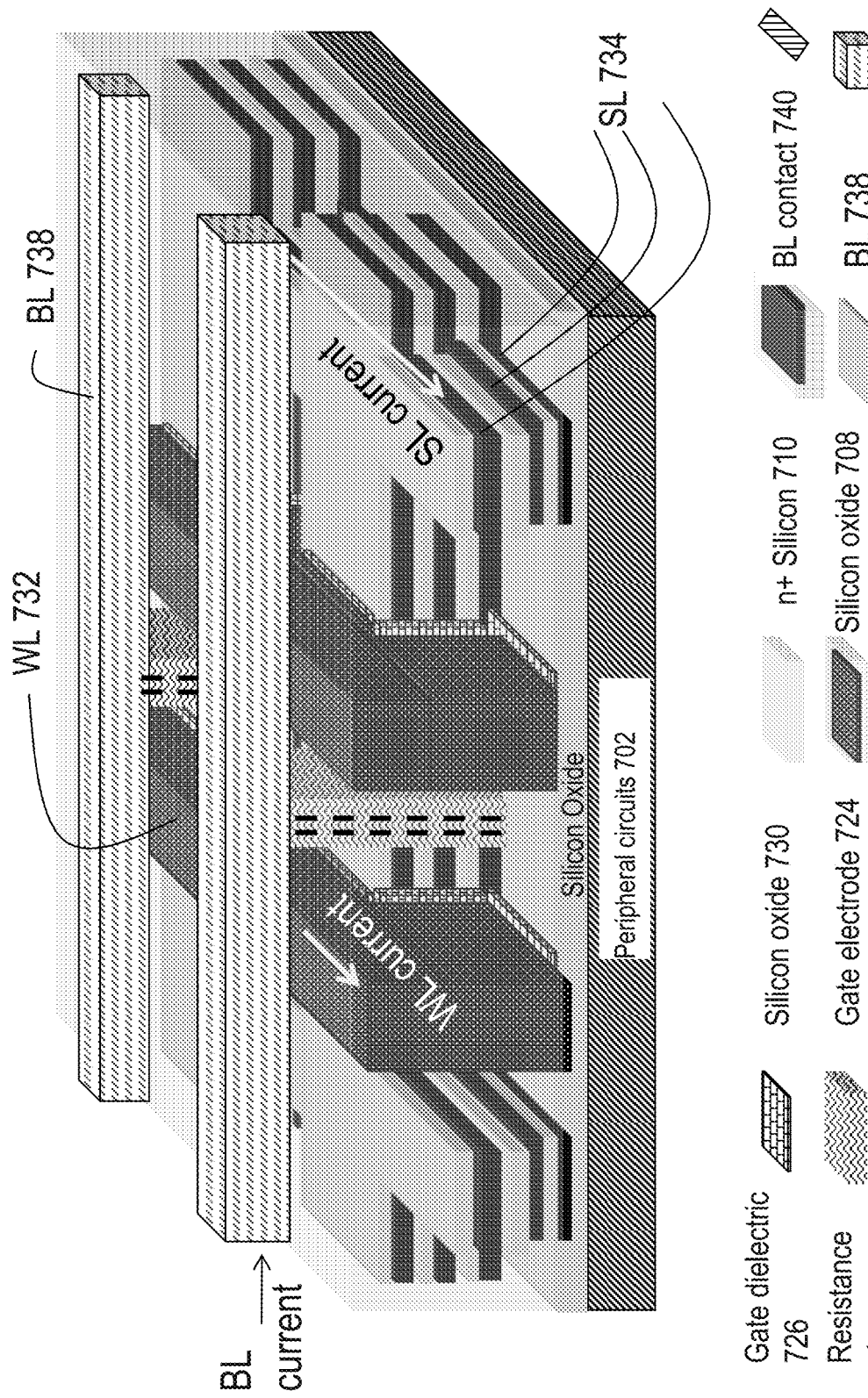

Step (E): As illustrated in FIG. 7E, bit lines (indicated as BL 738) are constructed. Contacts are then made to peripheral circuits and various parts of the memory array as described in embodiments described previously.

Figure 8A:
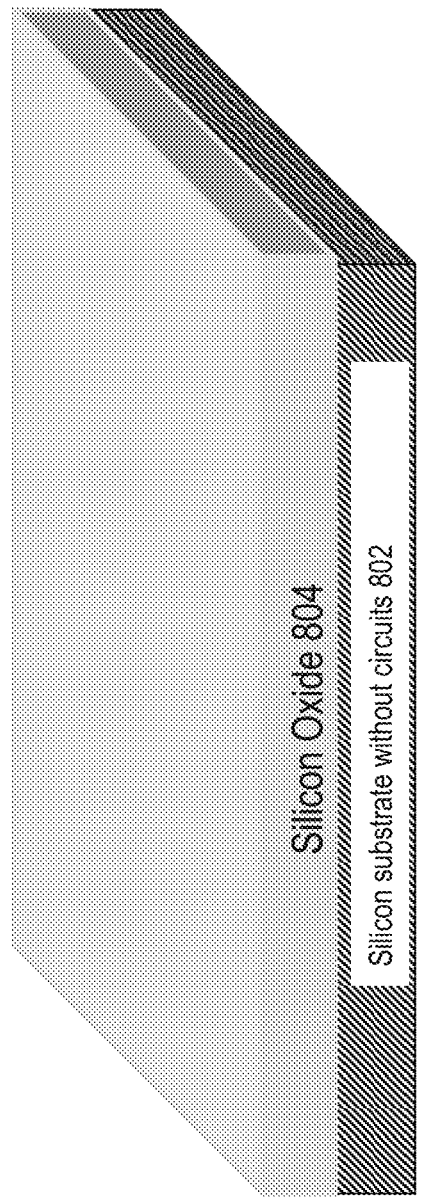
FIGS. 8A-8F show polysilicon select devices for 3D memory and peripheral circuits at the top according to some embodiments of the current invention.

FIG. 8A-F show another embodiment of the current invention, where polysilicon junction-less transistors are used to form a 3D resistance-based memory. The utilized junction-less transistors can have either positive or negative threshold voltages. The process may include the following steps occurring in sequence:

Step (A): As illustrated in FIG. 8A, a layer of silicon dioxide 804 is deposited or grown above a silicon substrate without circuits 802.

Figure 8B:
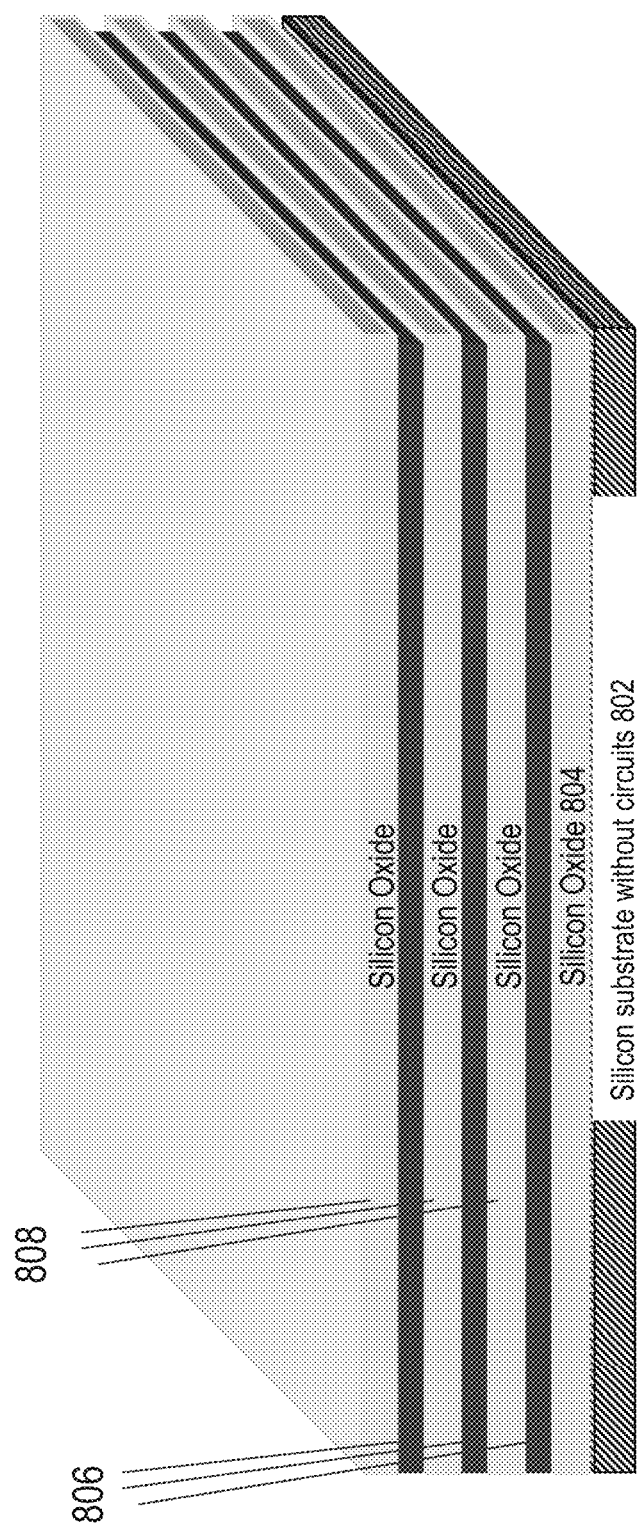

Step (B): As illustrated in FIG. 8B, multiple layers of n+ doped amorphous silicon or polysilicon 806 are deposited with layers of silicon dioxide 808 in between. The amorphous silicon or polysilicon layers 806 could be deposited using a chemical vapor deposition process, such as LPCVD or PECVD abbreviated as above.

Figure 8C:
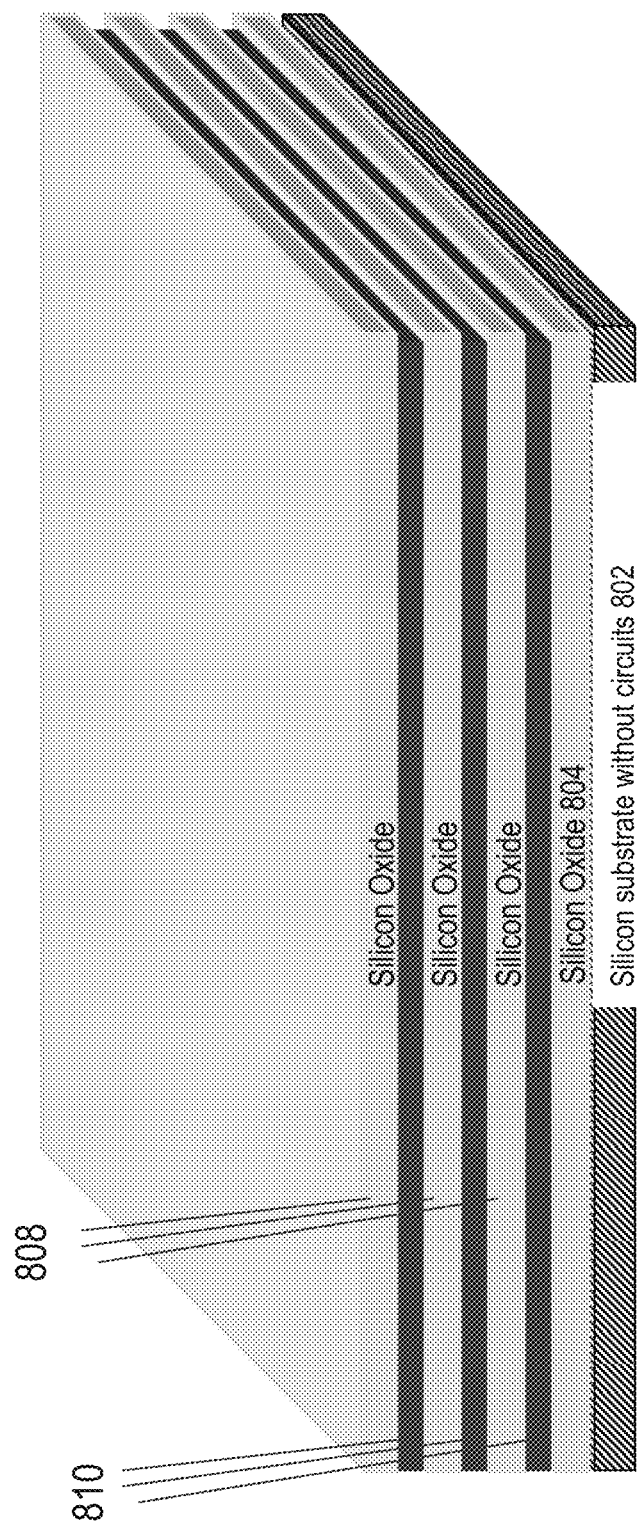

Step (C): As illustrated in FIG. 8C, a Rapid Thermal Anneal (RTA) or standard anneal is conducted to crystallize the layers of polysilicon or amorphous silicon deposited in Step (B). Temperatures during this RTA could be as high as 700° C. or more, and could even be as high as 1400° C. The polysilicon region obtained after Step (C) is indicated as 810. Since there are no circuits under these layers of polysilicon, very high temperatures (such as 1400° C.) can be used for the anneal process, leading to very good quality polysilicon with few grain boundaries and very high mobilities approaching those of single crystal silicon. Alternatively, a laser anneal could be conducted, either for all layers 806 at the same time or layer by layer at different times.

Figure 8D:
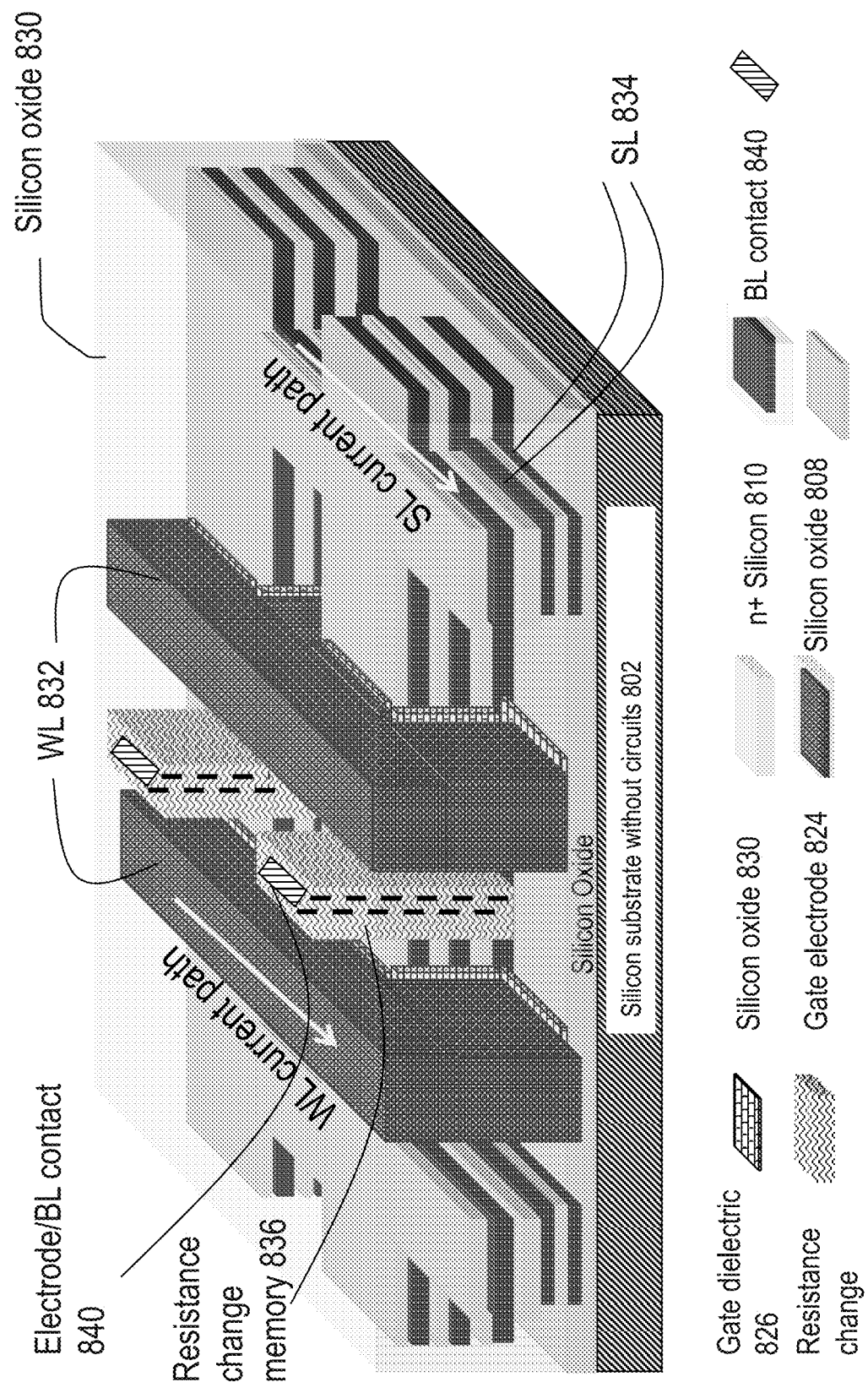

Step (D): This is illustrated in FIG. 8D. Procedures similar to those described in FIG. 32E-H are utilized to get the structure shown in FIG. 8D that has multiple levels of junctionless transistor selectors for resistive memory devices. The resistance change memory is indicated as 836 while its electrode and contact to the BL is indicated as 840. The WL is indicated as 832, while the SL is indicated as 834. Gate dielectric of the junction-less transistor is indicated as 826 while the gate electrode of the junction-less transistor is indicated as 824, this gate electrode also serves as part of the WL 832. Silicon oxide is indicated as 830

Figure 8E:
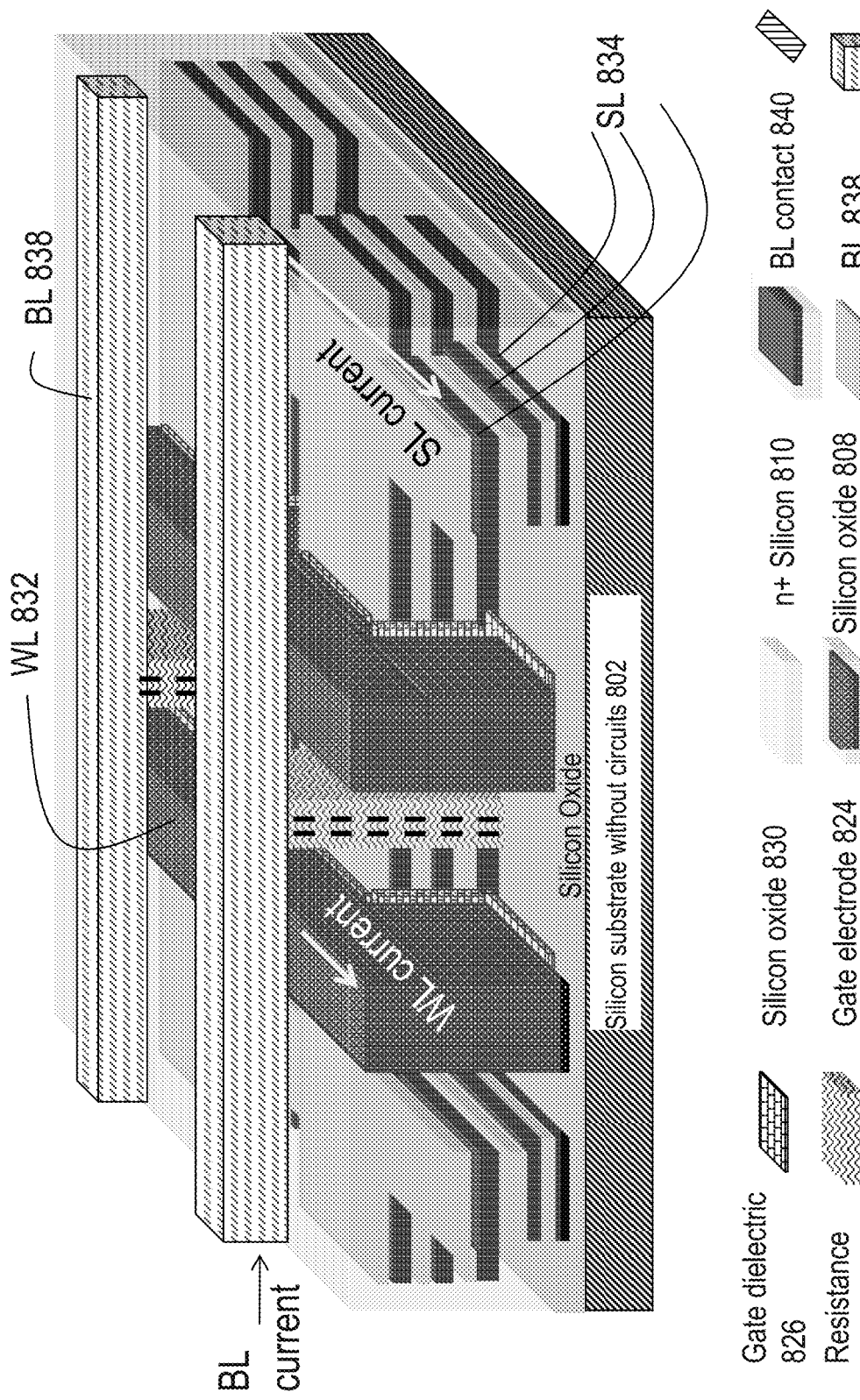
Figure 8F:
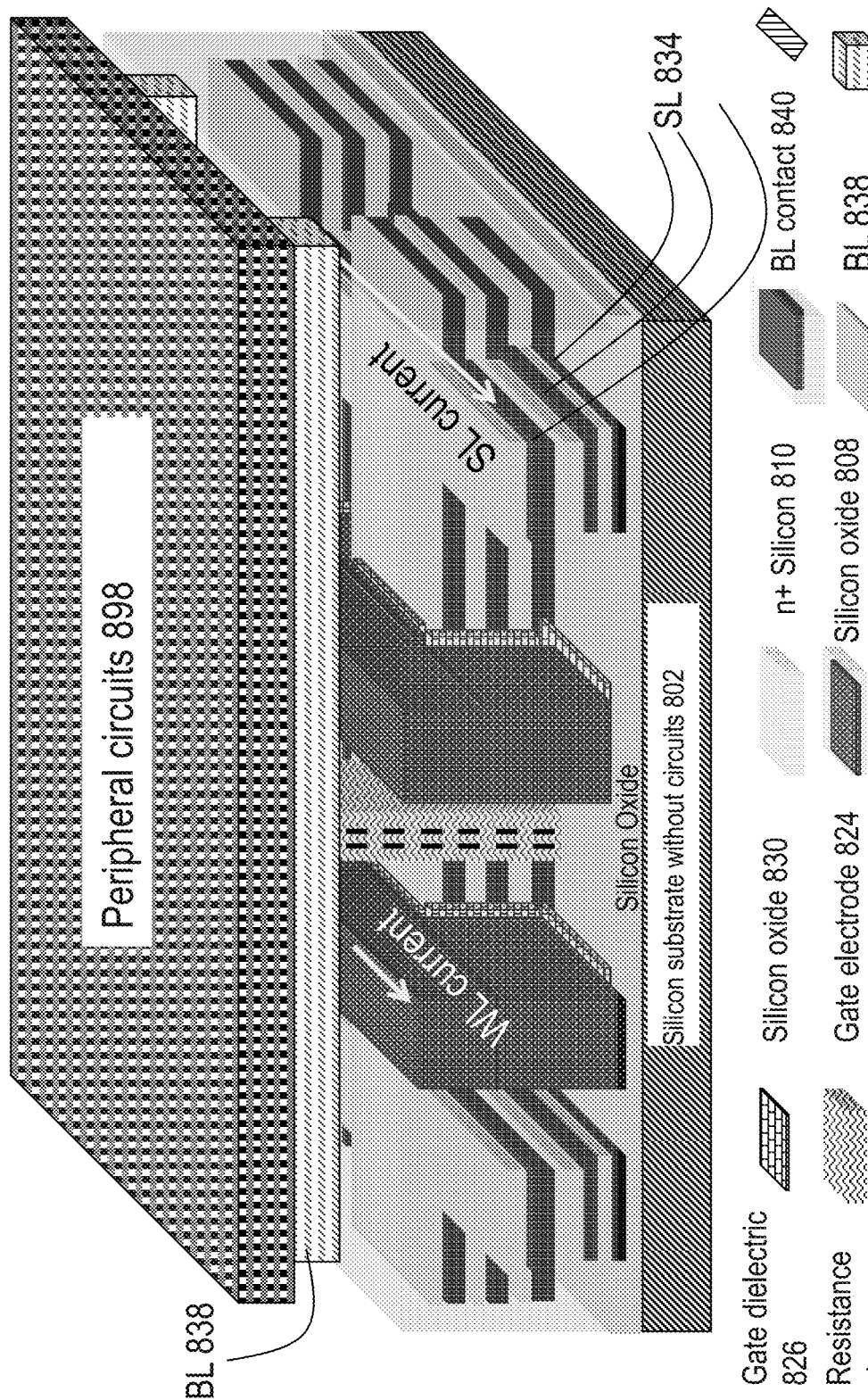

Step (E): This is illustrated in FIG. 8E. Bit lines (indicated as BL 838) are constructed. Contacts are then made to peripheral circuits and various parts of the memory array as described in embodiments described previously.

Step (F): Using procedures described in Section 1 and Section 2 of this patent application's parent, peripheral circuits 898 (with transistors and wires) could be formed well aligned to the multiple memory layers shown in Step (E). For the periphery, one could use the process flow shown in Section 2 where replacement gate processing is used, or one could use sub-400° C. processed transistors such as junction-less transistors or recessed channel transistors. Alternatively, one could use laser anneals for peripheral transistors' source-drain processing. Various other procedures described in Section 1 and Section 2 could also be used. Connections can then be formed between the multiple memory layers and peripheral circuits. By proper choice of materials for memory layer transistors and memory layer wires (e.g., by using tungsten and other materials that withstand high temperature processing for wiring), even standard transistors processed at high temperatures (>1000° C.) for the periphery could be used.

It will also be appreciated by persons of ordinary skill in the art that the invention is not limited to what has been particularly shown and described hereinabove. For example, drawings or illustrations may not show n or p wells for clarity in illustration. Further, combinations and sub-combinations of the various features described hereinabove may be utilized to form a 3D IC based system. Rather, the scope of the invention includes both combinations and sub-combinations of the various features described hereinabove as well as modifications and variations which would occur to such skilled persons upon reading the foregoing description. Thus the invention is to be limited only by the appended claims.

What is claimed is:

1. A 3D semiconductor device, the device comprising:
a first level comprising a first single crystal layer;
first transistors overlaying said first single crystal layer;
second transistors overlaying said first transistors; and
a second level comprising a second single crystal layer, said second level overlays said second transistors,
wherein said first transistors and said second transistors each comprises a polysilicon channel.

2. The device according to claim 1,
wherein said first transistors and said second transistors are junction-less transistors,
wherein each of said junction-less transistors comprises a source, a channel, and a drain, and
wherein said source, said channel, and said drain comprise a similar doping type.

3. The device according to claim 1,
wherein said first level comprises a via through said first single crystal layer.

4. The device according to claim 1,
wherein said second level comprises a via through said second single crystal layer.

5. The device according to claim 1,
wherein said first transistors and said second transistors are self-aligned, being processed following the same lithography step.

6. The device according to claim 1,
wherein said device comprises an array of memory cells,
wherein a plurality of said memory cells comprises at least one of said second transistors, and
wherein said second level comprises a periphery circuit to control said array of memory cells.

7. The device according to claim 1,
wherein said second single crystal layer comprises third transistors, and
wherein said third transistors are aligned to said first transistors with less than 150 nm misalignment.

8. A 3D semiconductor device, the device comprising:
a first level comprising a first single crystal layer;
first transistors overlaying said first single crystal layer;
second transistors overlaying said first transistors; and
a second level comprising a second single crystal layer, said second level overlaying said second transistors,
wherein said first transistors and said second transistors are junction-less transistors.

9. The device according to claim 8,
wherein said junction-less transistors each comprise a source, a channel, and a drain, and
wherein said source, said channel, and said drain have a similar doping type.

10. The device according to claim 8,
wherein said second transistors each comprise a polysilicon channel.

11. The device according to claim 8,
wherein said first level comprises a via through said first single crystal layer.

12. The device according to claim 8,
wherein said second level comprises a via through said second single crystal layer.

13. The device according to claim 8,
wherein said first transistors and said second transistors are self-aligned, being processed following the same lithography step.

14. The device according to claim 8,
wherein said device comprises an array of memory cells,
wherein a plurality of said memory cells comprise at least one of said second transistors, and
wherein said second level comprises a periphery circuit to control said array of memory cells.

15. A 3D semiconductor device, the device comprising:
a first level comprising a first single crystal layer;
first transistors overlaying said first single crystal layer;
second transistors overlaying said first transistors;
third transistors overlaying said second transistors;
fourth transistors overlaying said third transistors;
a second level comprising a second single crystal layer, said second single crystal layer overlaying said fourth transistor,
  wherein said second transistors, said third transistors, and said fourth transistors are self-aligned, being processed following the same lithography step; and
a memory peripheral circuit,
  wherein said memory peripheral circuit comprises at least one of said first transistors, and
  wherein said memory peripheral circuit controls at least one of said second transistors, at least one of said third transistors, and at least one of said fourth transistors.

16. The device according to claim 15,
wherein at least one of said third transistors comprises a source, channel, and drain, and
wherein said source, said channel, and said drain have a similar doping type.

17. The device according to claim 15,
wherein said third transistors each comprise a polysilicon channel.

18. The device according to claim 15,
wherein said first level comprises connections to an external device, and
wherein said connection comprises a via through said first single crystal layer.

19. The device according to claim 15,
wherein said second level comprises fifth transistors,
wherein said fifth transistors each comprise a transistor channel, and
wherein said transistor channel comprises said second single crystal.

20. The device according to claim 15, further comprising:
a memory cell,
  wherein said memory cell comprises at least one of said third transistors.

\* \* \* \* \*